United States Patent
Aoai et al.

(10) Patent No.: US 6,824,948 B1
(45) Date of Patent: Nov. 30, 2004

(54) ELECTRON BEAM OR X-RAY NEGATIVE-WORKING RESIST COMPOSITION

(75) Inventors: Toshiaki Aoai, Shizuoka (JP); Yutaka Adegawa, Shizuoka (JP); Morio Yagihara, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 193 days.

(21) Appl. No.: 09/759,362

(22) Filed: Jan. 16, 2001

(30) Foreign Application Priority Data

Jan. 13, 2000 (JP) ........................................ P.2000-4766
Mar. 24, 2000 (JP) ........................................ P.2000-84469

(51) Int. Cl.⁷ ........................... G03F 7/004; G03F 7/029
(52) U.S. Cl. ................. 430/170; 430/281.1; 430/287.1; 430/288.1; 430/296
(58) Field of Search ............................ 430/170, 281.1, 430/287.1, 288.1, 296, 270.1

(56) References Cited

U.S. PATENT DOCUMENTS

| | | | |
|---|---|---|---|
| 4,621,043 A | | 11/1986 | Gervay |
| 4,857,437 A | * | 8/1989 | Banks et al. ................. 430/327 |
| 5,057,397 A | * | 10/1991 | Miyabe et al. ........... 430/270.1 |
| 5,124,234 A | * | 6/1992 | Wakata et al. ........... 430/280.1 |
| 5,180,653 A | * | 1/1993 | Miyabe et al. ............... 430/296 |
| 5,858,618 A | * | 1/1999 | Tzou ....................... 430/280.1 |
| 6,013,415 A | * | 1/2000 | Sakurai et al. ........... 430/281.1 |
| 6,338,936 B1 | * | 1/2002 | Ichikawa et al. ........ 430/280.1 |
| 6,368,774 B1 | * | 4/2002 | Sakurai et al. ............... 430/143 |
| 6,630,285 B2 | * | 10/2003 | Imai et al. ............... 430/288.1 |

FOREIGN PATENT DOCUMENTS

| | | | |
|---|---|---|---|
| EP | 0 403 170 A2 | 12/1990 | |
| EP | 0 509 512 A1 | 10/1992 | |
| EP | 0 613 050 A1 | 8/1994 | |
| EP | 0 756 203 A1 | 1/1997 | |
| JP | 7-295220 | 11/1995 | ........... G03F/7/038 |
| JP | 8-152717 | 6/1996 | ........... G03F/7/038 |
| JP | 8-339086 | 12/1996 | ........... G03F/7/038 |
| JP | 9-166870 | 6/1997 | ........... G03F/7/038 |
| JP | 10-10733 | 1/1998 | ........... G03F/7/038 |

OTHER PUBLICATIONS

XP–002244775, Database WPI, Abstract of JP01168723, Derwent Publications, Inc., Jul. 4, 1989.

* cited by examiner

*Primary Examiner*—John S. Chu
(74) *Attorney, Agent, or Firm*—Sughrue Mion, PLLC

(57) ABSTRACT

A negative-working resist composition for electron beams or X-rays comprising (A) a compound generating an acid and/or radical species by the irradiation of electron beams or X-rays, (B) a resin which is insoluble in water and soluble in an alkali aqueous solution, (C) a crosslinking agent causing crosslinking with the resin of component (B) by the action of an acid, and (D) a compound having at least one unsaturated bond capable of being polymerized by an acid and/or a radical, and a negative-working resist composition for electron beams or X-rays comprising (A) a compound generating an acid and/or radical species by the irradiation of electron beams or X-rays, (B') a resin having at least one unsaturated bond polymerizable by an acid and/or an alkali, which is insoluble in water but soluble in an alkali aqueous solution, and (C) a crosslinking agent causing crosslinking with the resin (B') by the action of an acid are disclosed.

12 Claims, No Drawings

ELECTRON BEAM OR X-RAY NEGATIVE-WORKING RESIST COMPOSITION

FIELD OF THE INVENTION

The present invention relates to a negative-working resist composition suitably used for super-micro lithographic processes such as the productions of VLSI and high-capacity microchips, etc., and other photofabrication processes. More specifically, the invention relates to a negative-working photoresist composition capable of forming highly fined patterns using X-rays, electron beams, etc., and particularly to a negative-working resist composition which can be suitably used for fine working of semiconductor devices using a high energy such as electron beams, etc.

BACKGROUND OF THE INVENTION

In integrated circuits, the degree of integration is more and more increased and in the production of s semiconductor substrate of VLSI, etc., working of super-fine patters made of line width of finer than half micron has been required. For satisfying the requirement, the using wavelength of a light exposure apparatus used for a photolithography is more and more shortened and at present, the use if a far ultraviolet light and an excimer laser (XeCl, KrF, ArF, etc.) has been investigated. Furthermore, the formation of finer patterns by electron beams or X-rays has been investigated.

Particularly, electron beams or X-rays have been positioned as the advanced pattern-forming technique or further advanced pattern-forming technique and the development of a negative-working resist having a high sensitivity, and capable of attaining a profile form of a high resolution and rectangular form has been desired.

In the electron beam lithography, in the course that accelerated electron beams cause collision and scattering to the atoms constituting the resist material, an energy is supplied to the compound to cause the reaction of the resist material, whereby images are formed. By using a highly accelerated electron beams, the straight going property is increased, the influence of electron scattering becomes less, and the formation of patterns of a high-resolution and a rectangular form becomes possible but on the other hand, the permeability of electron beams is increased and the sensitivity is lowered. As described above, in an electron beam lithography, the sensitivity is in the relation of trade off with the resolution•resist form and it is a problem how they can be coexisted.

As the resist material for these problems, for the purpose of improving the sensitivity, a chemical amplification type resist mainly utilizing an acid catalyst reaction is used and as a negative-working resist, a chemical amplification type composition made of an alkali-soluble resin, an acid generator, and an acid crosslinking agent as the main constituents is effectively used.

Hitherto, for a negative-working chemical amplification type resist, various alkali-soluble resins are proposed. For example, Japanese Patent No. 2505033, JP-A-3-170554 (the term "JP-A" as used herein means an "unexamined published Japanese patent application") and JP-A-6-118646 disclose novolac type phenol resins, JP-A-7-311463 and JP-A-8-292559 disclose polyvinyl phenol resins having narrowed molecule weight distributions, JP-A-3-87746 and JP-A-8-44061 disclose phenol resins a part of which is converted to a cyclic alcohol structure by a hydrogenation, JP-A-7-295220 and JP-A-8-152717 disclose resins formed by protecting a part of the OH groups of polyvinyl phenol with an alkyl group, JP-A-339086 discloses a polyvinyl phenol resin having a protective group inert to an acid, such as an acyl group, JP-A-6-67431 and JP-A-10-10733 discloses polyvinyl phenol resins each copolymerized with styrene, JP-A-9-166870 discloses a polyvinyl phenol resin copolymerized with a (meth)acrylate monomer, and further JP-A-8-240911 discloses a resin having a carboxyl group.

Also, as the acid generator, JP-B-8-3635 (the term "JP-B" as used herein means an "examined Japanese patent publication") discloses organic halogen compounds, JP-A-2-52348 discloses aromatic compounds substituted with Br or Cl, JP-A-4-367864 and JP-A-4-367865 disclose aromatic compounds having an alkyl group and alkoxy group substituted with Br or Cl, JP-A-2-150848 and JP-A-6-199770 discloses iodonium compounds and sulfonium compounds, JP-A-3-87746 discloses haloalkane sulfonate compounds, JP-A-4-210960 and JP-A-4-217249 disclose diazodisulfone compounds or diazosulfone compounds, JP-A-4-336454 discloses Br- or I-substituted alkyltriazine compounds, JP-A-4-291258 discloses sulfonamide compounds and sulfonimide compounds, JP-A-4-291259 discloses sulfonic acid compounds of polyhydric phenols, JP-A-4-291260, JP-A-4-291261, and JP-A-6-202320 disclose naphthoquinonediazido-4-sulfonate compounds, JP-A-5-210239 discloses disulfone compounds, JP-A-6-236024 discloses N-oxyimidosulfonate compounds, and U.S. Pat. No. 5,344,742 discloses benzylsulfonate compounds, etc.

Furthermore, as the acid crosslinking agent, JP-A-3-75652, JP-A-5-181277, and JP-A-7-146556 disclose methoxymethylmelamine compounds, JP-A-4-281455, JP-A-5-232702, and JP-A-6-83055 disclose compounds having an alkoxymethyl ether group, JP-A-5-281715 discloses oxazine compounds, JP-A-5-134412 and JP-A-6-3825 disclose aromatic compounds having an alkoxyalkyl group, JP-A-6-194838 discloses trioxane compounds, JP-A-1-293339 discloses alkoxymethyluryl compounds, etc.

However, in any combinations of these compounds, it is difficult to obtain a sufficiently high sensitivity under an electron beam irradiation or X-ray irradiation in a high-accelerated voltage condition, and also it becomes a problem to coexist the sensitivity, the resolution, and the resist form in the level capable of satisfying.

SUMMARY OF THE INVENTION

Accordingly, an object of the present invention is to solve the problems of the technique of improving the performance in fine working of semiconductor devices using electron beams or X-rays, and to provide a negative-working chemical amplification type resist composition for electron beams or X-rays satisfying the sensitivity, the resolution, and the resist form for the use of electron beams or X-rays.

Furthermore, further object of the invention is to provide an electron beam or X-ray negative-working chemical amplification type resist composition showing a high sensitivity, aiming at the improvement of the through put of an advanced EB irradiation apparatus suitable of the mass production of semiconductor devices and capable of coping with an EB block irradiating machine or an EB stepper (successively reducing projector).

As the result of various investigations taking care of the above-described various characteristics, the present inventors have found that the objects of the invention can be fairly attained by using the following specific compositions and have accomplished the present invention.

The is, the present invention provides the following constructions.

(1) A negative-working resist composition for electron beams or X-rays comprising (A) a compound generating an acid and/or radical species by the irradiation of electron beams or X-rays, (B) a resin which is insoluble in water and soluble in an alkali aqueous solution, (C) a crosslinking agent causing crosslinking with the resin of component (B) by the action of an acid, and (D) a compound having at least one unsaturated bond capable of being polymerized by an acid and/or a radical.

(2) The negative-working resist composition for electron beams or X-rays described in the above item (1), wherein the resist composition further contains (E) an organic basic compound.

(3) The negative-working resist composition for electron beams or X-rays described in the above item (1) or (2), wherein the resin of component (B) is the resin having a repeating unit shown by the following formula (a):

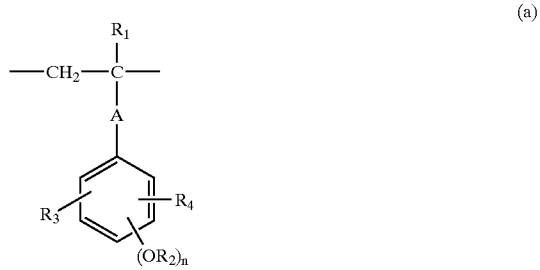

wherein $R_1$ represents a hydrogen atom, a halogen atom, a cyano group, or an alkyl or haloalkyl group which may have a substituent; $R_2$ represents a hydrogen atom, or an alkyl, cycloalkyl, aryl, aralkyl, or acyl group which may have a substituent; $R_3$ and $R_4$, which may be the same or different, each represents a hydrogen atom, a halogen atom, a cyano group, or an alkyl, cycloalkyl, alkenyl, aralkyl, or aryl group which may have a substituent; A represents a single bond, or a divalent alkylene, alkenylene, cycloalkylene, or arylene group which may have a substituent, or —O—, —SO$_2$—, —O—CO—R$_5$—, —CO—O—R$_6$—, or —CO—N(R$_7$)—R$_8$—; $R_5$, $R_6$, and $R_8$, which may be the same or different, each represents a single bond, or an alkylene, alkenylene, cycloalkylene, or arylene group, which may have a substituent, singly or a divalent group formed by combining the above-described group and at least one kind selected from an ether structure, an ester structure, an amide structure, a urethane structure, and a ureido structure; $R_7$ represents a hydrogen atom, or an alkyl, cycloalkyl, aralkyl, or aryl group which may have a substituent; and n represents an integer of from 1 to 3; and also plural $R_2$s, or $R_2$ and $R_3$ or $R_4$ may combine with each other to form a ring.

(4) The negative-working resist composition for electron beams or X-rays described in any of the above items (1) to (3), wherein the compound of component (A) is selected from the sulfonate compounds of sulfonium or iodonium.

(5) The negative-working resist composition for electron beams or X-rays described in any of the above items (1) to (3), wherein the compound of component (A) is the sulfonic acid ester compound of N-hydroxyimide or a disulfonyldiazomethane compound.

(6) The negative-working resist composition for electron beams or X-rays described in any of the above items (1) to (5), wherein the crosslinking agent of component (C) is a hydroxymethylated, alkoxymethylated, or acyloxymethylated phenol compound.

(7) The negative-working resist composition for electron beams or X-rays described in any of the above items (1) to (5), wherein the crosslinking agent of component (C) is an alkoxymethylated or acyloxymethylated melamine compound or resin, or an alkoxymethylated or acyloxymethylated urea compound or resin.

(8) The negative-working resist composition for electron beams or X-rays described in any of the above items (1) to (6), suitable for electron beam irradiation under the accelerated voltage condition of at least 75 KeV.

(9) The negative-working resist composition for electron beams or X-rays comprising
(A) a compound generating an acid and/or radical species by the irradiation of electron beams or X-rays,
(B') a resin having at least one unsaturated bond polymerizable by an acid and/or an alkali, which is insoluble in water but soluble in an alkali aqueous solution, and
(C) a crosslinking agent causing crosslinking with the resin (B') by the action of an acid.

(10) The negative-working resist composition for electron beams or X-rays described in the above item (9), wherein the resin of component (B') is a resin containing the repeating unit shown by following formula (a');

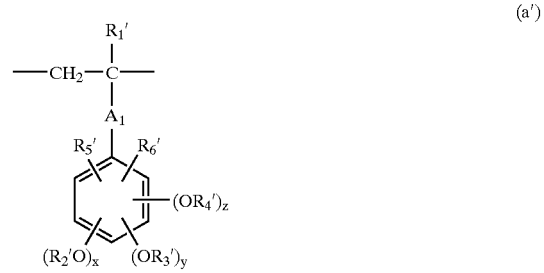

wherein
$R_1'$ represents a hydrogen atom, a cyano group, or an alkyl or haloalkyl group which may have a substituent;
$R_2'$ to $R_4'$ each represents a hydrogen atom, a group shown by the formula (b), (c), or (d) described below, or an alkyl, cycloalkyl, aryl, aralkyl, or acyl group which may have a substituent; and
$R_5'$ and $R_6'$, which may be the same or different, each represents a hydrogen atom, a hydroxyl group, a halogen atom, a cyano group, or an alkyl, cycloalkyl, alkenyl, aralkyl, or aryl group which may have a substituent.

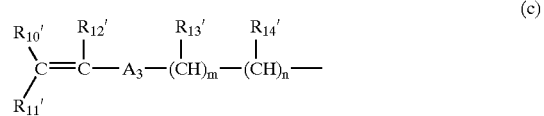

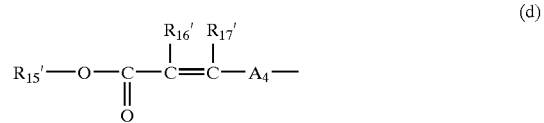

wherein
$R_7'$ to $R_{12}'$, $R_{16}'$, and $R_{17}'$ each represents a hydrogen atom, a halogen atom, a cyano group, or an alkyl or haloalkyl group which may have a substituent;

$R_{13}'$ and $R_{14}'$ each represents a hydrogen atom, a halogen atom, a hydroxy group, or an alkyl, alkoxy, or acyloxy group which may have a substituent;

$R_{15}'$ represents a hydrogen atom or an alkyl, cycloalkyl, aralkyl, or aryl group which may have a substituent;

$A_1$ represents a single bond, or a divalent alkylene, alkenylene, cycloalkylene, or arylene group which may have a substituent, or —O—, —SO$_2$—, —O—CO—$R_{20}'$, —CO—O—$R_{21}'$—, or —CO—N($R_{22}'$)—$R_{23}'$—;

$R_{20}'$, $R_{21}'$, and $R_{23}'$, which may be the same or different, each represents a single bond, or a divalent alkylene, alkenylene, cycloalkylene, or arylene group which may have an ether structure, an ester structure, an amide structure, a urethane structure, or a ureido structure or may have a substituent;

$R_{22}'$ represents a hydrogen atom, or an alkyl, cycloalkyl, aralkyl, or aryl group which may have a substituent;

$A_2$ represents a single bond, —O—$R_{21}'$, or N($R_{22}'$)—$R_{23}'$—;

$A_3$ represents a single bond, —SO$_2$—, or an arylene group which may have an alkylene structure or may have a substituent;

$A_4$ represents a single bond, a divalent alkylene, cycloalkylene, or arylene group which may have a substituent, or —O—, —SO$_2$—, —CO—, or —CO—O—$R_{21}'$—;

x, y, and z in the formula (a') each represents 0 or 1 and m and n in the formula (c) each represents 0 or an integer of at least 1, provided that in the formula (a'), at least one repeating unit has the group of the formula (b), (c), or (d); and two of $R_2'$ to $R_4'$, or one of $R_2'$ to $R_4'$ and $R_5'$ or $R_6'$ may combine with each other to form a ring.

(11) The negative-working resist composition for electron beams or X-rays described in the above item (9) or (10), wherein the resist composition further contains (D) a compound having at least one unsaturated bond polymerizable by an acid and/or a radical.

(12) The negative-working resist composition for electron beams or X-rays described in any of the above items (9) to (11), wherein resist the composition further contains (E) an organic basic compound.

(13) The negative-working resist composition for electron beams or X-rays described in any of the above items (9) to (12), wherein the compound of component (A) is selected from the sulfonate compounds of sulfonium or iodonium.

(14) The negative-working resist composition for electron beams or X-rays described in any of the above items (9) to (12), wherein the compound of component (A) is the sulfonio acid ester compound of N-hydroxyimide or a disulfonyldiazomethane compound.

(15) The negative-working resist composition for electron beams or X-rays described in any of the above items (9) to (12), wherein the compound of component (A) is a disulfone compound.

(16) The negative-working resist composition for electron beams or X-rays described in any of the above items (9) to (15), wherein the crosslinking agent of component (C) is a hydroxymethylated, alkoxymethylated, or acyloxymethylated phenol compound.

(17) The negative-working resist composition for electron beams or X-rays described in any of the above items (9) to (15), wherein the crosslinking agent of component (C) is an alkoxymethylated or acyloxymethylated melamine compound or resin or an alkoxymethylated or acyloxymethylated urea compound or resin.

(18) The negative-working resist composition for electron beams or X-rays described in any of the above items (9) to (17), suitable for electron beam irradiation under the accelerated voltage condition of at least 75 KeV.

DETAILED DESCRIPTION OF THE INVENTION

Then, the present invention is described in more detail.

First, the compounds used in the invention are explained in detail.

(1) Alkali-soluble resin (B) in the invention:

As the alkali-soluble resin in the invention, polymers having a phenol skeleton such as phenol novolac resins, polyvinyl phenol resins, copolymers having a structural unit originated in vinyl phenol, and a resin obtained by protecting or modifying a part of a polyvinyl resin, etc., which have hitherto been disclosed for negative chemical amplification type resists, can be widely used. Preferably, there is a phenol resin containing a repeating structural unit shown by the above-described formula (a).

In the formula (a), $R_1$ represents a hydrogen atom, a halogen atom, a cyano group, or an alkyl or haloalkyl group which may have s substituent. $R_2$ represents s hydrogen atom, or an alkyl, cycloalkyl, aryl, aralkyl, or acyl group which may have a substituent. $R_3$ and $R_4$, which may be the same or different, each represents a hydrogen atom, a halogen atom, a cyano group, or an alkyl, cycloalkyl, alkenyl, aralkyl, or aryl group which may have a substituent. A represents a single bond, or a divalent alkylene, alkenylene, cycloalkylene, or arylene group which may have a substituent, or —O—, —SO$_2$—, —O—CO—$R_5$—, —CO—O—$R_6$—, or —CO—N($R_7$)—$R_8$—.

$R_5$, $R_6$, and $R_8$, which may be the same or different, each represents a single bond, or an alkylene, alkenylene, cycloalkylene, or arylene group, which may have a substituent, singly or a divalent group formed by combining the above-described group and at least one kind selected from an ether structure, an ester structure, an amide structure, a urethane structure, and a ureido structure.

$R_7$ represents a hydrogen atom, or an alkyl, cycloalkyl, aralkyl, or aryl group which may have a substituent.

Also, n represents an integer of from 1 to 3; and also plural $R_2$s, or $R_2$ and $R_3$ or $R_4$ may combine with each other to form a ring.

Also, as the alkyl group of $R_1$ to $R_4$, and $R_7$, for example there are alkyl groups having from 1 to 8 carbon atoms, and practically, there are preferably methyl, ethyl, propyl, n-butyl, sec-butyl, hexyl, 2-ethylhexyl, and octyl. The cycloalkyl group of $R_2$ to $R_4$, and $R_7$ may be a monocyclic type or a polycyclic type. As the monocyclic type, there are cycloalkyl groups having from 3 to 8 carbon atoms, and there are preferably cyclopropyl, cyclopentyl, and cyclohexyl. As the polycyclic type, there are preferably adamantyl, norbornyl, isoboronyl, dicyclopentyl, α-pinel, tricyclodecanyl, etc.

As the alkenyl of $R_3$ and $R_4$, for example, alkenyl groups having from 2 to 8 carbon atoms, and practically, there are preferably vinyl, allyl, butenyl, and cyclohexenyl.

As the aryl group of $R_2$ to $R_4$, and $R_7$, there are, for example, aryl groups having from 6 to 15 carbon atoms, and practically, there are preferably phenyl, tolyl, dimethylphenyl, 2,4,6-trimethylphenyl, naphthyl, anthryl, etc.

As the aralkyl group of $R_2$ to $R_4$, and $R_7$, there are, for example, aralkyl groups having from 7 to 12 carbon atoms, and practically, there are preferably benzyl, phenethyl, naphthylmethyl, etc.

As the haloalkyl group of $R_1$, there are, for example, haloalkyl groups having from 1 to 4 carbon atoms, and practically, there are preferably chloromethyl, chloroethyl, chloropropyl, chlorobutyl, bromomethyl, bromoethyl, etc.

As the acyl group of $R_2$, there are, for example, acyl groups having from 1 to 8 carbon atoms, and practically, there are preferably formyl, acetyl, propanoyl, butanoyl, pivaloyl, benzoyl, etc.

As the alkylene group of A, $R_5$, $R_6$, and $R_8$, there are preferably alkylene groups having from 1 to 8 carbon atoms, such as methylene, ethylene, propylene, butylene, hexylene, octylene, etc., which may have a substituent.

As the alkenylene group of A, $R_5$, $R_6$, and $R_8$, there are preferably alkenylene groups having from 2 to 6 carbon atoms, such as ethenylene, propenylene, butenylene, etc., which may have a substituent.

As the cycloalkylene group of A, $R_5$, $R_6$, and $R_8$, there are preferably cycloalkylene groups having from 5 to 8 carbon atoms, such as cyclopentylene, cyclohexylene, etc., which may have a substituent.

As the arylene group of A, $R_5$, $R_6$, and $R_8$, there are arylene groups having from 6 to 12 carbon atoms, such as phenylene, tolylene, naphthylene, etc.

Examples of the substituent which is substituted to these groups includes a group having an active hydrogen, such as an amino group, an amide group, a ureido group, a urethane group, a hydroxyl group, a carboxyl group, etc.; a halogen atom (such as fluorine, chlorine, bromine, iodine, etc.), an alkoxy group (such as, methoxy, ethoxy, propoxy, butoxy, etc.), a thioether group, an acyl group, (such as, acetyl, propanoyl, benzoyl, etc.), an acyloxy group (such as, acetoxy, propanoyloxy, benzoyloxy, etc.), an alkoxycarbonyl group (such as, methoxycarbonyl, ethoxycarbonyl, propoxycarbonyl, etc.), a cyano group, a nitro group, etc. Particularly, the groups having an active hydrogen, such as an amino group, a hydroxyl group, a carboxyl group, etc., are preferred.

As the ring formed by combining plural $R_2$s, or $R_2$ and $R_3$ or $R_4$ with each other, there are 4- to 7-membered rings containing an oxygen atom, such as a benzofuran ring, a benzodioxonol ring, a penzpyran ring, etc.

The resin (B) in the invention may be a resin composed of the repeating structural unit only shown by the formula (a) but for the purpose of further improving the performance of the negative-working resist composition of the invention, the resin may be copolymerized with other polymerizable monomer.

As the copolymerizable monomer which can be used in the invention, the following monomers are included. For example, there is a compound having one addition polymerizing unsaturated bond selected from acrylic acid esters, acrylamides, methacrylic acid esters, methacrylamides, allyl compounds, vinyl ether compounds, vinyl ester compounds, styrenes, crotonic acid esters, etc., other than the above-described monomers.

Practical examples of the acrylic acid esters include alkyl (the carbon atom number of the alkyl group is preferably from 1 to 10) acrylates (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, and tetrahydrofurfuryl acrylate) and aryl acrylates (e.g., phenyl acrylate).

Practical examples of the methacrylic acid esters include alkyl (the carbon atom number of the alkyl group is preferably from 1 to 10) methacrylates (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate) and aryl methacrylates (e.g., phenyl methacrylate, cresyl methacrylate, and naphthyl methacrylate).

Practical examples of the acrylamides include acrylamide, N-alkylacrylamides (as the alkyl group, there are alkyl groups having from 1 to 10 carbon atoms, such as methyl, ethyl, propyl, butyl, tert-butyl, heptyl, octyl, cyclohexyl, benzyl, hydroxyethyl, etc.), N-arylacrylamides (as the aryl group, there are, for example, phenyl, tolyl, nitrophenyl, naphthyl, cyanonaphthyl, hydroxyphenyl, and carboxyphenyl), N,N-diaalkylacrylamides (as the alkyl group, there are alkyl groups having from 1 to 10 carbon atoms, such as methyl, ethyl, butyl, isobutyl, ethylhexyl, cyclohexyl, etc.), N,N-diarylacrylamides (as the aryl group, there are, for example, phenyl), N-methyl-N-phenylacrylamide, N-hydroxyethyl-N-methylacrylamide, and N-2-acetamidoethyl-N-acetylacrylamide.

Practical examples of the methacrylamides include methacrylamide, N-alkylmethacrylamides (as the alkyl group, there are alkyl groups having from 1 to 10 carbon atoms, such as methyl, ethyl, tert-butyl, ethylhexyl, hydroxyethyl, cyclohexyl, etc.), N-arylmethacrylamides (as the aryl group, there are phenyl, etc.), N,N-dialkylmethacrylamides (as the alkyl group, there are ethyl, propyl, butyl, etc.), N,N-diarylmethacrylamides (as the aryl group, there are phenyl, etc.), N-hydroxyethyl-N-methylmethacrylamide, N-methyl-N-phenylmethacrylamide, and N-ethyl-N-phenylmethacrylamide.

Practical examples of the allyl compounds include allyl esters (e.g., allyl acetate, allyl caproate, allyl caprylate, allyl laurate, allyl palmitate, allyl stearate, allyl benzoate, allyl acetoacetate, and allyl lactate), and allyloxy ethanol.

Practical examples of the vinyl ethers include alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether), and vinylaryl ethers (e.g., vinylphenyl ether, vinyltolyl ether, vinyl chlorophenyl ether, vinyl-2,4-dichlorophenyl ether, vinylnaphthyl ether, and vinyl anthranyl ether).

Practical examples of the vinyl esters include vinyl butyrate, vinyl isobutyrate, vinyl trimethyl acetate, vinyl diethyl acetate, vinyl valate, vinyl caplroate, vinyl chloroacetate, vinyl dichloroacetate, vinyl methoxy acetate, vinyl butoxy acetate, vinyl phenyl acetate, vinyl acetoacetate, vinyl lactate, vinyl-β-phenyl butyrate, vinyl-cyclohexyl carboxylate, vinyl benzoate, vinyl salicylate, vinyl chlorobenzoate vinyl tetrachlorobenzoate, and vinyl naphthoate.

Practical examples of the styrenes include styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene), alkoxystyrenes (e.g., methoxystyrene, 4-methoxy-3-methylstyrene, and dimethoxystyrene), halogenstyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluorostyrene, and 4-fluoro-3-trifluoromethylstyrene), and carboxystyrenes.

Practical examples of the crotonic acid esters include alkyl crotonates (e.g., butyl crotonate, hexyl crotonate, and glycerol monocrotonate).

Other copolymerizable monomers used in the invention, there are dialkyl itaconates (e.g., dimethyl itaconate, diethyl and dibutyl itaconate), maleic acid or fumaric acid dialkyl esters (e.g., dimethyl maleate and dubutyl fumalate), maleic anhydride, maleimide, acrylonitrile, methacrylonitrile, maleironitrile, etc.

Also, other copolymerizable addition polymerizing unsaturated compounds can be generally used in the invention.

In these monomers, the monomers improving the alkali-solubility such as the monomers having a carboxyl group, such as carboxystyrene, N-(carboxyphenyl)acrylamide, N-(carboxyphenyl)methacrylamide, etc., and maleimide, etc., are preferred as the copolymer component.

The content of other monomer in the resin in the invention is preferably not more than 50 mol %, and more preferably not more than 30 mol % to the total repeating units.

Then, practical examples of the resin having the repeating structural unit shown by the formula (a) are shown below but the invention is not limited to these compounds.

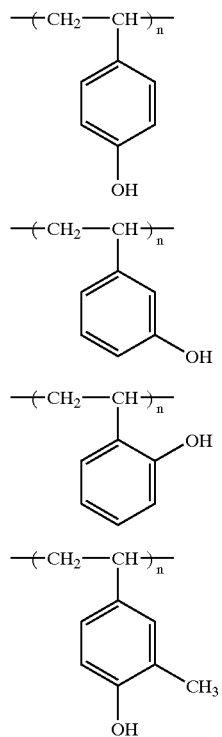

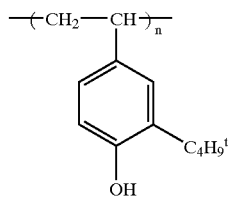

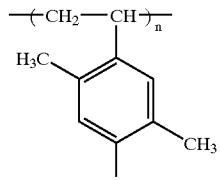

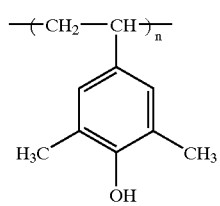

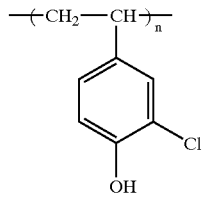

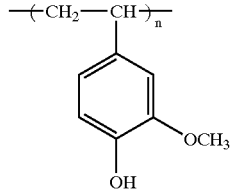

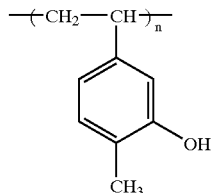

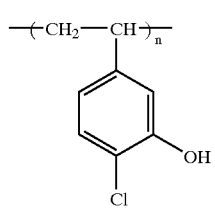

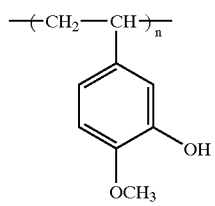

a-(13) 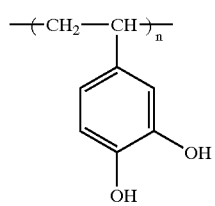
a-(14) 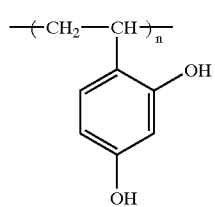
a-(15) 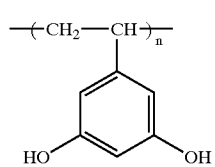
a-(16) 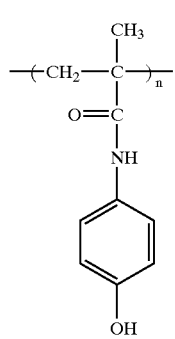
a-(17) 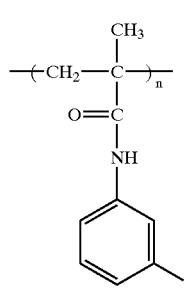
a-(18) 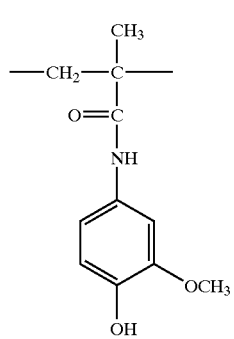
a-(19) 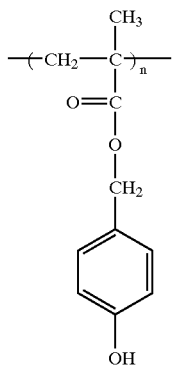
a-(20) 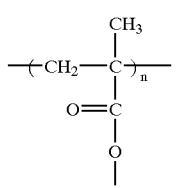
a-(21) 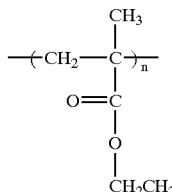
a-(22) 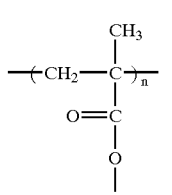

a-(23) 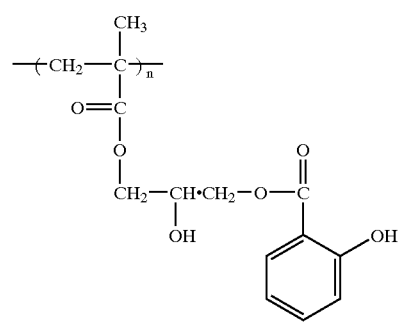
a-(24) 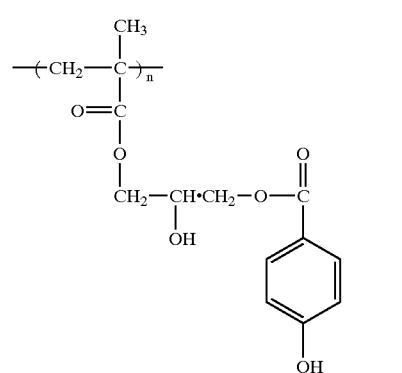
a-(25) 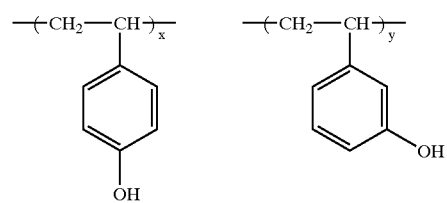
a-(26) 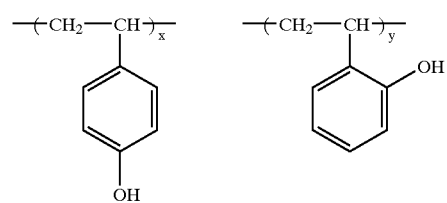
a-(27) 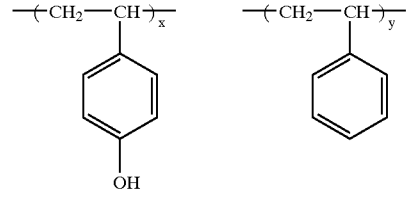
a-(28) 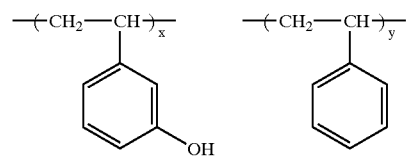
a-(29) 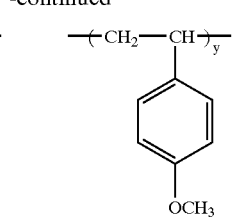
a-(30) 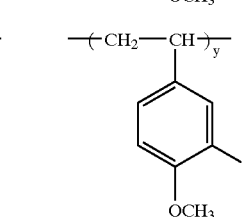
a-(31) 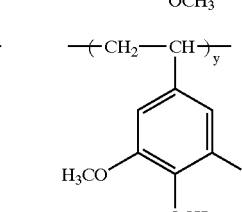
a-(32) 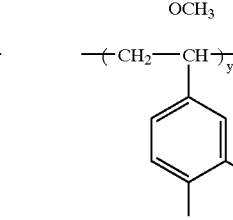
a-(33) 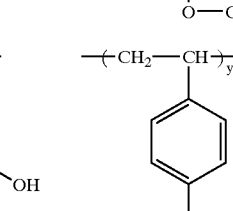
a-(34) 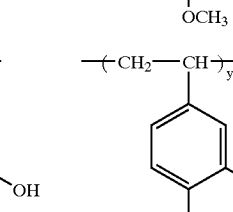
a-(35) 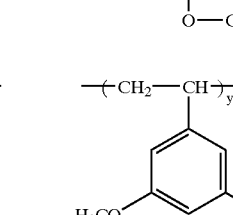
a-(36) 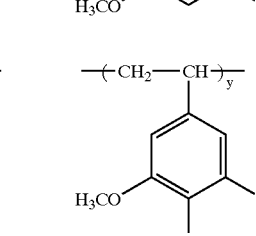

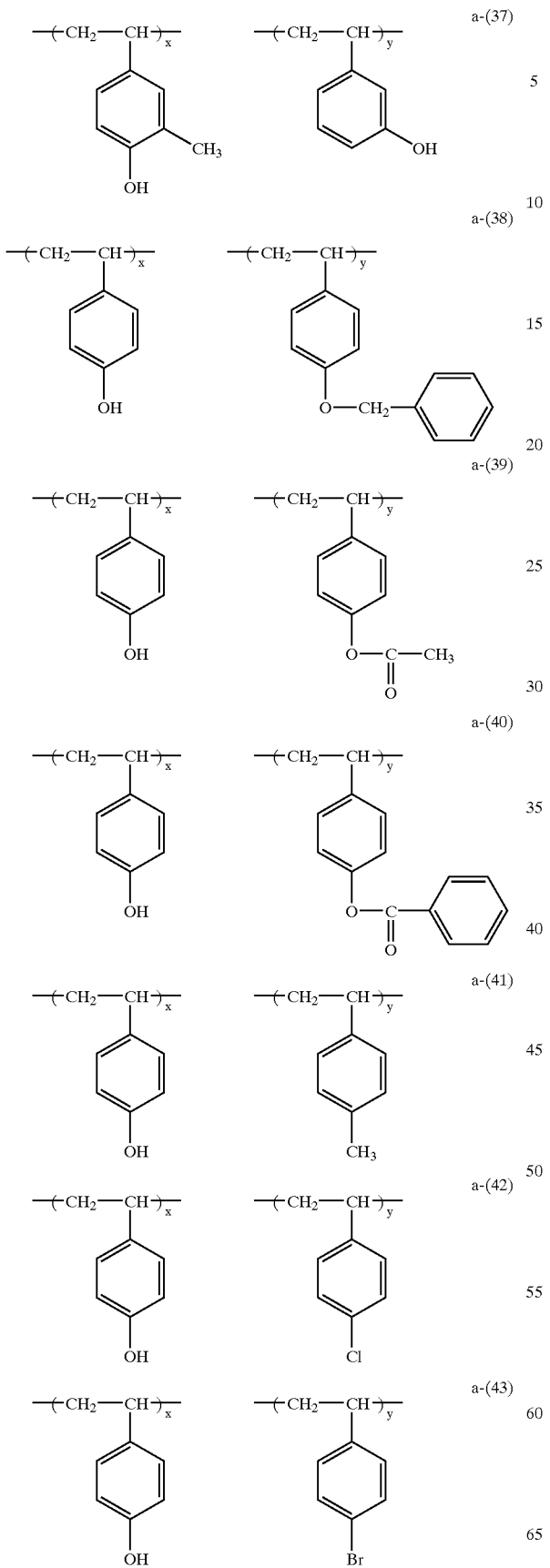
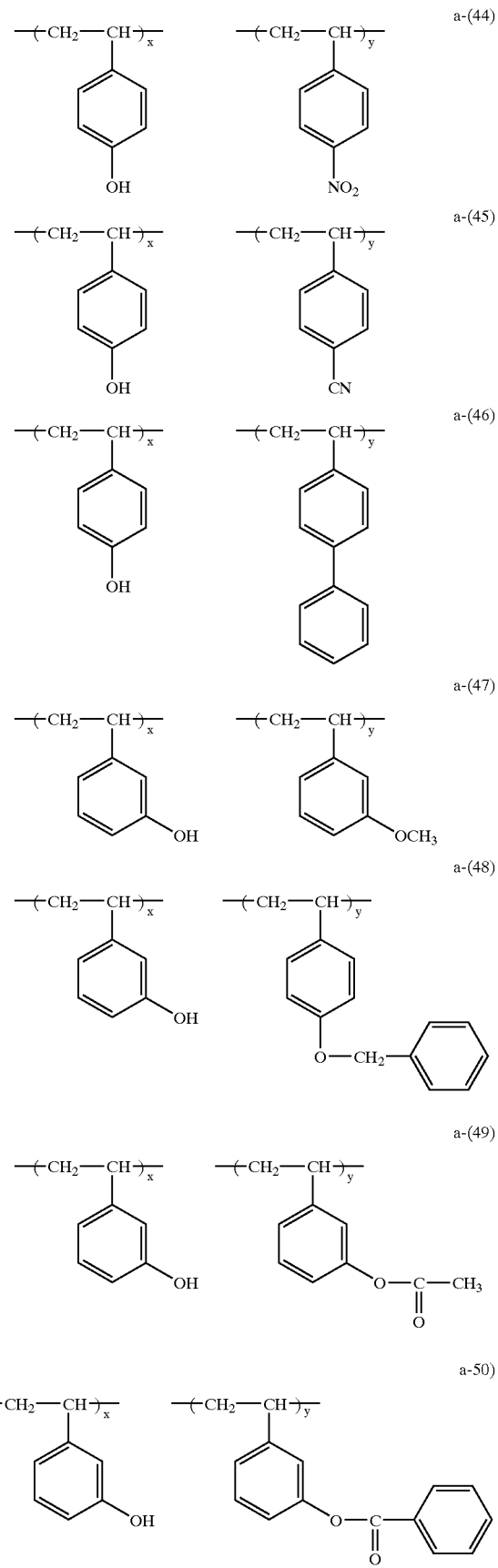

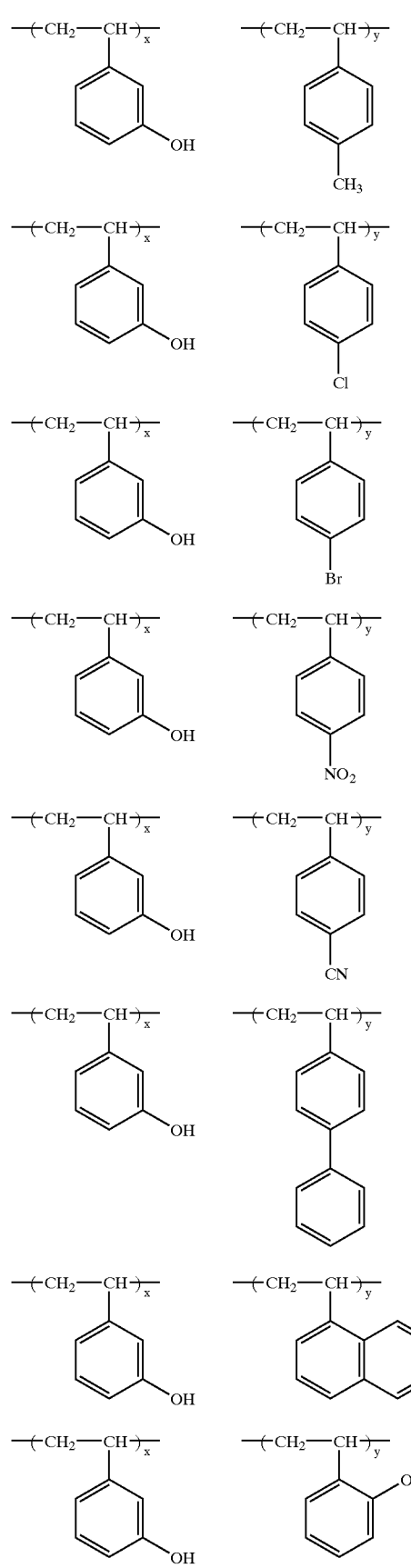

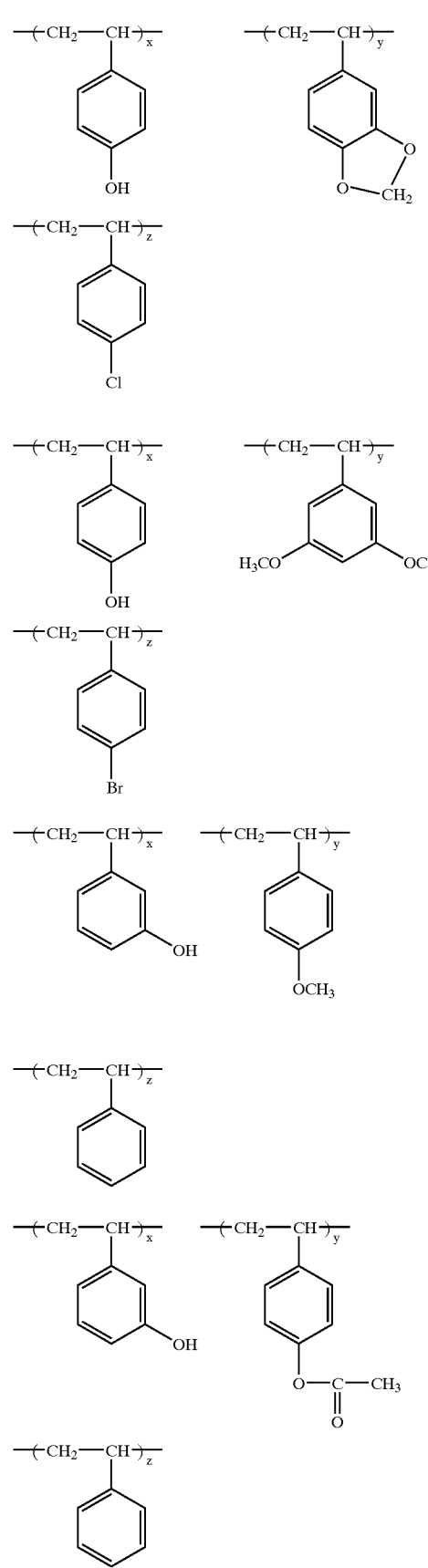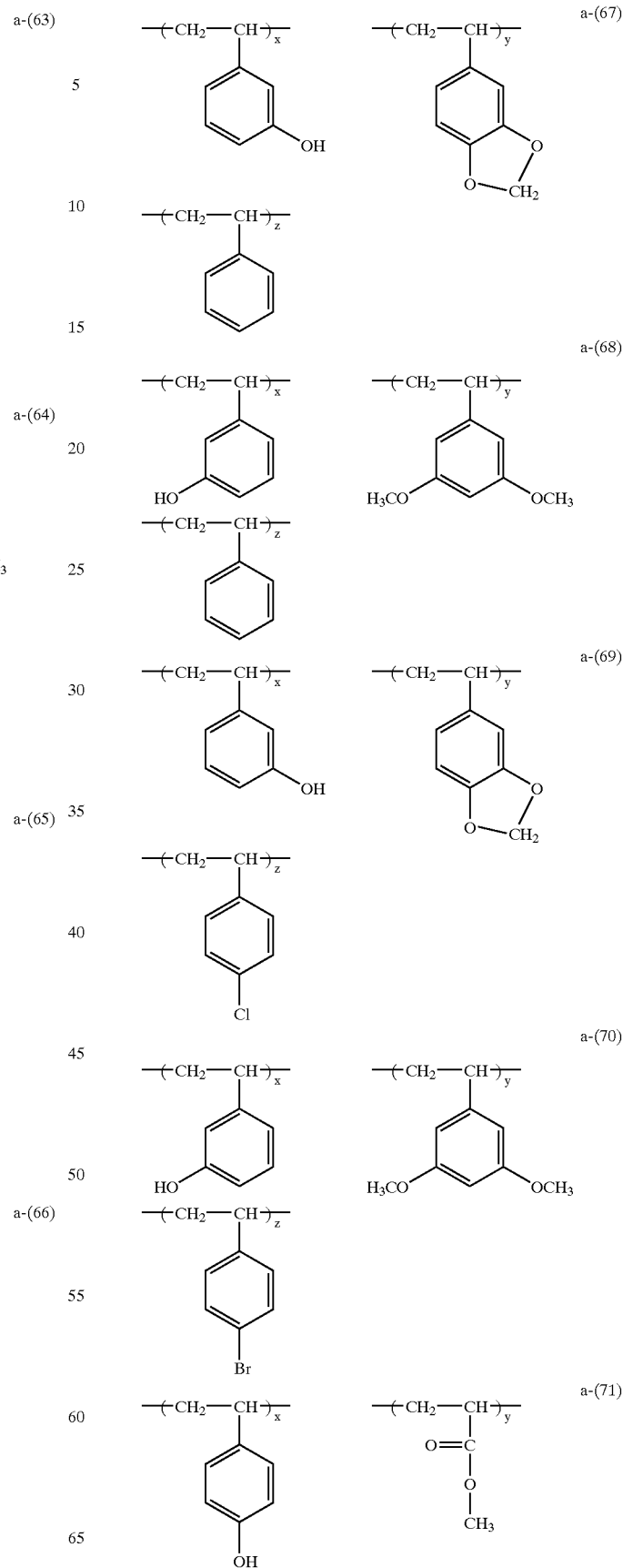

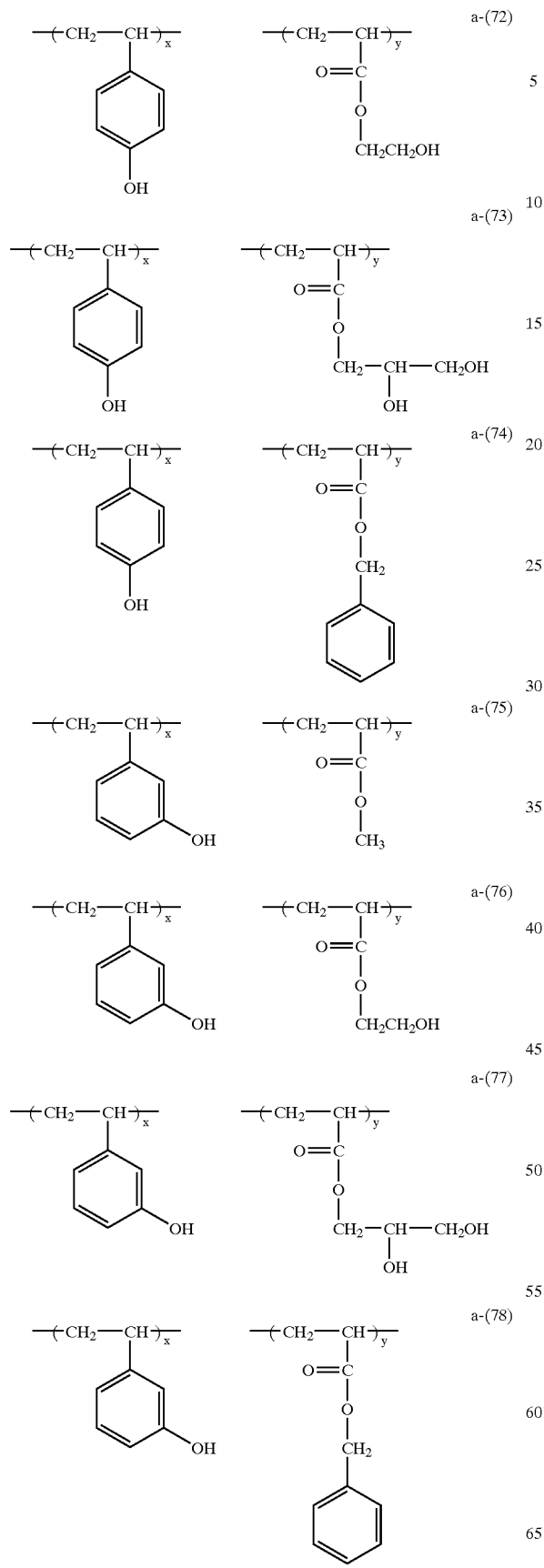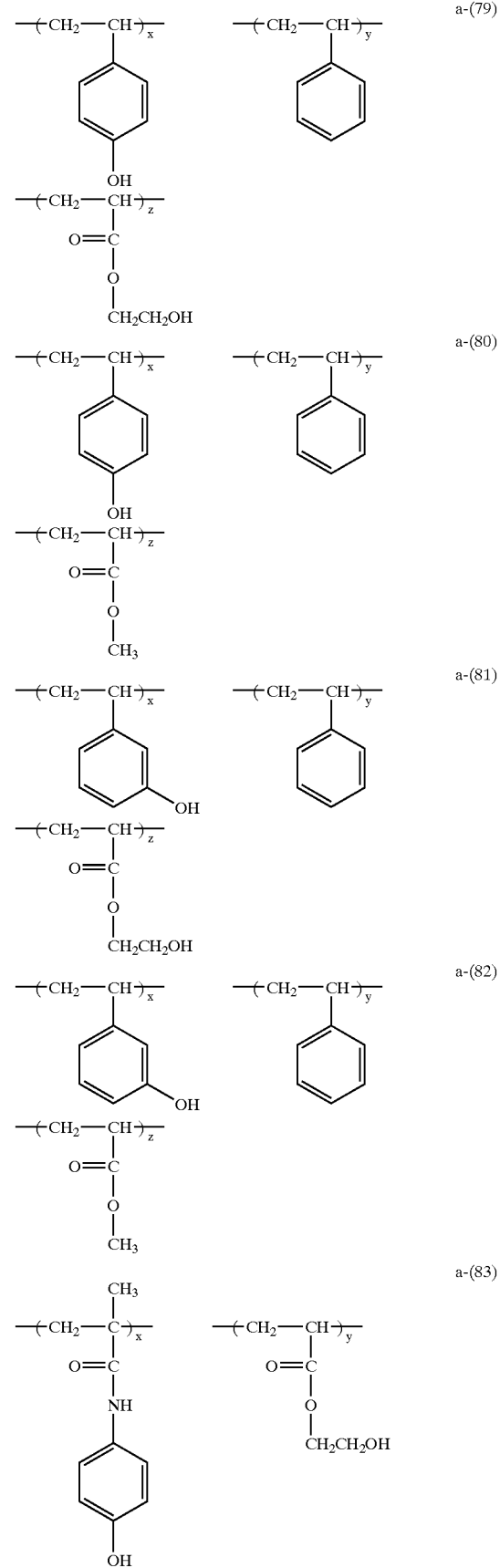

a-(84)
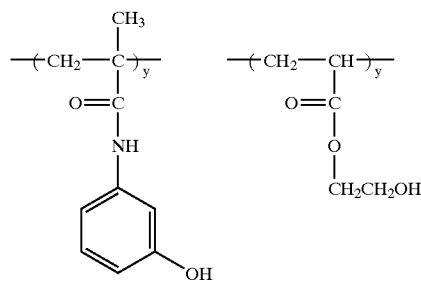
a-(85)
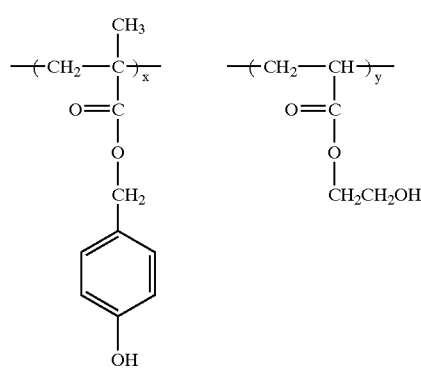
a-(86)
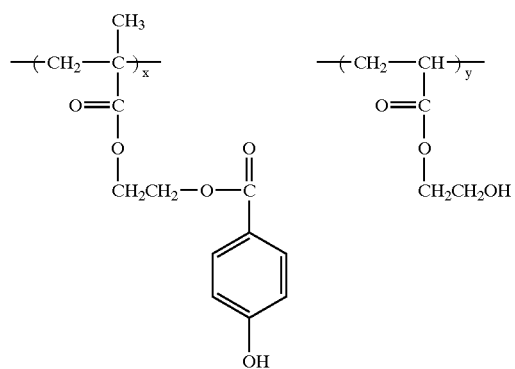
a-(87)
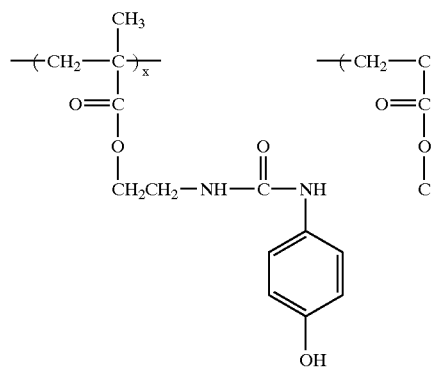
a-(88)
a-(89)
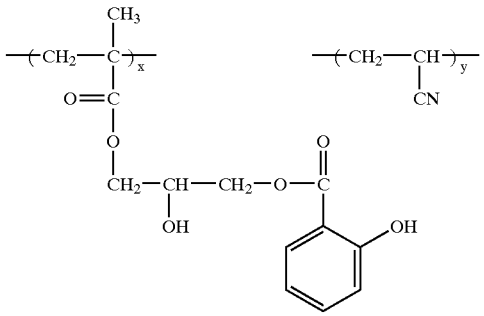
a-(90)
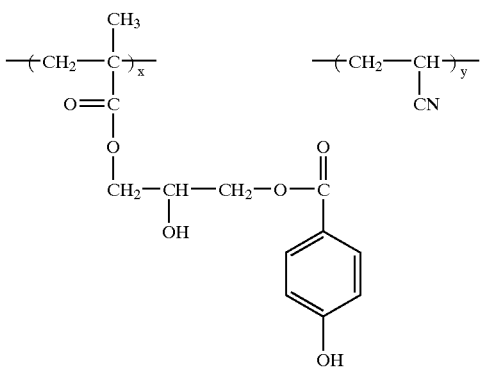
a-(91)
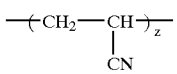

-continued a-(92)

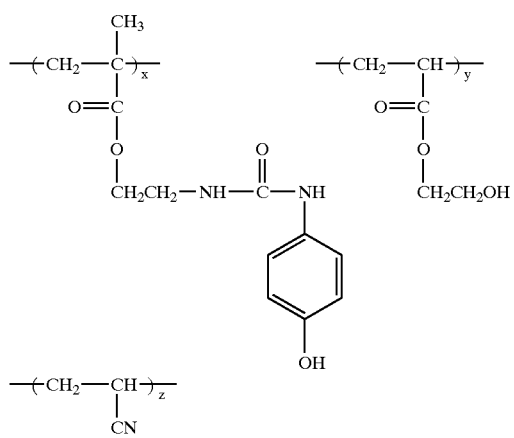

In the practical examples described above, n represents a positive integer. Also, x, y, and z each represents mol ratio of the resin composition, in the resin made of 2 components, x and y are used in the range of x=10 to 95 and y=5 to 90, and preferably x=40 to 90 and y=10 to 60, in the resin made of 3 components, x, y, and z are used in the range of x=10 to 90, y=5 to 85, and z=5 to 85, and preferably x=40 to 80, y=10 to 50, and z=10 to 50.

The molecular weight of the resin (B), preferably the resin having the repeating unit shown by the formula (a) is preferably from 1,000 to 200,000, and more preferably from 3,000 to 50,000 as a weight average molecular weight. The molecular weight distribution of the resin used in the invention is in the range of from 1 to 10, preferably from 1 to 3, and more preferably from 1 to 1.5. As the molecular weight distribution is smaller, the resolution is higher, the resist form is better, the side walls of the resist patters are more smooth, and the resist composition is excellent in the roughness property.

The content of the repeating unit shown by the formula (a) is from 5 to 100 mol %, and preferably from 10 to 90 mol % to the total resins.

The alkali-soluble resin containing the structural unit shown by the formula (a) used in the invention can be synthesized by the methods described in "Macromolecules" 28(11), 3787 to 3789 (1995), "Polym. Bull." (Berlin), 24(4), 385 to 389 (1990), and JP-A-8-286375. That is, the desired alkali-soluble resin can be obtained by a radical polymerization method or a living anion polymerization method.

These resins may be used singly or as a mixture of plural kinds of the resins.

In this case, the weight average molecular weight is defined as the polystyrene converted value of a gel permeation chromatography.

The alkali-dissolving rate of the alkali-soluble resin is preferably at least 20 Å (angstroms)/second, and particularly preferably at least 200 Å/second by measuring with 0.261 N tetramethylammonium hydroxide (TMAH).

The alkali-soluble resin in the invention may be used singly but can be used together with other alkali-soluble resin. As the using ratio, to 100 parts by weight of the alkali-soluble resin in the invention, the other alkali-soluble resin can be used at most 100 parts by weight. Then, other alkali-soluble resins which can be used together with the alkali-soluble resin in the invention are illustrated below.

That is, there are, for example, a novolac resin, a hydrogenated novolac resin, an acetone-pyrogallol resin, a styrene-maleic anhydride copolymer, a carboxyl group-containing methacrylic resin and the derivatives thereof but the invention is not limited to them.

The addition amount of the resin (B) is in the range of from 30 to 95% by weight, preferably from 40 to 90% by weight, and more preferably from 50 to 80% by weight to the whole solid components of the resist composition.

(2) Resin (B') in the invention:

The resin (B') in the invention is a resin having at least one unsaturated bond polymerizable by an acid and/or a radical, which is insoluble in water but soluble in an alkali aqueous solution, and preferably phenol novolac resins polyvinyl phenol resins, copolymers having a structural unit originated in vinyl phenol, a resin obtained by protecting or modifying a part of a polyvinyl phenol resin, etc., or a resin obtained by replacing a part or the whole of the phenol groups of a (meth)acrylate polymer, etc., having a phenol skeleton with a group having an unsaturated bond polymerizable with an acid and/or a radical can be widely used.

Preferably, there is a phenol-base resin having the repeating unit shown by the formula (a') described above.

In the formula (a'), $R_1'$ represents a hydrogen atom, a halogen atom, a cyano group, or an alkyl or haloalkyl group which may have a substituent.

$R_2'$ to $R_4'$ represents a hydrogen atom, a group shown by the formula (b), (c), or (d) described above, or an alkyl, cycloalkyl, aryl, aralkyl, or acyl group which may have a substituent.

$R_5'$ and $R_6'$, which may be the same or different, each represents a hydrogen atom, a hydroxyl group, a halogen atom, a cyano group, or an alkyl, cycloalkyl, alkenyl, aralkyl, or aryl group which may have a substituent.

$R_7'$ to $R_{12}'$, $R_{16}'$, and $R_{17}'$ represents a hydrogen atom, a halogen atom, a cyano group, or an alkyl or haloalkyl group which may have a substituent.

$R_{13}'$ and $R_{14}'$ each represents a hydrogen atom, a halogen atom, a hydroxy group, or an alkyl, alkoxy, or acyloxy group which may have a substituent.

$R_{15}'$ represents a hydrogen atom or an alkyl, cycloalkyl, aralkyl, or aryl group which may have a substituent;

$A_1$ represents a single bond, or a divalent alkylene, alkenylene, cycloalkylene, or arylene group which may have a substituent, or —O—, —$SO_2$—, —O—CO—$R_{20}$—, —CO—O—$R_{21}$—, or —CO—N($R_{22}$)—$R_{23}$—.

$R_{20}$, $R_{21}$, and $R_{23}$, which may be the same or different, each represents a single bond, or a divalent alkylene, alkenylene, cycloalkylene, or arylene group which may have an ether structure, an ester structure, an amide structure, a urethane structure, or a ureido structure or may have a substituent.

$R_{22}$ represents a hydrogen atom, or an alkyl, cycloalkyl, aralkyl, or aryl group which may have a substituent.

$A_2$ represents a single bond, —O—$R_{21}$—, or —N($R_{22}$)—$R_{23}$—.

$A_3$ represents a single bond, —$SO_2$—, or an arylene group which may have an alkylene structure or may have a substituent.

$A_4$ represents a single bond, a divalent alkylene, cycloalkylene, or arylene group which may have a substituent, or —O—, —$SO_2$—, —CO—, or —CO—O—$R_{21}$—.

x, y, and z in the formula (a') each represents 0 or 1 and m and n in the formula (c) each represents 0 or an integer of at least 1.

However, in the formula (a'), at least one repeating unit has the group of the formula (b), (c), or (d); and two of $R_2'$ to $R_4'$, or one of $R_2'$ to $R_4'$ and $R_5'$ or $R_6'$ may combine with each other to form a ring.

Also, as the alkyl group of $R_1'$ to $R_{17}'$ and $R_{22}$, there are, for example, the alkyl groups having from 1 to 8 carbon atoms, and practically, there are, preferably, methyl, ethyl, propyl, n-butyl, sec-butyl, hexyl, 2-ethylhexyl, and octyl.

The cycloalkyl group of $R_2'$ to $R_6'$, $R_{15}'$ and $R_{22}$ may be a monocyclic type or a polycyclic type. As the monocyclic type, there are cycloalkyl groups having from 3 to 8 carbon atoms, and there are preferably cyclopropyl, cyclopentyl, and cyclohexyl. As the polycyclic type, there are preferably adamantyl, norbornyl, isoboronyl, dicyclopentyl, α-pinel, tricyclodecanyl, etc.

As the alkenyl group of $R_5'$ and $R_6'$, there are, for example, alkenyl groups having from 2 to 8 carbon atoms, and practically, there are preferably vinyl, allyl, butenyl, and cyclohexenyl.

As the aryl group of $R_2'$ to $R_6'$, $R_{15}'$, and $R_{22}$, there are, for example, aryl groups having from 6 to 15 carbon atoms, and practically, there are preferably phenyl, tolyl, dimethylphenyl, 2,4,6-trimethylphenyl, naphthyl, anthryl, etc.

As the aralkyl group of $R_2'$ to $R_6'$, $R_{15}'$, and $R_{22}$, there are, for example, aralkyl groups having from 7 to 12 carbon atoms, and practically, there are preferably benzyl, phenethyl, naphthylmethyl, etc.

As the haloalkyl group of $R_1'$, $R_7'$ to $R_{12}'$, $R_{16}'$, and $R_{17}'$, there are, for example, haloalkyl groups having from 1 to 4 carbon atoms, and practically, there are preferably chloromethyl, chloroethyl, chloropropyl, chlorobutyl, bromomethyl, bromoethyl, etc.

As the acyl group of $R_2'$ to $R_4'$, there are, for example, acyl groups having from 1 to 10 carbon atoms, and practically, there are preferably formyl, acetyl, propanoyl, butanoyl, pivaloyl, benzoyl, etc.

As the alkoxy group of $R_{13}'$ and $R_{14}'$, there are, for example, alkoxy groups having from 1 to 8 carbon atoms, and practically, there are, preferably, methoxy, ethoxy, propoxy, and butoxy. Also, as the acyloxy group, there are, for example, acyloxy groups having from 1 to 10 carbon atoms, and practically, there are, preferably, acetoxy, propanoyloxy, benzoyloxy, etc.

As the alkylene group of $A_1$, $A_4$, $R_{20}$, $R_{21}$, and $R_{23}$, there are preferably alkylene groups having from 1 to 8 carbon atoms, such as methylene, ethylene, propylene, butylene, hexylene, octylene, etc.

As the alkenylene group of $A_1$, $R_{20}$, $R_{21}$, and $R_{23}$, there are preferably alkenylene groups having from 2 to 6 carbon atoms, such as ethenylene, propenylene, butenylene, etc.

As the cycloalkylene group of $A_1$, $A_4$, $R_{20}$, $R_{21}$, and $R_{23}$, there are preferably cycloalkylene groups having from 5 to 8 carbon atoms, such as cyclopentylene, cyclohexylene, etc.

As the arylene group of $A_1$, $A_3$, $A_4$, $R_{20}$, $R_{21}$, and $R_{23}$, there are arylene groups having from 6 to 12 carbon atoms, and there are preferably phenylene, tolylene, xylylene, naphthylene, etc.

Furthermore, the substituent which is substituted to these groups includes a group having an active hydrogen, such as an amino group, an amide group, a ureido group, a urethane group, a hydroxyl group, a carboxyl group, etc.; a halogen atom (such as fluorine, chlorine, bromine, iodine, etc.), an alkoxy group (such as, methoxy, ethoxy, propoxy, butoxy, etc.), a thioether group, an acyl group (such as, acetyl, propanoyl, benzoyl, etc.), an acyloxy group (such as, acetoxy, propanoyloxy, benzoyloxy, etc.), an alkoxycarbonyl group (such as, methoxycarbonyl, ethoxycarbonyl, propoxycarbonyl, etc.), a cyano group, a nitro group, etc.

Particularly, the groups having active hydrogen, such as an amino group, a hydroxyl group, a carboxyl group, etc., are preferred.

Also, as the ring formed by combining two of $R_2'$ to $R_4'$, or one of $R_2'$ to $R_4'$ and $R_5'$ or $R_6'$ with each other, there are 4- to 7-membered rings containing an oxygen atom, such as a benzofuran ring, a benzodioxonol ring, a penzpyran ring, etc.

The resin (B') in the invention may be a resin composed of the repeating structural unit only shown by the formula (a') but for the purpose of further improving the performance of the negative-working resist composition of the invention, the resin may be copolymerized with other polymerizable monomer.

As the copolymerizable monomer which can be used in the invention, the following monomers are included. For example, there is a compound having one addition polymerizing unsaturated bond selected from acrylic acid esters, acrylamides, methacrylic acid esters, methacrylamides, allyl compounds, vinyl ethers, vinyl esters, styrenes, crotonic acid esters, etc. other than the above-described monomers.

Practical examples of the acrylic acid esters include alkyl (the carbon atom number of the alkyl group is preferably from 1 to 10) acrylates (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethlolpropane monoacrylate, pentaerythritol monoacrylate, glycidyl acrylate, benzyl acrylate, furfuryl acrylate, and tetrahydrofurfuryl acrylate) and aryl acrylates (e.g., phenyl acrylate).

Practical examples of the methacrylic acid esters include alkyl (the carbon atom number of the alkyl group is preferably from 1 to 10) methacrylates (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate) and aryl methacrylates (e.g., phenyl methacrylate, cresyl methacrylate, and naphthyl methacrylate).

Practical examples of the acrylamides include acrylamide, N-alkylacrylamides (as the alkyl group, there are alkyl groups having from 1 to 10 carbon atoms, such as methyl, ethyl, propyl, butyl, tert-butyl, heptyl, octyl, cyclohexyl, benzyl, hydroxyethyl, etc.), N-arylacrylamides (as the aryl group, there are, for example, phenyl, tolyl, nitrophenyl, naphthyl, cyanonaphthyl, hydroxyphenyl, and carboxyphenyl), N,N-diaalkylacrylamides (as the alkyl group, there are alkyl groups having from 1 to 10 carbon atoms, such as methyl, ethyl, butyl, isobutyl, ethylhexyl, cycylohexyl, etc.), N,N-diarylacrylamides (as the aryl group, there are, for example, phenyl), N-methyl-N-phenylacrylamide, N-hydroxyethyl-N-methylacrylamide, and N-2-acetamidoethyl-N-acetylacrylamide.

Practical examples of the methacrylamides include N-alkylmethacrylamides (as the alkyl group, there are alkyl groups having from 1 to 10 carbon atoms, such as methyl, ethyl, tert-butyl, ethylhexyl, hydroxyethyl, cyclohexyl, etc.), N-arylmethacrylamides (as the aryl group, there are phenyl, etc.), N,N-dialkylmethacrylamides (as the alkyl group, there are ethyl, propyl, butyl, etc.), N,N-diarylmethacrylamides (as the aryl group, there are phenyl, etc.), N-hydroxyethyl-N-methylmethacrylamide, N-methyl-N-phenyl-methacrylamide, and N-ethyl-N-phenylmethacrylamide.

Practical examples of the allyl compounds include allyl esters (e.g., allyl acetate, allyl caproate, allyl caprylate, allyl laurate, allyl palmitate, allyl stearate, allyl benzoate, allyl acetoacetate, and allyl lactate), and allyloxy ethanol.

Practical examples of the vinyl ethers include alkyl vinyl ethers (e.g., hexyl vinyl ether, octyl vinyl ether, decyl vinyl ether, ethylhexyl vinyl ether, methoxyethyl vinyl ether, ethoxyhexyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether), and vinylaryl ethers (e.g., vinylphenyl ether, vinyltolyl ether, vinyl chlorophenyl ether, vinyl-2,4-dichlorophenyl ether, vinylnaphthyl ether, and vinyl anthranyl ether).

Practical examples of the vinyl esters include vinyl butyrate, vinyl isobutyrate, vinyl trimethyl acetate, vinyl diethyl acetate, vinyl valate, vinyl caproate, vinyl chloroacetate, vinyl dichloroacetate, vinyl methoxy acetate, vinyl butoxy acetate, vinyl phenyl acetate, vinyl acetoacetate, vinyl lactate, vinyl-β-phenyl butyrate, vinyl-cyclohexyl carboxylate, vinyl benzoate, vinyl salicylate, vinyl chlorobenzoate, vinyl tetrachlorobenzoate, and vinyl naphthoate.

Practical examples of the styrene include styrene, alkyl-styrenes (e.g., methylstyrene, dimethylstyrene, trimethylstyrene, ethylstyrene, diethylsytrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene), alkoxy-styrenes (e.g., methoxystyrene, 4-methoxy-3-methylstyrene, and dimethoxystyrene), halogenstyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene), and carboxystyrenes.

Practical examples of the crotonic acid esters include alkyl crotonates (e.g., butyl crotonate, hexyl crotonate, and glycerol monocrotonate). Other copolymerizable monomers used in the invention, there are dialkyl itaconates (e.g., dimethyl itaconate, diethyl itaconate and dibutyl itaconate), maleic acid or fumaric acid dialkyl esters (e.g., dimethyl maleate and dubutyl fumalate), maleic anhydride, maleimide, acrylonitrile, methacrylonitrile, maleironitrile, etc.

Also, other copolymerizable addition polymerizing unsaturated compounds can be generally used in the invention.

In these monomers, the monomers improving the alkali-solubility such as the monomers having a carboxyl group, such as carboxystyrene, N-(carboxyphenyl)acrylamide, N-(carboxyphenyl)methacrylamide, etc., and maleimide, etc., are preferred as the copolymer component.

The content of other polymerizable monomer in the resin in the invention is preferably not more than 50 mol %, and more preferably not more than 30 mol % to the whole repeating units.

Then, practical examples of the resin having the repeating structural unit shown by the formula (a') are shown below but the invention is not limited to these compounds.

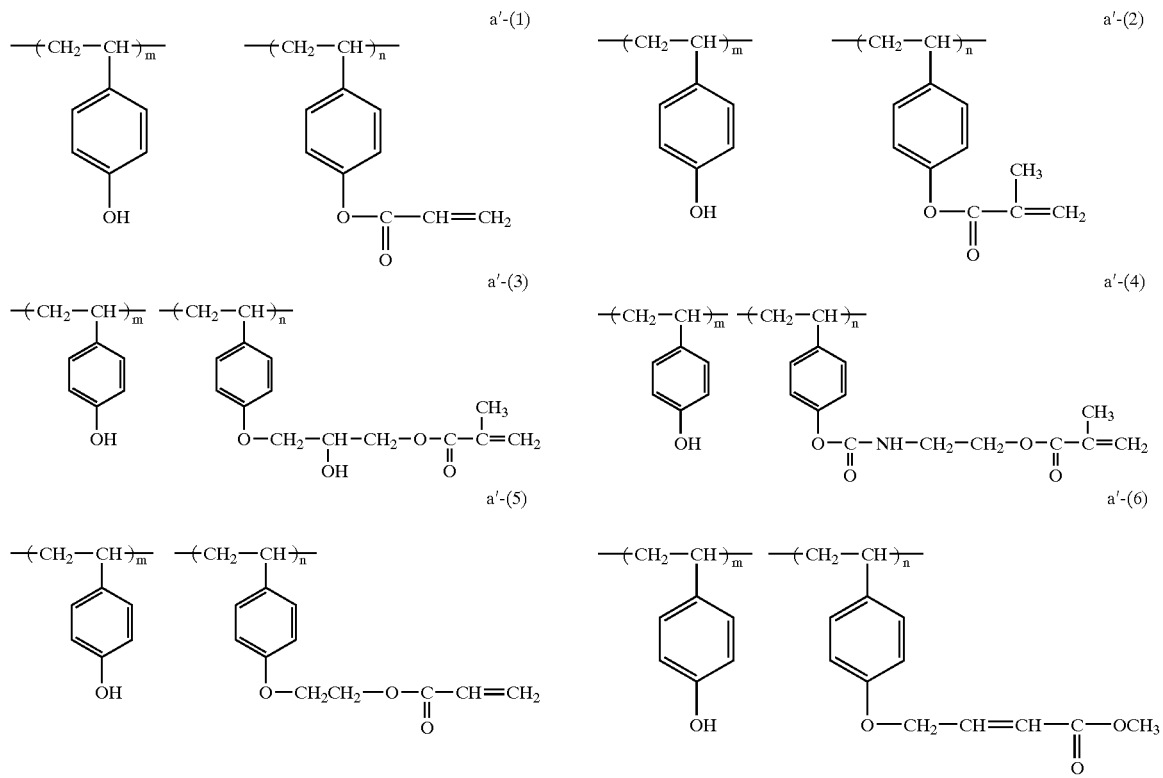

-continued
a′-(7)
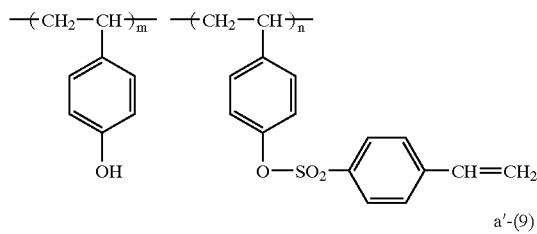
a′-(8)
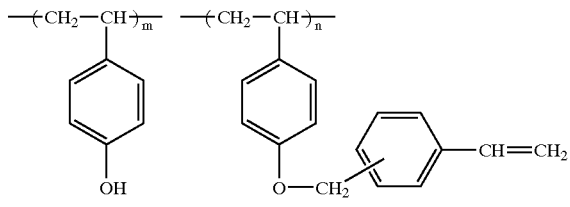
a′-(9)
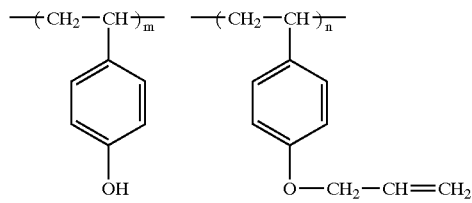
a′-(10)
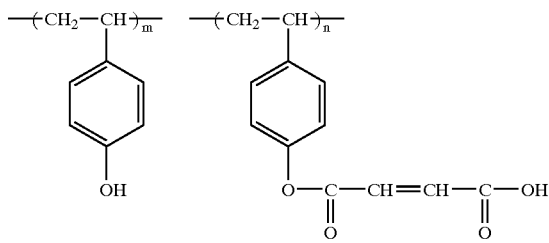
a′-(11)
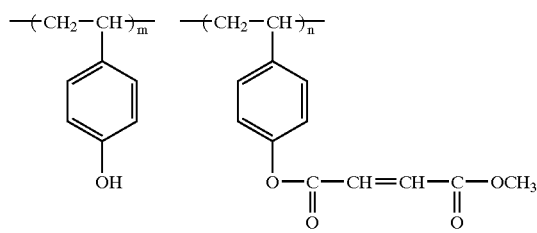
a′-(12)
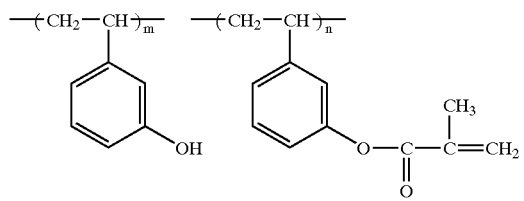
a′-(13)
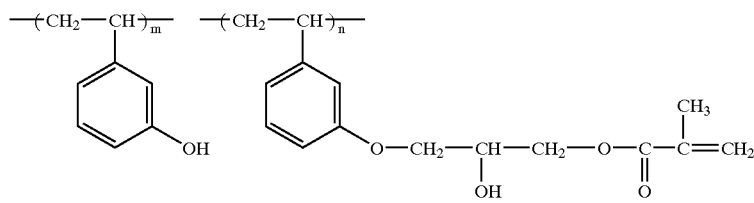
a′-(14)
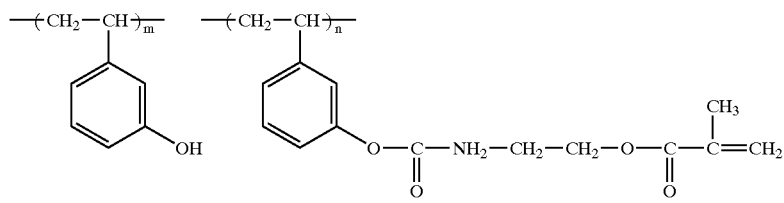
a′-(15)
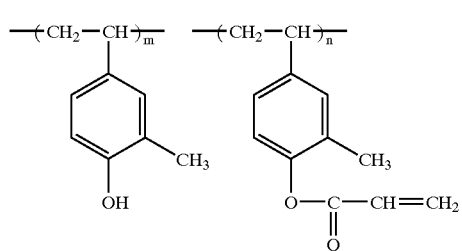
a′-(16)
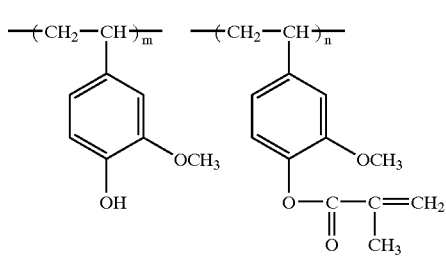
a′-(17)

-continued
a'-(18)
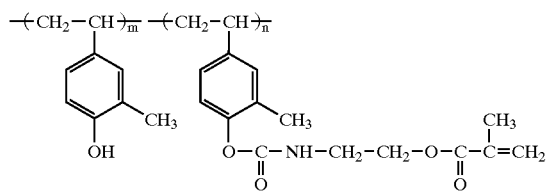
a'-(19)
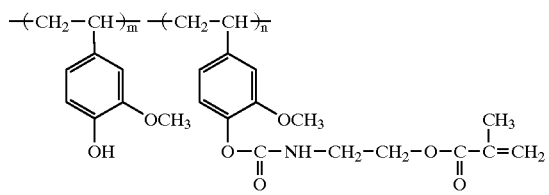
a'-(20)
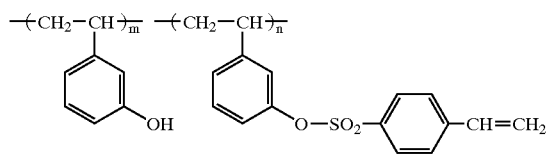
a'-(21)
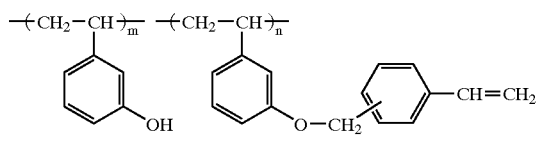
a'-(22)
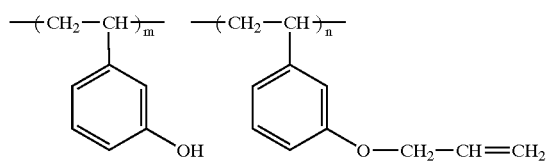
a'-(23)
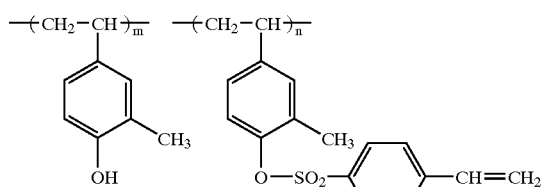
a'-(24)
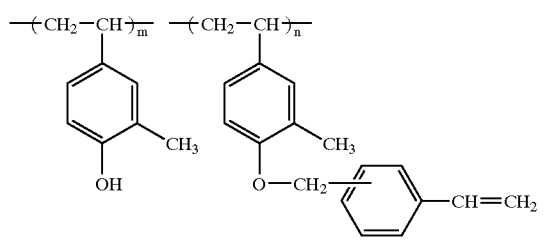
a'-(25)
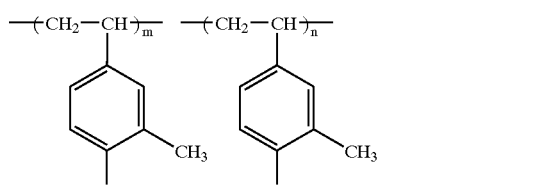
a'-(26)
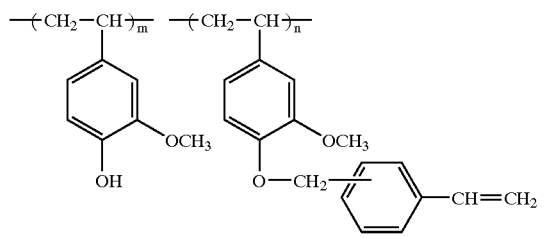
a'-(27)
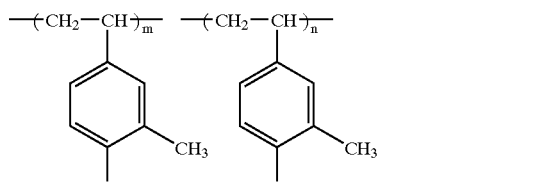
a'-(28)
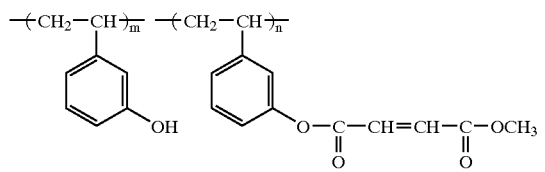
a'-(29)
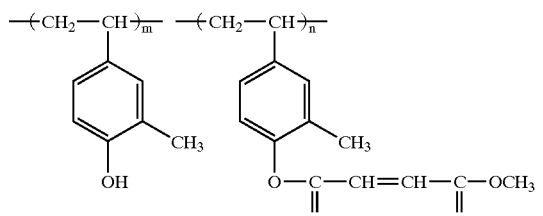
a'-(30)
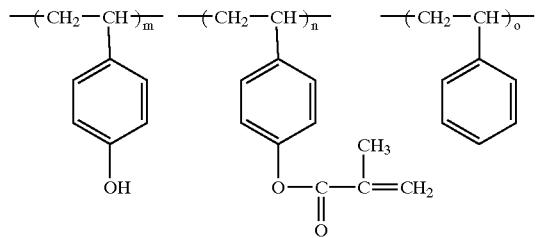
a'-(31)
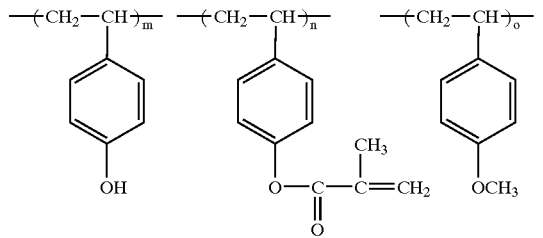

a'-(32)
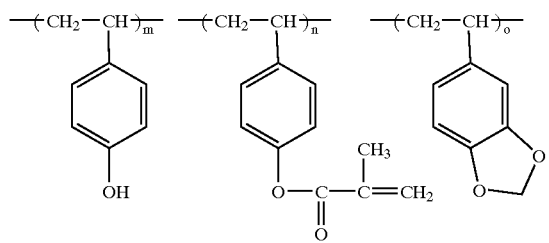
a'-(33)
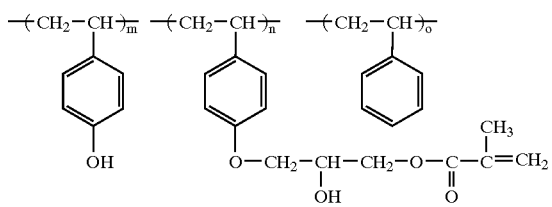
a'-(34)
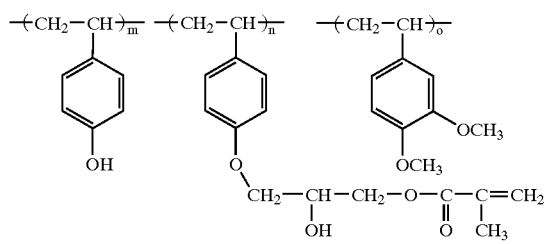
a'-(35)
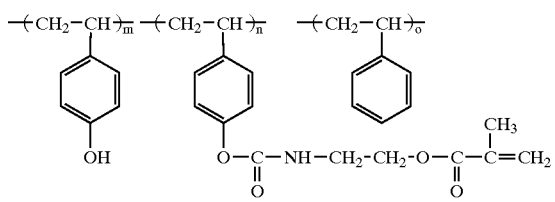
a'-(36)
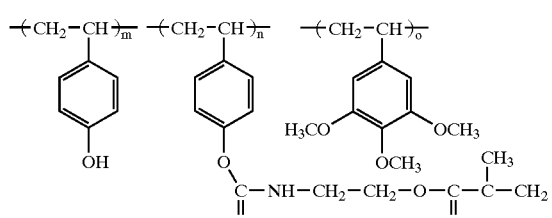
a'-(37)
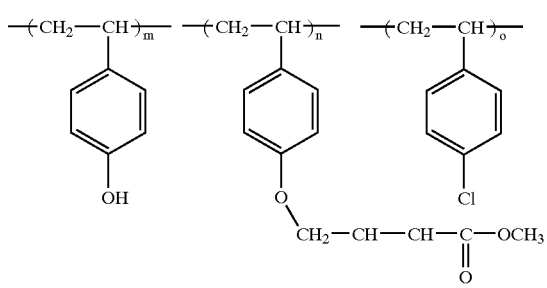
a'-(38)
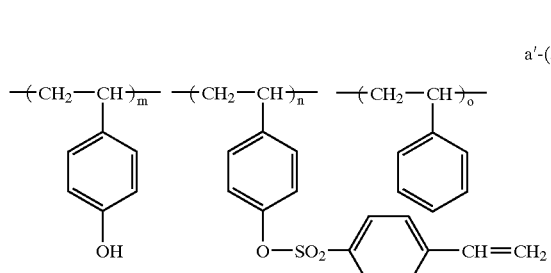
a'-(39)
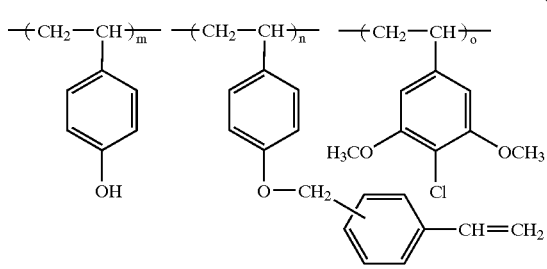
a'-(40)
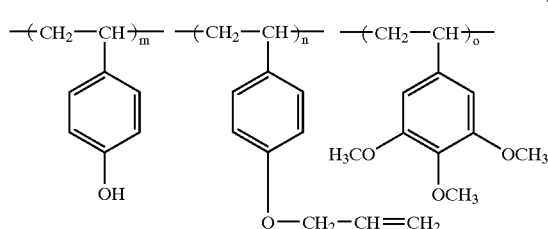
a'-(41)
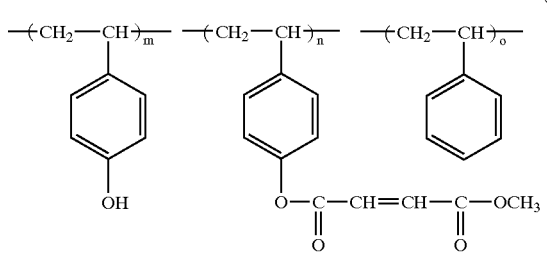
a'-(42)
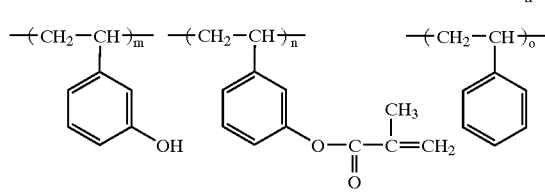
a'-(43)
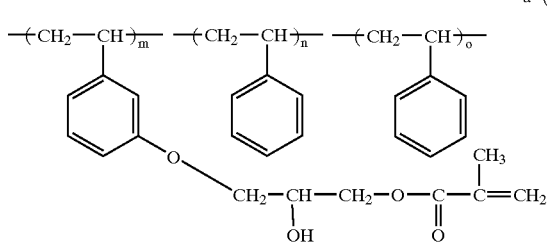

-continued
a'-(44)
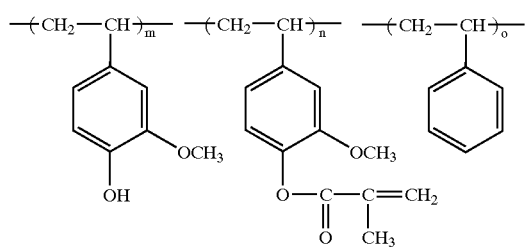
a'-(45)
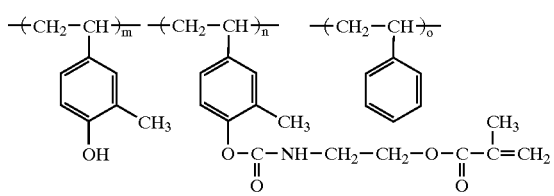
a'-(46)
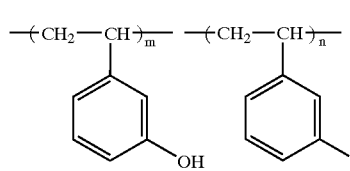
a'-(47)
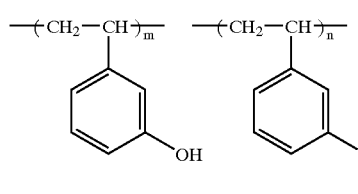
a'-(48)
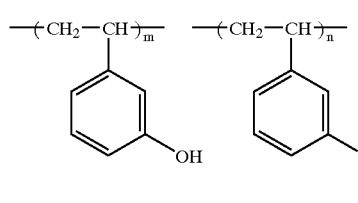
a'-(49)
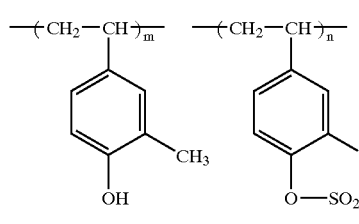
a'-(50)
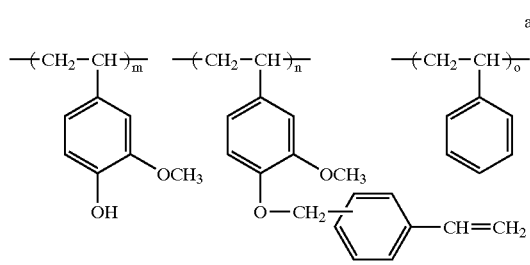
a'-(51)
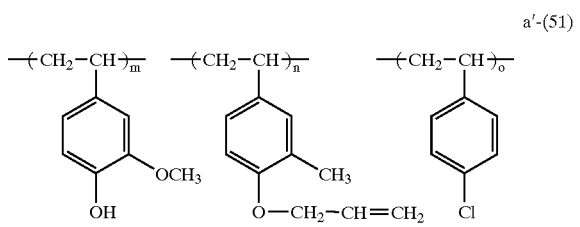

a'-(52)
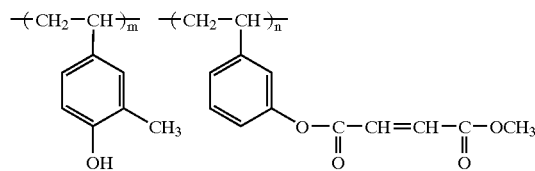
a'-(53)
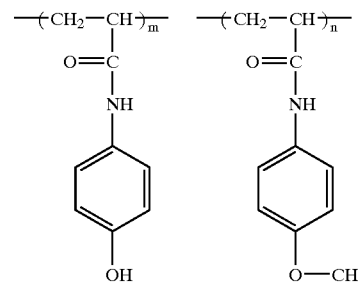
a'-(54)
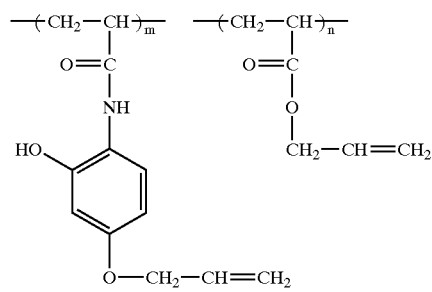
a'-(55)
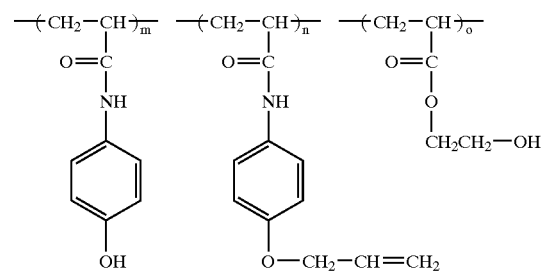
a'-(56)
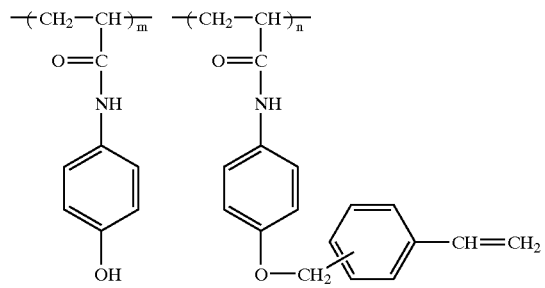
a'-(57)
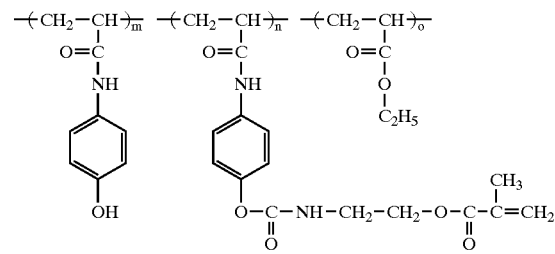
a'-(58)
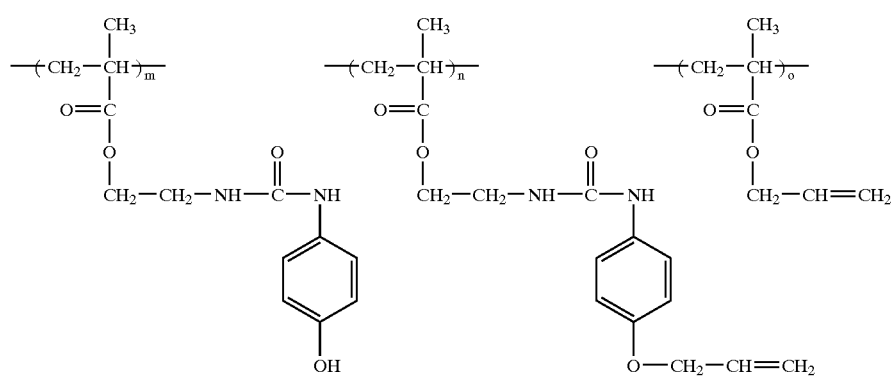

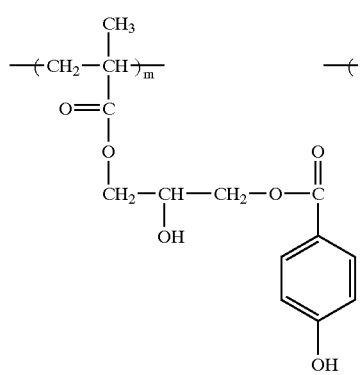 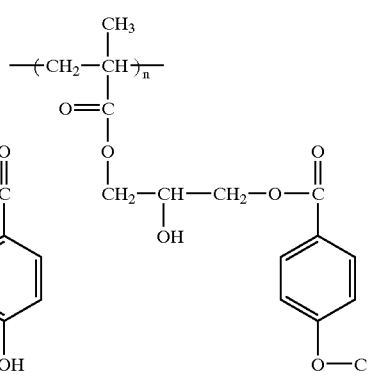 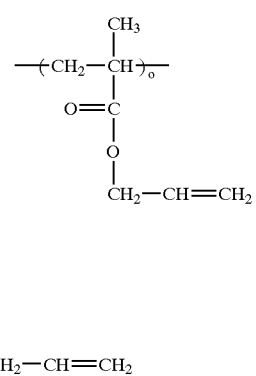

a'-(59)

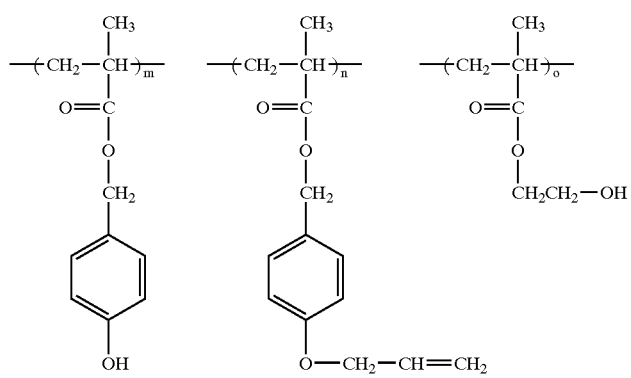

a'-(60)

In the above examples (formulae), m, n, and o each represents a mol ratio of the resin compositions, in the resin made of 2 components, m and n are used in the range of m=1 to 95 and n=5 to 90, and preferably m=40 to 90 and n=10 to 60, and in the resin made of 3 components, m, n, and o are used in the range of m=10 to 90, n=5 to 85, and o=5 to 85, and preferably m=40 to 80, n=10 to 50, and o=10 to 50.

The molecular weight of the resin (B'), preferably the resin having the repeating unit shown by the formula (a') is preferably from 1,000 to 200,000, and more preferably from 3,000 to 50,000 as a weight average molecular weight. The molecular weight distribution of the resin used in the invention is in the range of from 1 to 10, preferably from 1 to 3, and more preferably from 1 to 1.5. As the molecular weight distribution is smaller, the resolution is higher, the resist form is better, the side walls of the resist patters are more smooth, and the resist composition is excellent in the roughness property.

The content of the repeating unit shown by the formula (a') is from 5 to 100 mol %, and preferably from 10 to 90 mol % to the total resins.

The alkali-soluble resin containing the structural unit shown by the formula (a') used in the invention can be synthesized by the methods described in "Macromolecules" 28(11), 3787 to 3789 (1995), "Polym. Bull." (Berlin), 24(4), 395 to 389 (1990), and JP-A-8-286375. That is, the desired alkali-solution resin can be obtained by a radical polymerization method or a living anion polymerization method.

These resins may be used singly or as a mixture of plural kinds of the resins.

In this case, the weight average molecular weight is defined as the polystyrene converted value of a gel permeation chromatography.

The alkali-dissolving rate of the alkali-soluble resin is preferably at least 20 Å/second, and particularly preferably at least 200 Å/second by measuring with 0.261 N tetramethylammonium hydroxide (TMAH).

The alkali-soluble resin in the invention may be used singly but can be used together with other alkali-soluble resin. As the using ratio, to 100 parts by weight of the alkali-soluble resin in the invention, the other alkali-soluble resin can be used at most 100 parts by weight. Then, other alkali-soluble resins which can be used together with the alkali-soluble resin in the invention are illustrated below.

That is, there are, for example, a novolac resin, a hydrogenated novolac resin, an acetone-pyrogallol resin, a styrene-maleic anhydride copolymer, a carboxyl group-containing methacrylic resin and the derivatives thereof but the invention is not limited to them.

The addition amount of the resin (B') is in the range of from 30 to 95% by weight, preferably from 40 to 90% by weight, and more preferably from 50 to 80% by weight to the whole solid components of the resist composition.

(3) Compound (A) in the invention generating an acid and/or radical species by irradiation of electron beams or X-rays:

As the component (A) used in the invention, any compounds each generating an acid and/or radical species by the irradiation of electron beams or X-rays can be used.

In this case, the compound generating an acid and/or radical species shows a compound generating an acid, a compounds generating an acid and radical species, or a compound generating radical species.

As the compound generating an acid and/or radical species by the irradiation of electron beams or X-rays, a photo initiator for a photo cationic polymerization, a photo initiator for a photo radical polymerization, a photo achromatic agent of dyes, a photo discoloring agent, or a known compound of generating an acid by light used for a microresist, etc., or a compound of these compounds can be suitably selectively used.

Also, a compound having introduced into the main chain or a side chain of the polymer a group or a compound generating an acid and/or radical species by the irradiation of electron beams or X-rays, for example, the compounds described in JP-A-63-26653, JP-A-55-164824, JP-A-62-69263, JP-A-63-146038, JP-A-63-163452, JP-A-62-153853, JP-A-63-146029, etc., can be used.

Furthermore, the compounds generating an acid described in U.S. Pat. No. 3,779,778, European Patent 126,712, etc., can be also used.

Also, there are known onium salts such as diazonium salts, phosphonium salts, iodonium salts, sulfonium salts, selenonium salts, etc.; organic halogen compounds, o-nitrobenzyl sulfonate compounds, N-iminosulfonate compounds, N-imidosulfonate compounds, diazosulfonium compounds, disulfone compounds, etc.

Preferably, there are the sulfonate compounds of sulfonium or iodonium, the sulfonic acid ester compounds of N-hyroxyimide, and disulfonyldiazomethane compounds.

In these compounds, the imidosulfonate compounds described in JP-A-10-7653 and JP-A-11-2901, the diazodisulfone compounds described in JP-A-4-210960, European Patent 417,557, etc., and further the sulfonium salts and iodonium salts shown by following formulae (I) to (III) can be particularly preferably used, but the sulfonium salts and iodonium salts shown by following formulae (I) to (III) are most preferred.

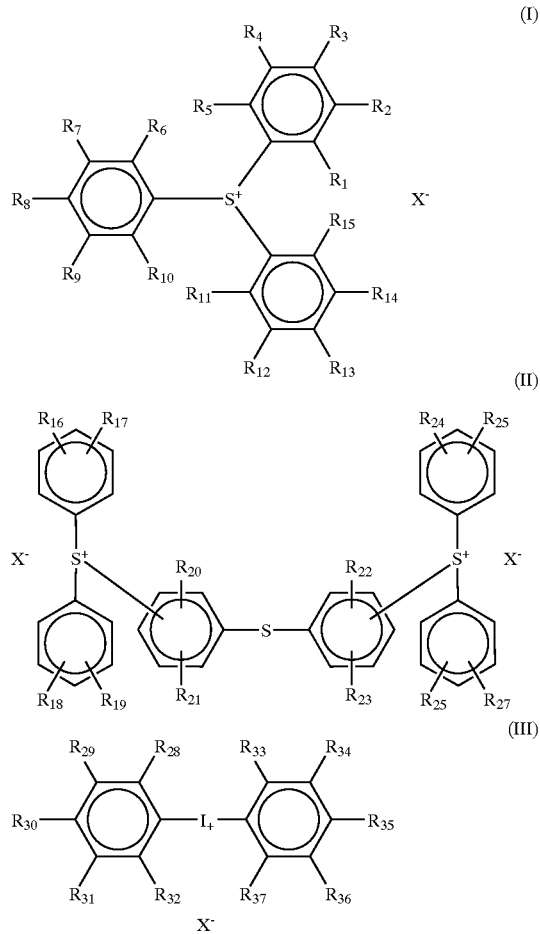

In the formulae (I) to (III), $R_1$ to $R_{37}$ each represents a hydrogen atom, an alkyl group, an alkoxy group, a hydroxyl group, a halogen atom, or —S—$R_{38}$.

The alkyl group shown by $R_1$ to $R_{37}$ may be straight chain, branched, or cyclic. As the straight chain or branched alkyl group, there are alkyl groups having from 1 to 4 carbon atoms, such as methyl, ethyl, propyl, n-butyl, sec-butyl, and tert-butyl. As the cyclic alkyl group, there are, for example, cyclic alkyl groups having from 3 to 8 carbon atoms such as cyclopropyl, cyclopentyl, cyclohexyl, etc.

The alkoxy group shown by $R_1$ to $R_{37}$ may be straight chain, branched, or cyclic alkoxy group. As the straight chain or branched alkoxy group, there are alkoxy groups having from 1 to 8 carbon atoms, such as methoxy, ethoxy, hydroxyethoxy, propoxy, n-butoxy, iso-butoxy, sec-butoxy, tert-butoxy, and octyloxy.

As the cyclic alkoxy group, there are, for example, cyclopentyloxy and cyclohexyloxy.

As the halogen atom shown by $R_1$ to $R_{37}$, there are, for example, fluorine, chlorine, bromine, and iodine.

Also, $R_{38}$ in —S—$R_{38}$ shown by $R_1$ to $R_{37}$ represents an alkyl group or an aryl group. As the alkyl group shown by $R_{38}$, there are, for example, the alkyl groups already described above as the alkyl groups shown by $R_1$ to $R_{37}$.

As the aryl group shown by $R_{38}$, there are aryl groups having from 6 to 14 carbon atoms, such as phenyl, tolyl, methoxyphenyl, naphthyl, etc.

The alkyl group, the aryl group, and other groups shown by $R_1$ to $R_{38}$ each may further have a substituent at a part of the groups to increase the carbon atoms or may not have substituent. As the preferred substituents which are bonded to the groups shown by $R_1$ to $R_{37}$, there are alkoxy groups having from 1 to 4 carbon atoms, aryl groups having from 6 to 10 carbon atoms, and alkenyl groups having from 2 to 6 carbon atoms. As other substituent, there are halogen atoms, such as fluorine, chlorine, and iodine.

In the groups shown by $R_1$ to $R_{15}$ of the formula (I) described above, at least two groups of them may combine with each other to form a ring. The ring may be formed by directly combining the terminals of the groups shown by $R_1$ to $R_{15}$. Furthermore, the ring may be formed by indirectly combining via one or two or more elements selected from carbon, oxygen, sulfur, and nitrogen. As the ring structure formed by combining two or more groups shown by $R_1$ to $R_{15}$, there are structures having the ring structure same as a furan ring, a dihydrofuran ring, a pyran ring, a trihydropyran ring, a thiophene ring, a pyrrole ring, etc. The above-descriptions are almost same as those of $R_{16}$ to $R_{27}$ of the formula (II), and two or more groups of $R_{16}$ to $R_{27}$ may combine directly or indirectly to form rings. These are same as $R_{28}$ to $R_{37}$ of the formula (III).

Each of the formulae (I) to (III) has $X^-$. $X^-$ of the formulae (I) to (III) is an anion of acid. The acid forming the anion is the acid selected from benzenesulfonic acid, naphthalenesulfonic acid, and anthracenesulfonic acid. The acid has at least one fluorine atom as a substituent. Or, the acid has at least one organic group selected from an alkyl group, an alkoxy group, an acyl group, an acryloxy group, a sulfonyl group, a sulfonyloxy group, a sulfonylamino group, an aryl group, an aralkyl group, and an alkoxycarbonyl group together with a fluorine atom or in place of a fluorine atom, and further, the organic group has at least one fluorine atom as a substituent. Also, the benzenesulfonic acid, naphthalenesulfonic acid, or anthracenesulfonic acid described above may be substituted with a halogen atom other than fluorine, or a hydroxyl group, a nitro group, etc.

The alkyl group bonding to benzenesulfonic acid, etc., forming the anion of $X^-$ is, for example, an alkyl group having from 1 to 12 carbon atoms. The alkyl group may be a straight chain form, a branched form, or a cyclic form. The alkyl group is substituted with at least one fluorine atom, and preferably substituted with not more than 25 fluorine atoms. Practically, there are a trifluoromethyl group, a pentafluoroethyl group, a 2,2,2-trifluoroethyl group, a heptafluoropropyl group, a heptafluoroisopropyl group, a perfluorobutyl group, a perfluorooctyl group, a perfluorododecyl group, a perfluorocyclohexyl group, etc. In these groups, the perfluoroalkyl group having from 1 to 4 carbon atoms all the hydrogen atoms of which are substituted with fluorine is preferred.

The alkoxy group bonding to above-described benzenesulfonic acid, etc., singly or together with an alkyl group is an alkoxy group having from 1 to 12 carbon atoms. The alkoxy group may be a straight chain form, a branched form, or a cyclic form. The alkoxy group is substituted with at least one fluorine atom, and preferably substituted with not more than 25 fluorine atoms. Practically, there are a trifluoromethoxy group, a pentafluoroethoxy group, a heptafluoroisopropyloxy group, a perfluorobutoxy group, a perfluorooctyloxy group, a perfluorododecyloxy group, a perfluorocyclohexyloxy group, etc. In these groups, the perfluoroalkoxy group having from 1 to 4 carbon atoms all the hydrogen atoms of which are substituted with fluorine is preferred.

The acyl group bonding to above-described benzenesulfonic acid, etc., singly or together with an alkyl group is preferably an acyl group having from 2 to 12 carbon atoms and substituted with from 1 to 23 fluorine atoms. Practically, there are a trifluoroacetyl group, a fluoroacetyl group, a pentafluoropropionyl group, a pentafluorobenzoyl group, etc.

The acyloxy group bonding to above-described benzenesulfonic acid, etc., singly or together with an alkyl group is preferably an acyloxy group having from 2 to 12 carbon atoms and substituted with from 1 to 23 fluorine atoms. Practically, there are trifluoroacetoxy group, a fluoroacetoxy group, a pentanfluoropropionyloxy group, a pentafluorobenzoyloxy group, etc.

The sulfonyl group bonding to above-described benzenesulfonic acid, etc., a singly or together with an alkyl group is preferably a sulfonyl group having from 1 to 12 carbon atoms and substituted with from 1 to 25 fluorine atoms. Practically, there are a trifluoromethanesulfonyl group, a pentafluoroethanesulfonyl group, a perfluorobutanesulfonyl group, a perfluorooctanesulfonyl group, pentafluorobenzenesuflonyl group, a 4-trifluoromethylbenzenesulfonyl group, etc.

The above-described sulfonyloxy group bonding to above-described benzenesulfonic acid, etc., singly or together with an alkyl group is preferably a sulfonyloxy group having from 1 to 12 carbon atoms substituted with from 1 to 25 fluorine atoms. Practically, there are a trifluoromethanesulfonyloxy group, a perfluorobutanesulfonyloxy group, a 4-trifluoromethylbenzenesulfonyloxy group, etc.

The above-described sulfonylamino group bonding to above-described benzenesulfonic acid, etc., singly or together with an alkyl group is preferably a sulfonylamino group having from 1 to 12 carbon atoms and substituted with from 1 to 25 fluorine atoms. Practically, there are a trifluoromethanesulfonylamino group, a perfluorobutanesulfonylamino group, a perfluorooctanesulfonylamino group, a pentachlorobenzenesulfonylamino group, etc.

The above-described aryl group bonding to the above-described benzenesulfonic acid, etc., singly or together with an alkyl group is preferably an aryl group having from 6 to 14 carbon atoms and substituted with from 1 to 9 fluorine atoms. Practically, there are a pentafluorophenyl group, a 4-trifluoromethylphenyl group, a heptafluoronaphthyl group, a nonafluoroanthranyl group, a 4-fluorophenyl group, a 2,4-difluorophenyl group, etc.

The above-described aralkyl group bonding to above-described benzenesulfonic acid, etc., singly or together with an alkyl group is preferably an aralkyl group having from 7 to 10 carbon atoms and substituted with from 1 to 15 fluorine atoms. Practically, there are a pentafluorophenylmethyl group, a pentafluorophenylethyl group, a perfluorobenzyl group, a perfluorophenthyl group, etc.

The above-described alkoxycarbonyl group bonding to above-described benzenesulfonic acid, etc., singly or together with an alkyl group is preferably an alkoxycarbonyl group having from 2 to 13 carbon atoms and substituted with from 1 to 25 fluorine atoms. Practically, a trifluoromethoxycarbonyl group, a pentafluoroethoxycarbonyl group, a pentafluorophenoxycarbonyl group, a perfluorobutoxycarbonyl group, a perfluorooctyloxycarbonyl group, etc.

In these anions, the most preferred $X^-$ is fluorine-substituted benzenesulfonic acid anions and in these anions, a pentafluorobenzenesulfonic acid anion is particularly preferred.

Also, above-described benzenesulfonic acid, naphthalenesulfonic acid, or anthracenesulfonic acid may be further substituted with a straight chain, branched, or cyclic alkoxy group, an acyl group, an acyloxy group, a sulfonyl group, a sulfonyloxy group, a sulfonylamino group, an aryl group, an aralkyl group, an alkoxycarbonyl group (the carbon atom number ranges of these groups are same as those of the above-described groups), a halogen group (excluding fluorine), a hydroxyl group, a nitro group, etc.

Then, practical examples of the compounds shown by the formulae (I) to (III) described above are illustrated below but the invention is not limited to these compounds.

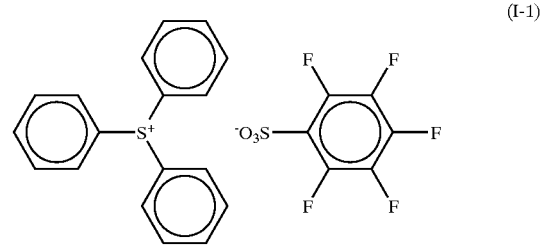

(I-1)

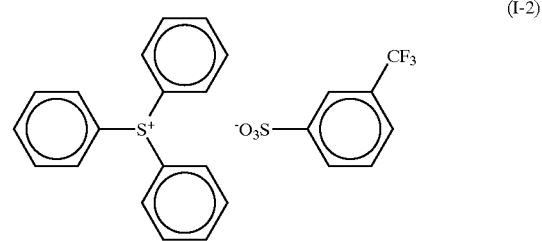

(I-2)

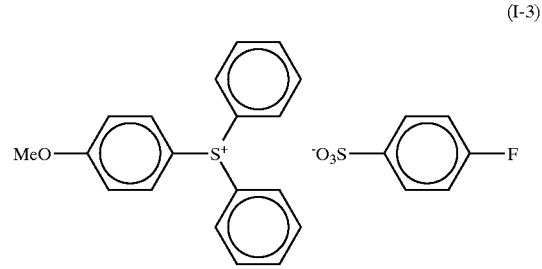

(I-3)

(I-4)
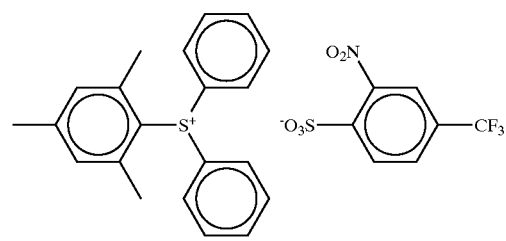
(I-5)
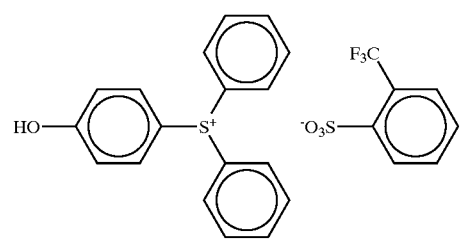
(I-6)
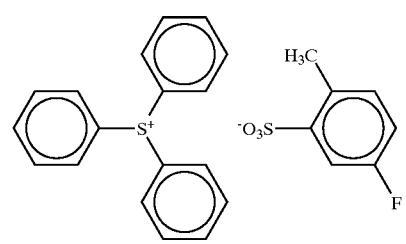
(I-7)
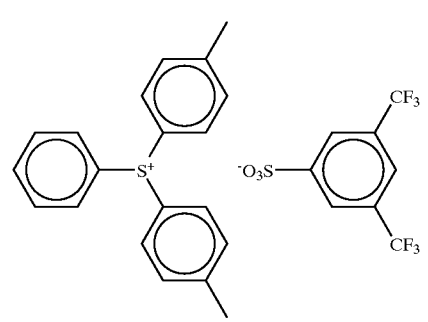
(I-8)
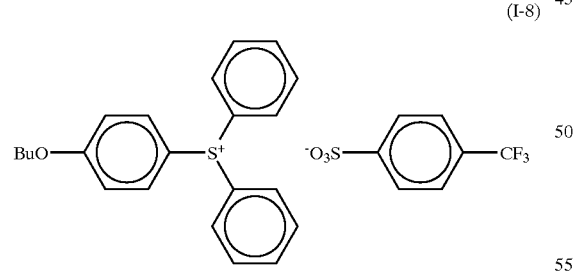
(I-9)
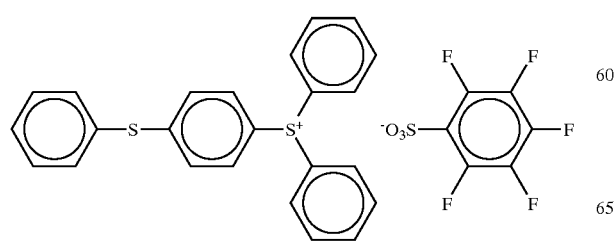
(I-10)
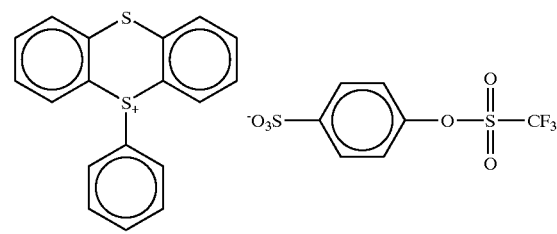
(I-11)
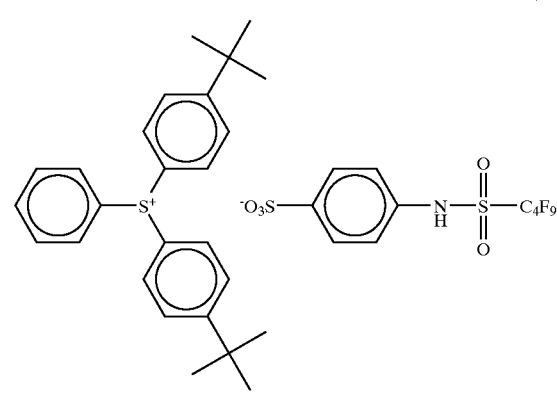
(I-12)
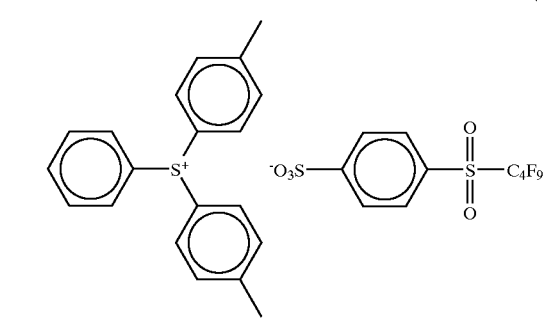
(I-13)
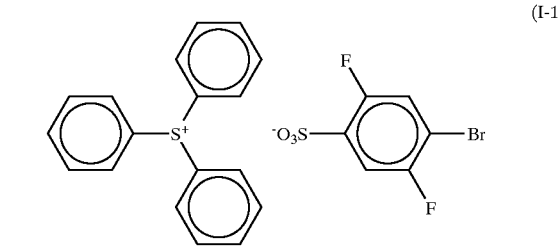
(I-14)
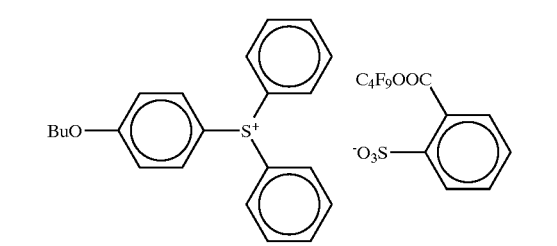

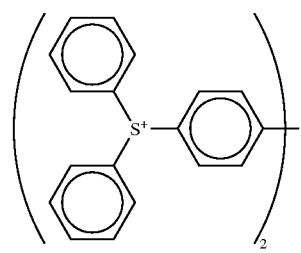 (II-1)
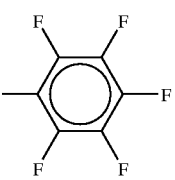
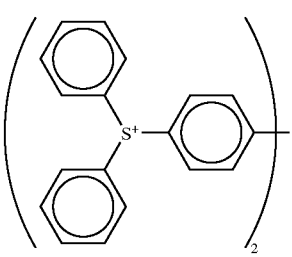 (II-2)
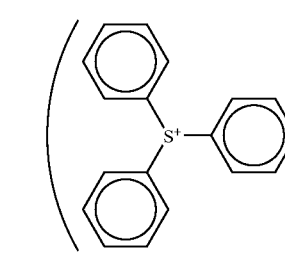 (II-3)
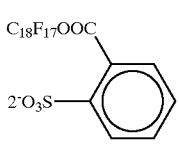
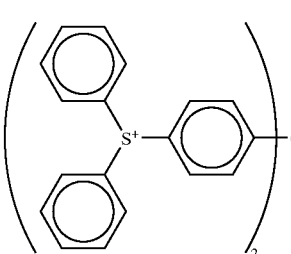 (II-4)
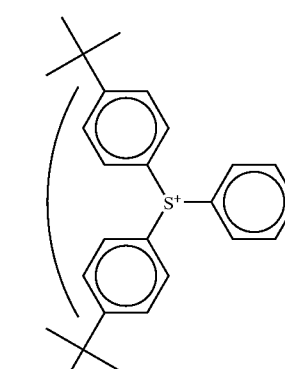 (II-5)
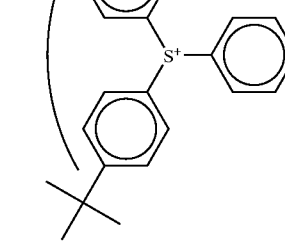
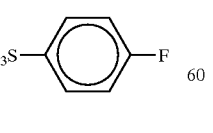
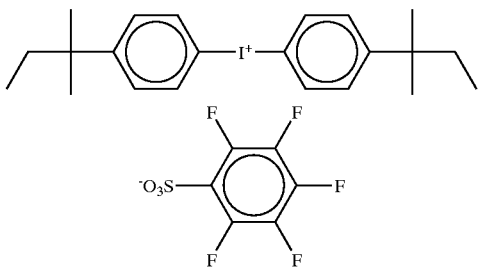 (III-1)
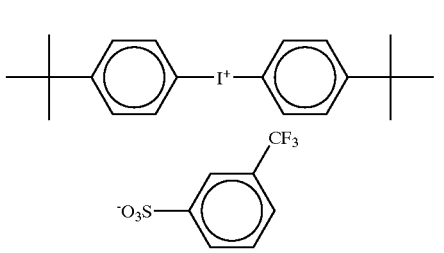 (III-2)
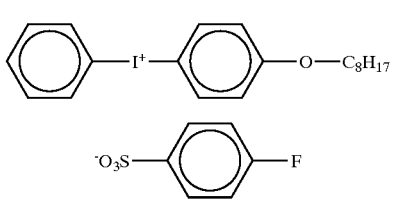 (III-3)
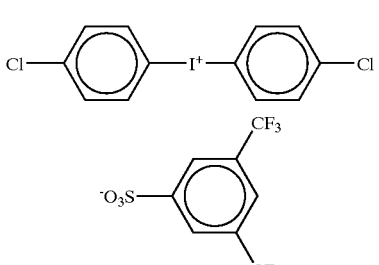 (III-4)
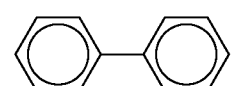 (III-5)
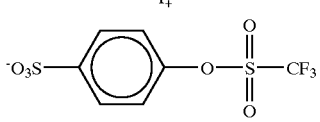
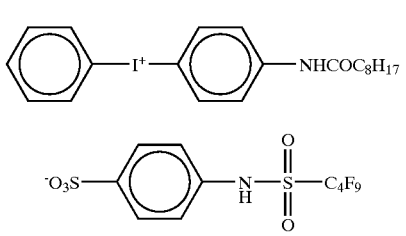 (III-6)

-continued

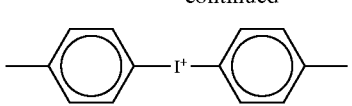
(III-7)

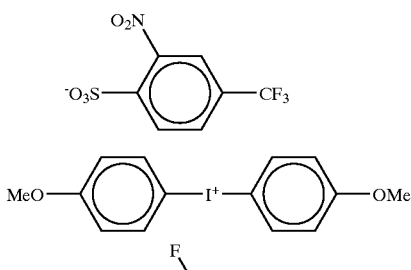
(III-8)

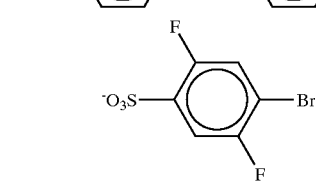

The compounds of the formula (I) and the formula (II) can be synthesized by the following methods. For example, by reacting an aryl Gringnard reagent such as arylmagnesium bromide, etc., and phenyl sulfoxide and triarylsulfonium halide obtained is salt-exchanged with a corresponding sulfonic acid. The compound can be synthesized by other method. For example, there is a method of carrying out a condensation of phenyl sulfoxide and a corresponding aromatic compound using an acid catalyst such as methanesulfonic acid/diphosphorus pentaoxide or aluminum chloride and a salt-exchange. Also, the compound can be synthesized by a method of carrying out a condensation of a diaryliodonium salt and diaryl sulfide using a catalyst such as copper acetate and a salt exchange. In any one of the above-described methods, phenyl sulfoxide may have a substituent at the benzene ring or may not have such a substituent.

The compounds of the formula (III) described above can be synthesized by reacting aromatic compounds using a periodate.

In the invention, in place of or together with the compound shown by the above-described formula (I) to (III), other compound generating an acid and/or radical species by being decomposed by the irradiation of a radiation can be used.

Of the above-described compounds generating an acid and/or radical species by being decomposed by the irradiation of a radiation other than those represented by formulae (I) to (III), particularly effective compounds will be explained below.

(1) Iodonium salts represented by the following general formula (PAG3) or sulfonium salts represented by the following general formula (PAG4):

(PAG3)

$$\begin{array}{c} Ar^1 \\ \diagdown \\ I^\oplus \quad Z^\ominus \\ \diagup \\ Ar^2 \end{array}$$

(PAG4)

$$\begin{array}{c} R^{203} \\ \diagdown \\ R^{204}-S^\oplus \quad Z^\ominus \\ \diagup \\ R^{205} \end{array}$$

wherein $Ar^1$ and $Ar^2$ each independently represents a substituted or unsubstituted aryl group. Preferred examples of the substituents include alkyl, haloalkyl, cycloalkyl, aryl, alkoxyl, nitro, carboxyl, alkoxycarbonyl, hydroxyl, mercapto and halogen atoms.

$R^{203}$, $R^{204}$ and $R^{205}$ each independently represents a substituted or unsubstituted alkyl or aryl group, and preferably an aryl group having from 6 to 14 carbon atoms, an alkyl group having from 1 to 8 carbon atoms or a substituted derivative thereof. Preferred examples of the substituents for aryl include alkoxyl of from 1 to 8 carbon atoms, alkyl of from 1 to 8 carbon atoms, cycloalkyl, nitro, carboxyl, mercapto, hydroxyl and halogen atoms, and preferred examples thereof for alkyl include alkoxyl of from 1 to 8 carbon atoms, carboxyl and alkoxycarbonyl.

$Z^-$ represents an anion. Specific examples of the anions include substituted or unsubstituted alkylsulfonic acids, cycloalkylsulfonic acids, perfluoroalkylslufonic acids and arylslufonic acids (for example, substituted or unsubstituted benzenesulfonic acid, naphthalenesulfonic acid and anthrazenesulfonic acid).

Two of $R^{203}$, $R^{204}$ and $R^{205}$, $Ar^1$ and $Ar^2$ may each combine together through each single bond or substituent.

Specific examples thereof include but are not limited to the following compounds:

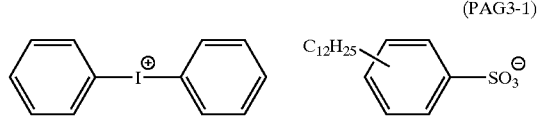
(PAG3-1)

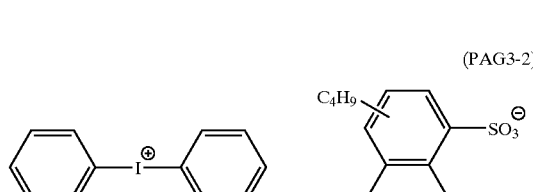
(PAG3-2)

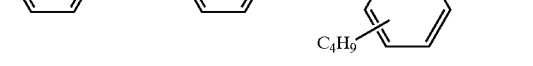
(PAG3-3)

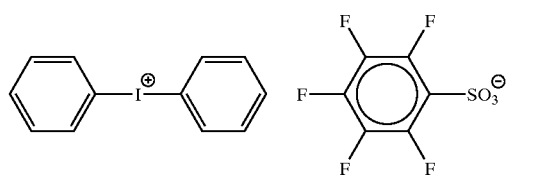
(PAG3-4)

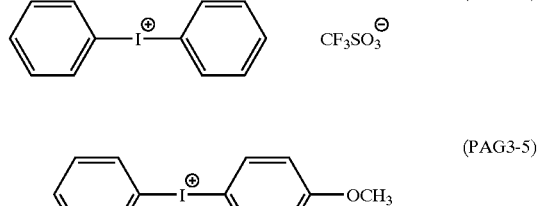
(PAG3-5)

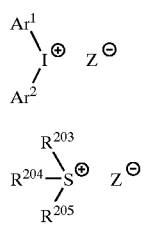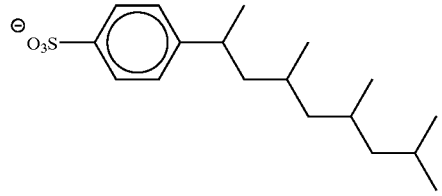

-continued (PAG3-6)
(PAG3-7)
(PAG3-8)
(PAG3-9)
(PAG3-10)
(PAG3-11)
(PAG3-12)
(PAG3-13)
(PAG3-14)
(PAG3-15)
(PAG3-16)
(PAG3-17)
(PAG3-18)

-continued
(PAG3-19)
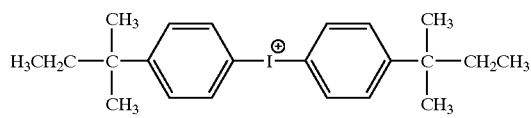
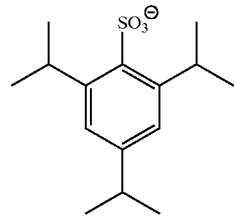
(PAG3-20)
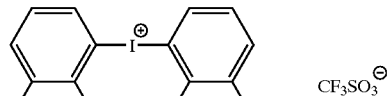
(PAG3-21)
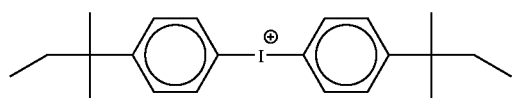
(PAG4-1)
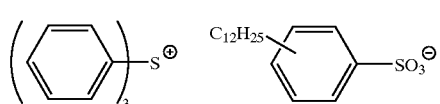
(PAG4-2)
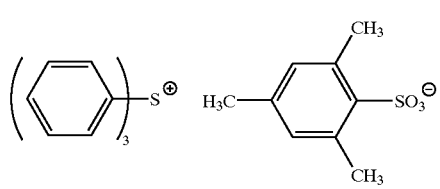
(PAG4-3)
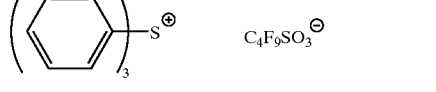
(PAG4-4)
(PAG4-5)
(PAG4-6)
-continued
(PAG4-8)
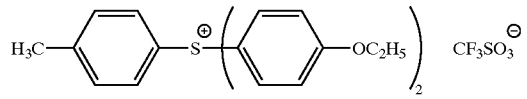
(PAG4-9)
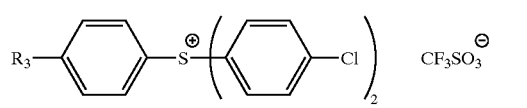
(PAG4-10)
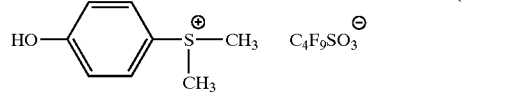
(PAG4-11)
(PAG4-12)
(PAG4-13)
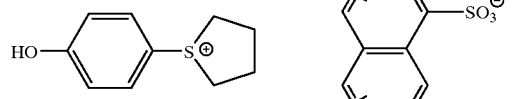
(PAG4-14)
(PAG4-15)
(PAG4-16)
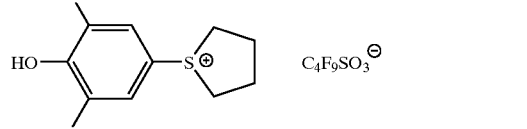

-continued
(PAG4-17)
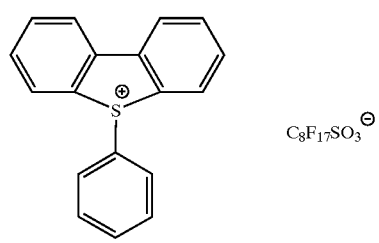
(PAG4-18)
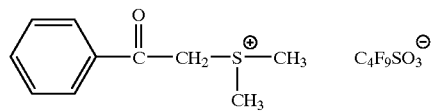
(PAG4-19)
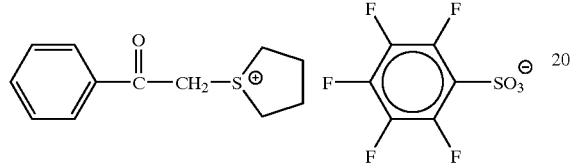
(PAG4-20)
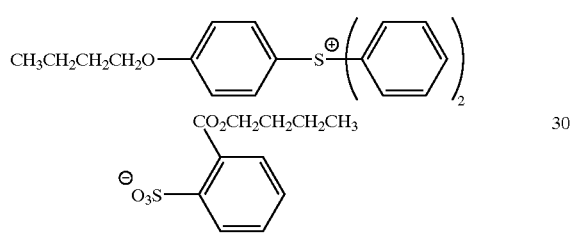
(PAG4-21)
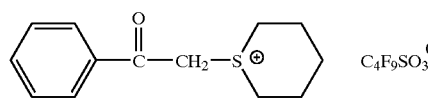
(PAG4-22)
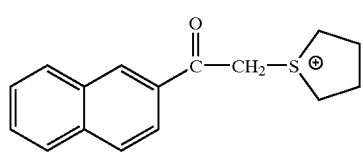
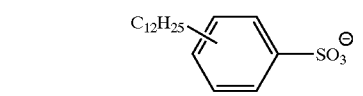
(PAG4-23)
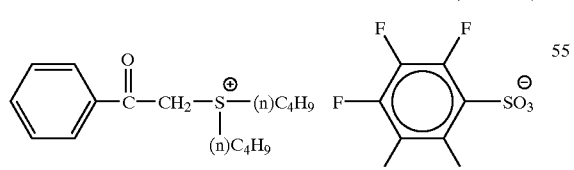
(PAG4-24)
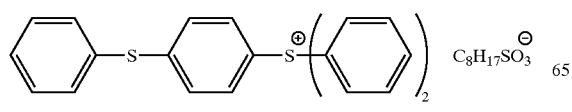
-continued
(PAG4-25)
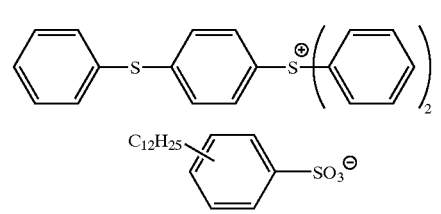
(PAG4-26)
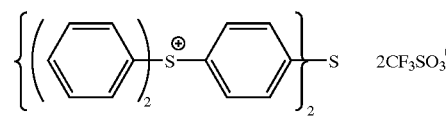
(PAG4-27)
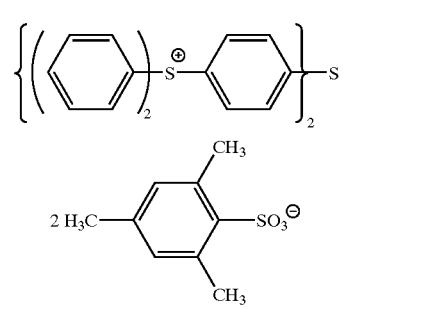
(PAG4-28)
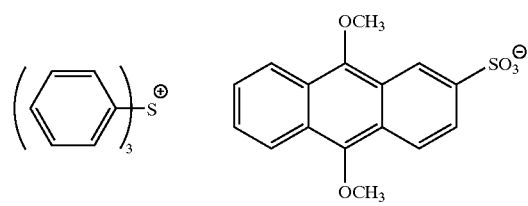
(PAG4-29)
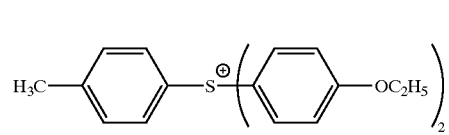
(PAG4-30)
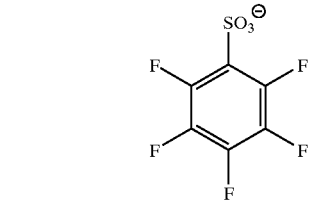
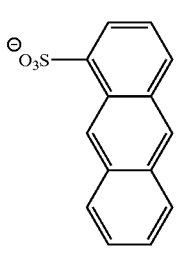

(PAG4-31)

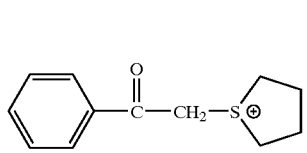

(PAG4-32)

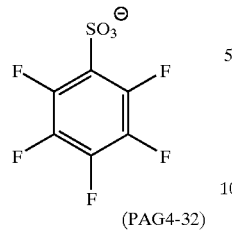

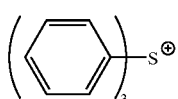

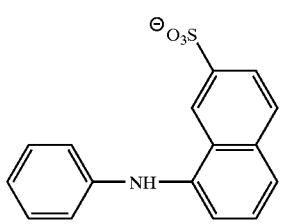

The above-mentioned onium salts represented by general formulas (PAG3) and (PAG4) are known, and can be synthesized, for example, by methods described in J. W. Knapozyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polymer Chem. Ed.*, 18, 2677 (1980), U.S. Pat. Nos. 2,807,648 and 4,247,473, and JP-A-53-101331.

(2) Disulfone derivatives represented by the following general formula (PAG5) or iminosulfonate derivatives represented by the following general formula (PAG6):

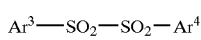 (PAG5)

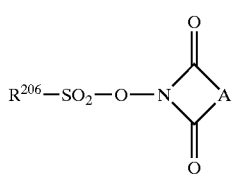 (PAG6)

wherein $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene or arylene group.

Specific examples thereof include but are not limited to the following compounds:

(PAG5-1)

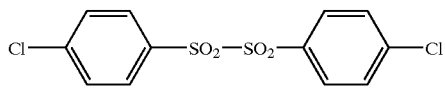

(PAG5-2)

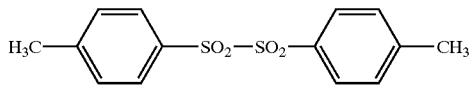

(PAG5-3)

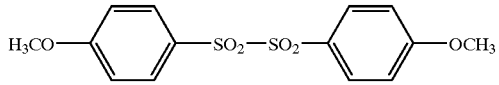

(PAG5-4)

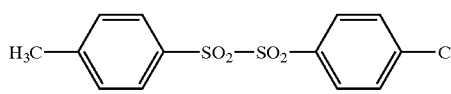

(PAG5-5)

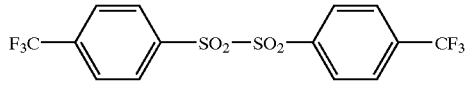

(PAG5-6)

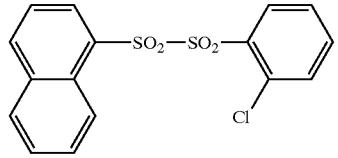

(PAG5-7)

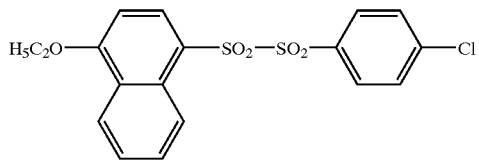

(PAG5-8)

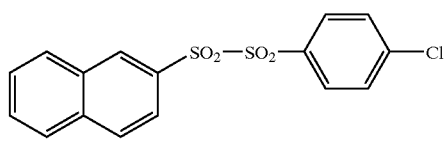

(PAG5-9)

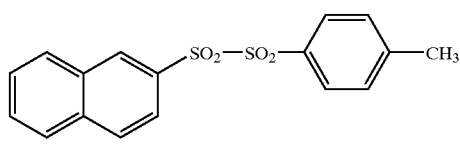

(PAG5-10)

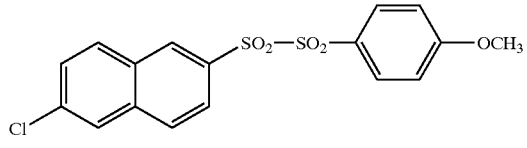

(PAG5-11)

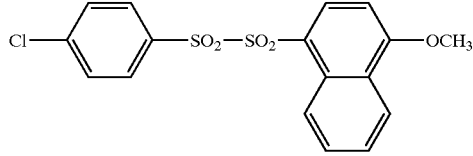

(PAG5-12)

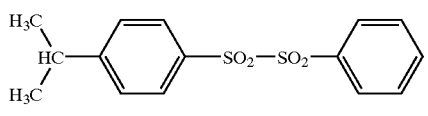

(PAG5-13)

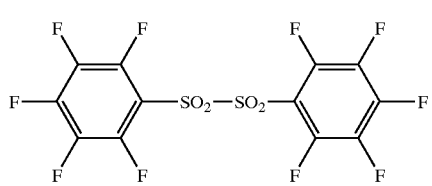

(PAG5-14)
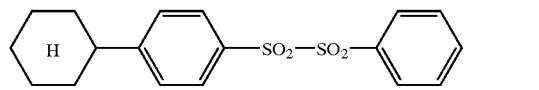
(PAG5-15)
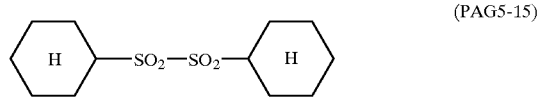
(PAG5-16)
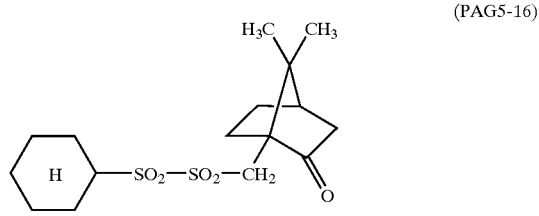
(PAG5-17)
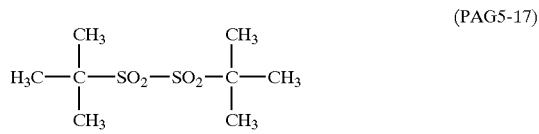
(PAG5-18)
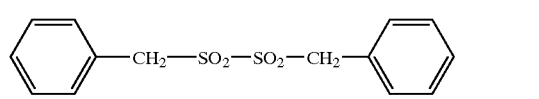
(PAG6-1)
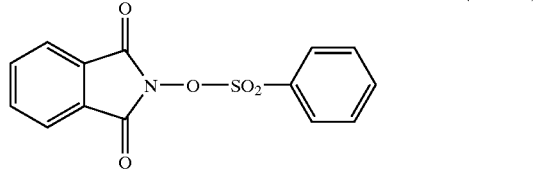
(PAG6-2)
(PAG6-3)
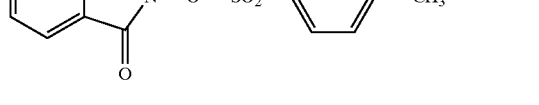
(PAG6-4)
(PAG6-5)
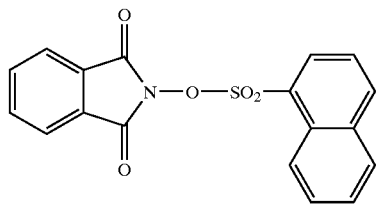
(PAG6-6)
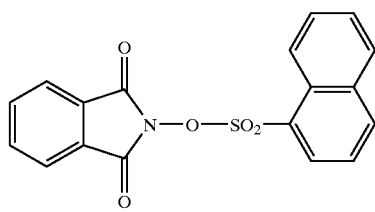
(PAG6-7)
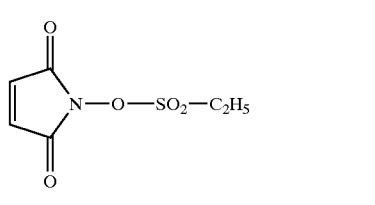
(PAG6-8)
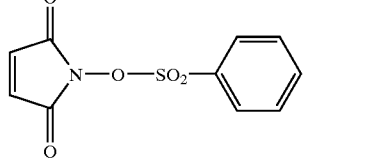
(PAG6-9)
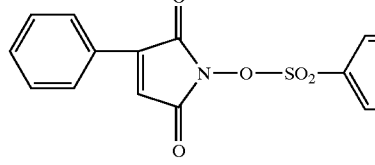
(PAG6-10)
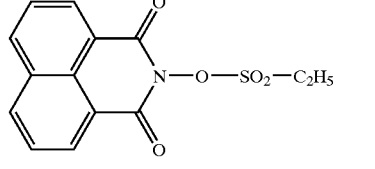
(PAG6-11)
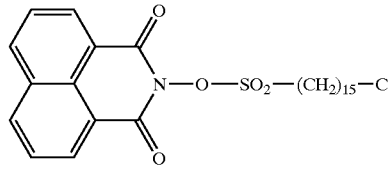
(PAG6-12)
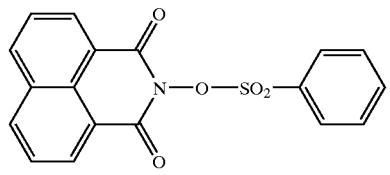

-continued (PAG6-13) 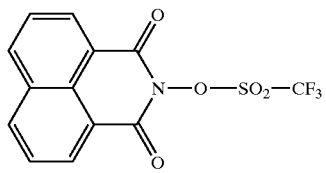

(PAG6-14) 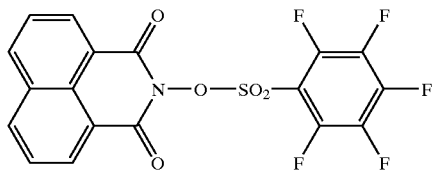

(PAG6-15) 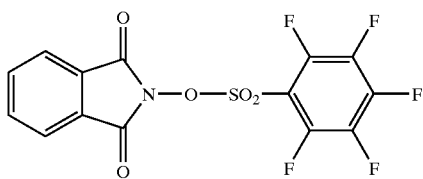

(PAG6-16) 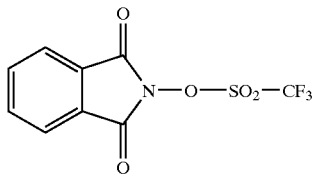

(PAG6-17) 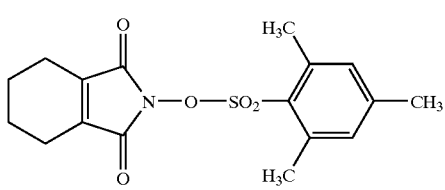

(PAG6-18) 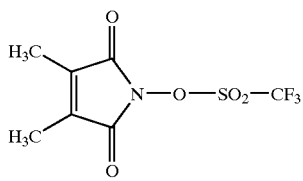

(PAG6-19) 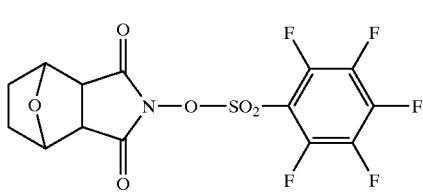

(PAG6-20) 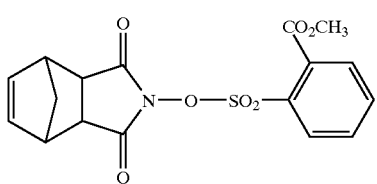

(3) Diazodisulfone derivatives represented by the following general formula (PAG7):

(PAG7)

wherein R represents a straight-chain, branched or cyclic alkyl group, or an aryl group which may be substituted.

Specific examples thereof include but are not limited to the following compounds:

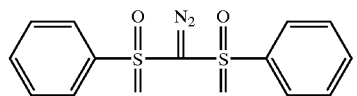
(PAG7-1)

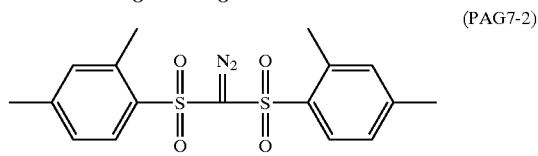
(PAG7-2)

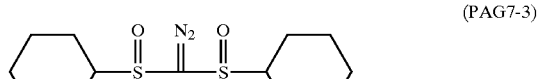
(PAG7-3)

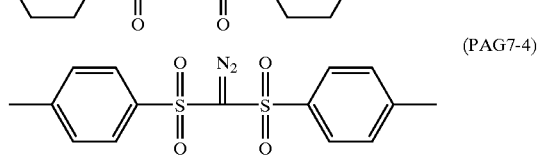
(PAG7-4)

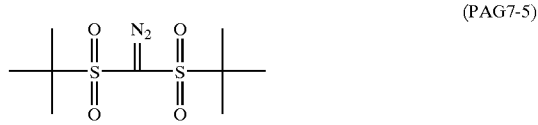
(PAG7-5)

In the case of using other compound generating an acid and/or radical species by being decomposed by the irradiation of a radiation together with the compound shown by the formula (I) to (III), the ratio of other compound generating an acid and/or radical species by being decomposed by the irradiation of a radiation is from 100/0 to 20/80, preferably from 90/10 to 40/60, and more preferably from 80/20 to 50/50 by mol ratio.

The content of the component (A) used in the invention is properly from 0.1 to 20% by weight, preferably from 0.5 to 10% by weight, and more preferably from 1 to 7% by weight to the whole solid components of the negative-working resist composition of the invention.

(4) Acid crosslinking agent (C) in the invention:

In the present invention, together with the alkali-soluble resin and an acid and/or radical generator, a compound causing crosslinking with an acid (hereinafter, is referred to as properly acid crosslinking agent or simply crosslinking agent) is used. In the invention, a known acid crosslinking agent can be effectively used.

Preferably, there are compounds or resins having at least two of a hydroxymethyl group, an alkoxymethyl group, an acryloxymethyl group, and an alkoxymethyl ether group, or epoxy compounds.

More preferably, there are alkoxymethylated or acyloxymethylated melamine compounds or resins, alkoxymethylated or acyloxymethylated urea compounds or resins, hydroxymethylated or alkoxymethylated phenol compounds or resins, and alkoxymethyl etherified phenol compounds and resins.

Practically, as the crosslinking agent, phenol derivatives can be used. Preferably, there are phenol derivatives each having a molecular eight of not more than 1200, containing from 3 to 5 benzene rings in the molecule, furthermore having at least two groups of a hydroxymethyl group and an alkoxymethyl group together, and bonding the hydroxymethyl group and the alkoxymethyl group concentrated in at least one of the benzene rings or distributed in the benzene rings. By using such a phenol derivative, the effects of the invention can be more remarkably obtained.

As the alkoxymethyl group bonding to the benzene ring, an alkoxymethyl group having not more than 6 carbon atoms is preferred. Practically, there are, preferably, methoxymethyl, ethoxymethyl, n-propoxymethyl, i-propoxymethyl, n-butoxymethyl, i-butoxymethyl, sec-butoxymethyl, and tert-butoxymethyl. Furthermore, an alkoxy-substituted alkoxy group such as 2-methoxyethoxy and 2-methoxy-1-propyl is also preferred.

In these phenol derivatives, the particularly preferred phenol derivatives are shown below.

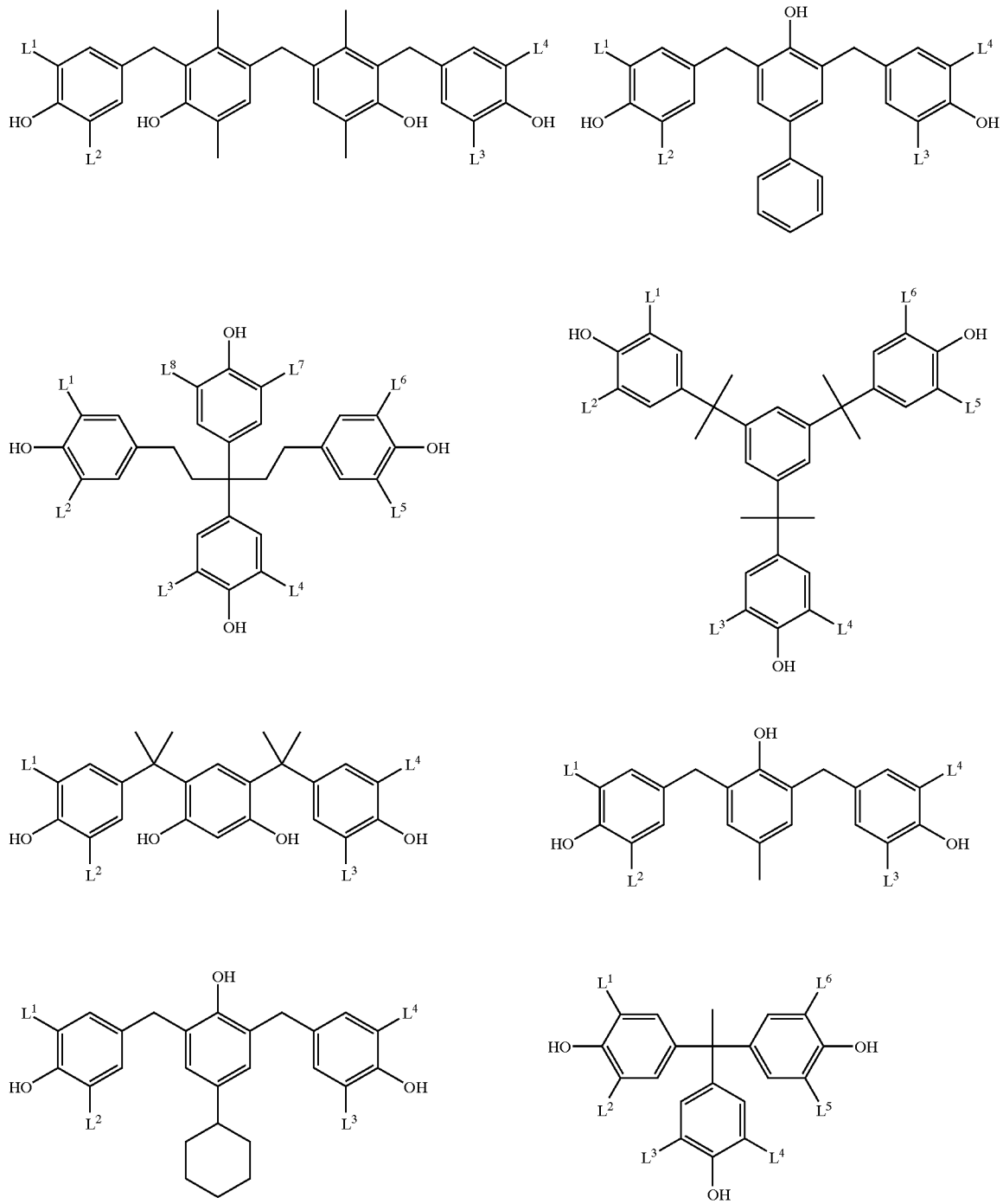

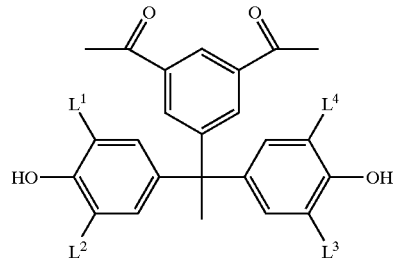
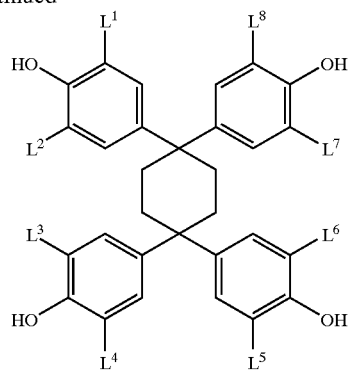
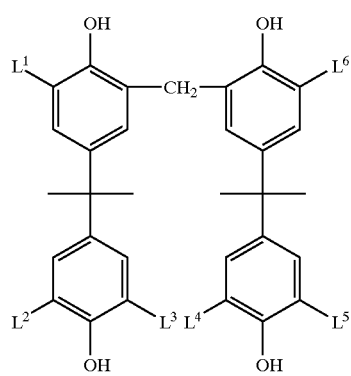
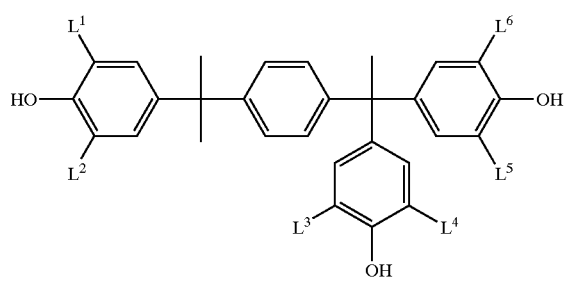
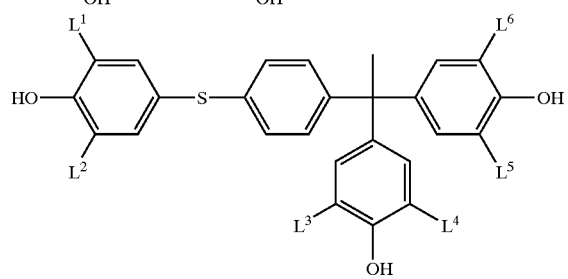
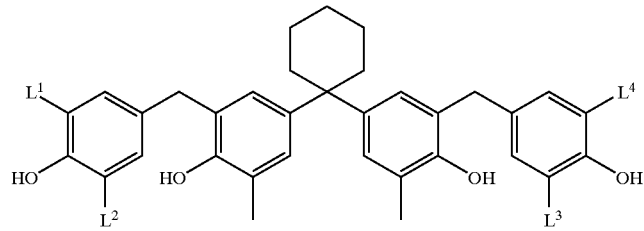
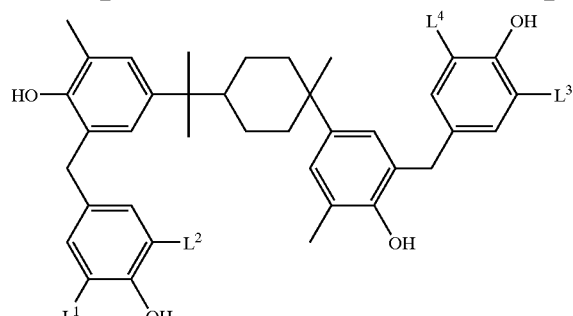
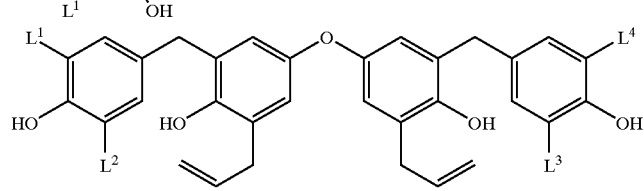

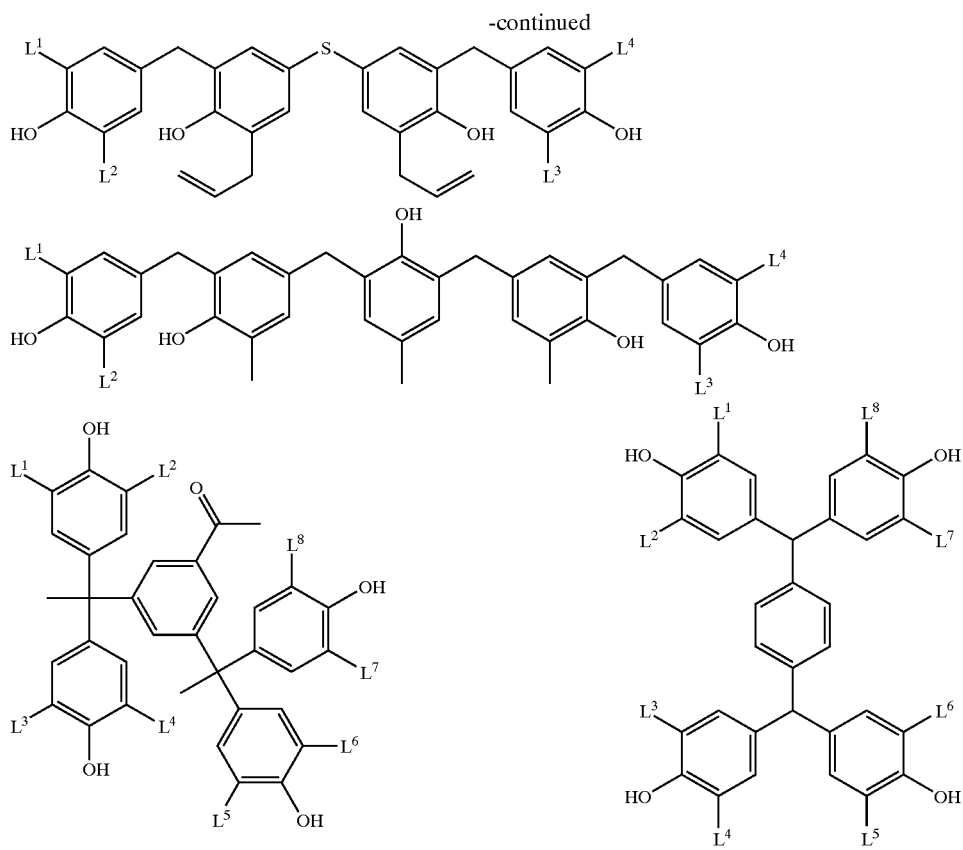

(In the above-described formulae, $L^1$ to $L^8$, which may be the same or different, each represents a hydroxymethyl group, a methoxymethyl group, or an ethoxymethyl group.)

The phenol derivative having a hydroxymethyl group can be obtained by reacting the corresponding phenol compound without having a hydroxymethyl group (the compound wherein each of $L^1$ to $L^8$ is a hydrogen atom) and formaldehyde in the presence of a basic catalyst. In this case, to prevent the formation of resin or the occurrence of gelation, it is preferred to carry out the reaction at a temperature of not higher than 60° C. Practically, the phenol derivatives can be synthesized by the methods described in JP-A-6-282067, JP-A-7-64285, etc.

The phenol derivative having an alkoxymethyl group can be obtained by reacting a corresponding phenol derivative having a hydroxymethyl group and an alcohol in the presence of an acid catalyst. In this case, to prevent the formation of resin or the occurrence of gelation, it is preferred to carry out the reaction at a temperature of not higher than 100° C. Practically, the phenol derivatives can be synthesized by the methods described in European Patent (EP) 632003A1, etc.

The phenol derivatives each having a hydroxymethyl group or an alkoxymethyl group synthesized as described above are preferred in the point of the storage stability, and the phenol derivatives each having an alkoxymethyl group are particularly preferred from the view point of the storage stability.

The phenol derivatives having at least two groups of a hydroxymethyl group and an alkoxymethyl group together, and bonding the hydroxymethyl group and the alkoxymethyl group concentrated in at least one of the benzene rings or distributed in the benzene rings may be used singly or as a combination of two or more kinds thereof.

As other crosslinking agents than the above-described phenol derivatives, the compounds of following (i) and (ii) can be also used as the crosslinking agent.

(i) Compounds each having an N-hydroxymethyl group, an N-alkoxymethyl group, or an N-acyloxymethyl group.

(ii) Epoxy compounds.

The addition amount of the crosslinking agent used is from 3 to 65% by weight, and preferably from 5 to 50% by weight to the whole solid components of the resist composition of the invention. When the addition amount of the crosslinking agent is less than 3% by weight, the film remaining ratio of the resist is lowered, and also when the addition amount exceeds 65% by weight, the resolving power is lowered and further, it is undesirable in the point of the storage stability of the resist liquid.

In the present invention, in addition to the above-described phenol derivative(s), for example, the crosslinking agent (i) or (ii) described above can be used together.

The ratio of the other crosslinking agent which can be used together with the above-described phenol derivative is from 100/0 to 20/80, preferably 90/10 to 40/60, and more preferably from 80/20 to 50/50 by mol ratio.

These crosslinking agents are described in more detail below.

(i) The compounds each having an N-hydroxymethyl group, an N-alkoxymethyl group, or an N-acyloxymethyl group include the monomers, the oligomer-melamine-formaldehyde condensation products, and urea-formaldehyde condensation products disclosed in European Patent unexamined publication (hereinafter, is referred to as "EP-A") No. 0,133,216, West German Patents 3,634,671 and 3,711,264; and the alkoxy-substituted compounds disclosed in EP-A No. 0,212,483; and the benzoguanamineformaldehyde condensation products disclosed in JP-A-8-109314, etc.

As more preferred examples, there are melamine-formaldehyde derivatives each having at least two free N-hydroxymethyl groups, N-alkoxymethyl groups, or N-acryloxymethyl groups and in these derivatives, the N-alkoxymethyl derivatives are particularly preferred.

(ii) As the epoxy compounds, there are monomer, dimer, oligomer, or polymer form epoxy compounds each containing at least one epoxy group. For example, there are a reaction product of bisphenol A and epichlorohydrin, a reaction product of a low-molecular weight phenol-formaldehyde resin and epichlorohydrin, etc. As other compounds, there are the epoxy resins disclosed in U.S. Pat. No. 4,026,705 and British Patent 1,539,192.

(5) Compound (D) having unsaturated bond polymerizable by an acid and/or radical in the invention:

For the compound (D) having an unsaturated bond capable of being polymerized by an acid and/or a radical generated from the compound (A) in the invention, known monomers each having a polymerizing group can be used without particular restriction.

Practical examples of these monomers include monofunctional acrylic acid esters and the derivatives thereof, such as 2-ethylhexyl acrylate, 2-hydroxyethyl acrylate, 2-hydroxypropyl acrylate, etc.; and the compounds of changing the acrylate to a methacrylate, an itaconate, a crotonate, a maleate, etc.;

Bifunctional acrylic acid esters and the derivatives thereof, such as polyethylene glycol diacrylate, pentaerythritol diacrylate, bisphenol A diacrylate, the diacrylate of the ε-caprolacton addition product of hydrxypivalic acid neopentyl glycol, or the compounds of changing the acrylate to a methacrylate, an itaconate, a crotonate, a maleate, etc.; and multifunctional acrylic acid esters and the derivatives thereof, such as trimethylolpropane tri(meth)acrylate, dipentaerythritol pentaacrylate, dipentaerythritol hexaacrylate, pyrogallol triacrylate, etc., or the compounds of changing the acrylate to a methacrylate, an itaconate, a crotonate, a maleate, etc.

Also, a so-called prepolymer provided with a photopolymerizability obtained by introducing acrylic acid or methacrylic acid into an oligomer having a proper molecular weight can be suitably used.

As other monomers, the compounds described in JP-A-58-212994, JP-A-61-6649, JP-A-62-46688, JP-A-62-48589, JP-A-62-173295, JP-A-62-187092, JP-A-63-67189, JP-A-1-244891, etc., can be used, and further, the compounds described in "Kagaku Shohin (Chemical goods) of 11290", pages 286 to 294, published by Kagaku Kogyo Nippo Sha, and "UV•EB Curing Handbook (Raw Material Chapter)", pages 11 to 65, published by Kobunshi Kanko Kai can be suitably used.

In these compounds, the compounds having at least two acrylic groups or methacrylic groups in the molecule are preferred in the invention, and further, the compounds having a molecular weight of not more than 10,000, and preferably not more than 5,000 are desirable. In the invention, as the polymerizing compound, in the monomers and prepolymers each having the polymerizing group including the compounds illustrated above can be used singly or as a combination of two or more kinds if there is no problem in the compatibility and the affinity.

The addition amount of the compound having an unsaturated group is from 2 to 50% by weight, preferably from 5 to 40% by weight, and more preferably from 10 to 30% by weight to the whole solid components of the resist composition of the invention.

(6) Other components used for the composition of the invention:

The negative-working resist composition of the invention can, if necessary, further contain a radical generator, an organic basic compound, a dye, a surface active agent, etc.

(6)-1 Dye:

As suitable dyes, there are oily dyes and basic dyes. Practically, there are Oil Yellow #101, Oil Yellow #103, Oil Pink #312, Oil Green BG, Oil Blue BOS, Oil Blue #603, Oil Black BY, Oil Black BS, Oil Black T-505 (all dyes described above manufactured by Orient Kagaku Kogyo K.K.), Crystal Violet (CI 42555), Methyl Violet (CI 42535), Rhodamine B (CI 45170B), Malachite Green (CI 42000), Methylene Glue (CI 52015), etc.

(6)-2 Organic basic compound:

The preferred organic basic compounds which can be used in the invention are compounds having a stronger basic property then phenol and in these compounds, nitrogen-containing basic compounds are preferred.

As the preferred chemical environment, there are the structures of following formulae (A) to (E):

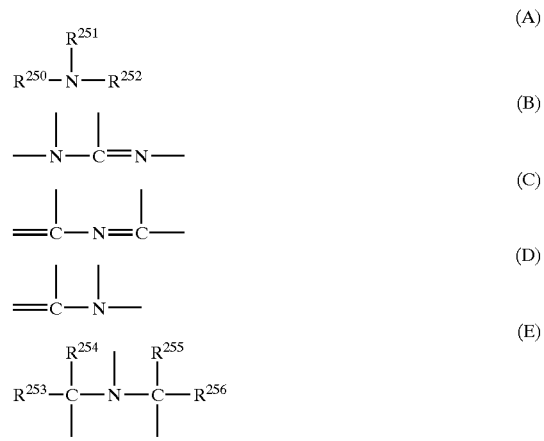

wherein $R^{250}$, $R^{251}$, and $R^{253}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms; $R^{251}$ and $R^{252}$ may combine with each other to form a ring; and $R^{253}$, $R^{254}$, $R^{255}$, and $R^{256}$, which may be the same or different, each represents an alkyl group having from 1 to 6 carbon atoms.

The more preferable compounds are nitrogen-containing basic compounds each having at least two nitrogen atoms of different chemical environments, and the particularly preferable compound is a compound containing both the substituted or unsubstituted amino group and the ring structure containing a nitrogen atom, or a compound containing an alkylamine group.

Preferred practical examples include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, a substituted or unsubstituted aminoalkylmorpholine, etc. The preferred substituents are an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

The particularly preferable compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the invention is not limited to these compounds.

These nitrogen-containing basic compounds are used singly or as a combination o two or more kinds thereof.

It is preferred that the using ratio of the acid generator and the organic basic compound in the resin composition of the invention is (acid generator)/(organic basic compound)=2.5 to 300 by mol ratio. When the mol ratio is less than 2.5, the senstivity is lowered and the resolving power is sometimes lowered. Also, when the mol ratio exceeds 300, the thickness of the resist patterns becomes large with the passage of time after the light exposure to the heat treatment, and the resolving power is sometimes lowered. The ratio of (acid generator)/(organic basic compound) is preferably from 5.0 to 200, and more preferably from 7.0 to 150 by mol ratio.

(6)-3 Radical generator:

The negative-working resist composition of the invention can, if necessary, use a radical generator for accelerating the reaction of the polymerizing compound (D). As the radical generator, known radical polymerization initiators generally used for a polymer synthetic reaction by a radical polymerization can be used without particular restriction. Examples of the radical generator include azobisnitrile-base compounds such as 2,2'-azobis-isobutyronitrile, 2,2'-azobispropionitrile, etc.; organic peroxides such as benzoyl peroxide, lauroyl peroxide, acetyl peroxide, tert-butyl perbenzoate, α-cumylhydro peroxide, di-tert-butyl peroxide, diisopropyl peroxy dicarbonate, tert-butylperoxyisopropyl carbonate, peracids, alkylperoxy carbamates, nitrosoarylacylamines, etc.; inorganic peroxides such as potassium persulfate, ammonium persulfate, potassium perchlorate, etc.; azo- or diazo-base compounds such as diazoaminobenzene, p-nitrobenzene diazonium, azobis-substituted alkanes, doazothioethers, arylazosulfones, etc.; nitrosophenylurea; tetraalkylthiuram disulfides such as tetramethylthiuram disulfide, etc.; diaryl disulfides such as dibenzyl disulfide, etc.; dialkyl xanthic acid disulfides, arylsulfinic acids, arylalkylsulfones, 1-alkanesulfinic acids, etc.

The activation energy of the radical generator for radical generation is preferably at least 30 Kcal/mol, and as such a radical generator, there are azobisnitrile-base compounds and organic peroxides. In these compounds, the compound which is excellent in the stability at normal temperature, shows a high decomposition rate at heating, and becomes colorless at decomposition is preferred, and such a compound, there are benzoyl peroxide, 2,2'-azobisisobutyronitrile, etc.

The above-described radical generators may be used singly or as a combination of two or more kinds of them, and the using amount thereof is from about 0.5 to 30% by weight, and preferably from 2 to 10% by weight to the whole solid components of the radical polymerization layer.

(6)-4 Solvents:

The resist composition of the invention is dissolved in a solvent dissolving the components described above and coated on a support. The preferable solvent used in the case includes ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, tetrahydrofuran, etc. These solvents are used singly or as a mixture of them.

(6)-5 Surface active agent:

A surface active agent can be added to the above-described solvent(s). Practically, the surface active agents used in the invention include nonionic surface active agents, for example, polyoxyethylene alkyl ethers such as polyoxyethylene lauryl ether, polyoxyethylene stearyl ether, polyoxyethylene cetyl ether, polyoxyethylene oleyl ether, etc.; polyoxyethylene alkylaryl ethers such as polyoxyethylene octylphenol ether, polyoxyethylene nonylphenol ether, etc.; polyoxyethylene•polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate, etc.; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine-base surface active agents such as Eftop EF 301, EF 303 and EF 352 (manufactured by Shin Akita Kasei K. K.), Megafac F171 and F173 (manufactured by DAINIPPON INK & CHEMICALS, INC.), Florad FC430, and FC431 (manufactured by SUMITOMO 3M LIMITED), Asahiguard AG710, Surflon S-382, SC101, SC102, SC103, SC104, SC105, and SC106 (manufactured by Asahi Glass Company Ltc.), Troysol S-366 (manufactured by Troy Chemical Corporation), etc.; Organosiloxane polymer KP341 (manufactured by Shin-Etsu Chemical Co., Ltd.), acrylic acid-base or methacrylic acid-base (co)polymerized Polyflow No. 75 and No. 95 (manufactured by Kyoeisha Yushi Kagaku Kogyo K. K.), etc.

The compounding amount of the surface active agent is usually not more than 2 parts by weight, and preferably not more than 1 part by weight per 100 parts by weight of the solid components of the resist composition of the invention.

These surface active agents may be used singly or as a combination of two or more kinds of them.

In the pattern formation process on a resist film in the production, etc., of a precise integrated circuit element, the negative-working photoresist composition of the invention is coated on a substrate (e.g., silicon/silicon dioxide film, and a transparent substrate such as a glass substrate, an ITO substrate, etc.), the coated layer is irradiated using electron beam (under the condition of an accelerating voltage of at least 75 KeV) or X-ray imaging apparatus, and by heating, developing, rinsing, and drying, a good resist pattern can be formed.

As the developer for the negative-working photoresist composition of the invention, an aqueous solution of an alkali, for example, inorganic alkalis such as sodium hydroxide, potassium hydroxide, sodium carbonate, sodium silicate, sodium metasilicate, aqueous ammonia, etc.; primary amines such as ethylamine, n-propylamine, etc.; secondary amines such as diethylamine, di-n-butylamine, etc.; tertiary amines such as triethylamine, methyldiethylamine, etc.; alcoholamines such as dimethylethanolamine, triethanolamine, etc.; quaternary ammonium salts such as tetramethylammonium hydroxide, tetraethylammonium hydroxide, choline, etc.; cyclic amines such as pyrrole, piperidine, etc., can be used. Furthermore, proper amounts of an alcohol such as isopropyl alcohol, etc., and a surface active agent such as nonionic surface active agent, etc., can be used to the aqueous solution of the above-described alkali.

In these developers, quaternary ammonium salts are preferred and tetramethylammonium hydroxide and choline are more preferred.

Then, the present invention is explained in more detail by the following examples but the contents of the invention are not limited by the inventions.

1. SYNTHESIS EXAMPLE OF CONSTITUTING MATERIALS

SYNTHESIS EXAMPLE 1 [SYNTHESIS OF RESIN A-(29)]

In 30 ml of 1-methoxy-2-propanol were dissolved 3.9 g (0.024 mol) of 4-acetoxystyrene and 0.8 g (0.006 mol) of 4-methoxystyrene, and while stirring the mixture under a nitrogen gas stream, 70 ml of a 1-methoxy-2-propanol solution of 50 mg of a polymerization initiator, 2,2'-azobis(2,4-dimethylvaleronitrile) (trade name, V-65, manufactured by Wako Pure Chemical Industries, Let.), 9.1 g (0.0056 mol) of 4-acetoxystyrene, and 1.9 g (0.014 mol) of 4-methoxystyrene was added dropwise to the solution at 70° C. over a period of 2 hours. After 2 hours since then, 50 mg of the initiator was additionally added thereto and the reaction was further carried out for 2 hours. Thereafter, the temperature was raised to 90° C. and the reaction mixture was stirred for one hour. After allowing to cool the reaction liquid, by adding the reaction liquid to 1 liter of ion-exchanged water with stirring vigorously, a white resin was precipitated. The resin precipitated was collected followed by drying, dissolved in 100 ml of methanol, 25% tetramethylammonium hydroxide was added to the solution, and after hydrolyzing the acetoxy group in the resin, the solution was neutralized with an aqueous solution of hydrochloric acid to precipitate a white resin. The resin was washed with ion-exchanged water and dried under a reduced pressure to obtain 11.6 g of the resin a-(29) in the invention. When the molecular weight of the resin was measured by GPC, the weight average molecular weight (Mw: polystyrene conversion) was 9,200 and the dispersion degree (Mw/Mn) was 2.2.

SYNTHETIC EXAMPLE 2 [SYNTHESIS OF RESIN A-(39)]

In 100 ml of acetone was dissolved 12.0 g of poly(4-hydroxystyrene) (Mw=10,500, Mw/Mn=1.2), 2.0 g of pyridine was added and then 1.3 g of acetic anhydride was added to the solution, and the reaction was carried out at 50° C. with stirring for 3 hours. By adding the reaction liquid to 1 liter of ion-exchange water with stirring vigorously, a white resin was precipitated. By drying the resin obtained under a reduced pressure, 12.2 g of the resin a-(39) in the invention was obtained. When the molecular weight of the resin was measured by GPC, the weight average molecular weight (Mw: polystyrene conversion) was 11,400 and the dispersion degree (Mw/Mn) was 1.2. Also, when the composition ratio was measured by NMR, x/y (4-hydroxystyrene/4-acetoxystyrene) was 88/12.

SYNTHESIS EXAMPLE 3 [SYNTHESIS OF RESIN A-(91)]

In 30 ml of 1-methoxy-2-propanol were dissolved 3.8 g (0.015 mol) of 2-[(4'-hydroxyphenyl)carbonyloxy]ethyl methacrylate, 1.0 g (0.009 mol) of 2-hydroxyethyl acrylate, and 0.3 g (0.006 mol) of acrylonitrile, and while stirring under a nitrogen gas stream, 70 ml of a 1-methoxy-2-propanol solution of 50 mg of a polymerization initiator, 2,2'-azobis(2,4-dimethylvaleronitrile) (trade name, V-65, manufactured by Wako Pure Chemical Industries, Ltd.), 8.8 g (0.035 mol) of 2-[(4'-hydroxyphenyl)carbonyloxy]ethyl methacrylate, 2.4 g (0.021 mol) of 2-hydroxyethyl acrylate, and 0.7 g (0.014 mol) of acrylonitrile was added dropwise to he solution at 70° C. over a period of 2 hours. After 2 hours, 50 mg of the initiator was additionally added and the reaction was further carried out for 2 hours. Thereafter, the temperature was raised to 90° C., and the reaction mixture was stirred for one hour. After allowing to cool the reaction liquid, by adding the reaction liquid to 1 liter of ion-exchanged water with stirring vigorously, a white resin was precipitated. By drying the resin obtained under a reduced pressure, 15.8 g of the resin a-(91) in the invention was obtained. When the molecular weigh was measured by GPC, the weight average molecular weight (Mw; polystyrene conversion) was 15,200 and the dispersion degree (Mw/Mn) was 2.2.

Then, the resins (B) of the invention were synthesized by the similar manners.

(2) Alkali-soluble resin having polymerizable unsaturated group:

SYNTHETIC EXAMPLE 1 [SYNTHESIS OF RESIN A'-(2)]

In 100 ml of THF was dissolved 12.1 g (0.10 mol) of poly(4-hydroxystyrene) (trade name, VP-15000, manufactured by Nippon Soda Co., Ltd.), and 3.7 g (0.024 mol) of methacrylic anhydride was added to the solution. Furthermore, after adding thereto 2.4 g (0.030 mol) of pyridine, the mixture was refluxed with stirring for 5 hours. After allowing to cool the reaction liquid, by adding the reaction liquid to 1 liter of ion-exchanged water with stirring vigorously, a white resin was precipitated. After washing with ion-exchanged water, the resin obtained was dried under a reduced pressure to obtain 13.1 g of the resin a'-(2) of the invention was obtained. When the content of the unsaturated group was measured by NMR, the introduced amount of a methacrylic group into the OH groups of the polyhydrostyrene was 18 mol %. Also, when the molecular weight was measured by GPC, the weight average molecular weight was 16,700 (polystyrene conversion) and the dispersion degree was 1.2.

SYNTHESIS EXAMPLE 2 [SYNTHESIS OF RESIN A'-(4)]

In 100 ml of N,N-dimethylacetamide was dissolved 12.1 g (0.10 mol) of poly(4-hydroxystyrene) (trade name, VP-8000, manufactured by Nippon Soda Co., Ltd.), and after adding thereto 3.1 g (0.020 mol) of 2-isocyanate ethyl methacrtylate, the mixture was heated to 90° C. for 7 hours with stirring. After allowing to cool the reaction liquid, by adding the reaction liquid to 1 liter of ion-exchanged water with stirring vigorously, a white resin was precipitated. After washing with ion-exchanged water, the resin obtained was dried under a reduced pressure to obtain 14.4 g of the resin a'-(4) of the invention was obtained. When the content of the unsaturated group was measured by NMR, the introduced amount of a methacrylic group into the OH groups of the polyhydroxystyrene was 16 mol %. Also, when the molecular weight was measured by GPC, the weight average molecular weight was 9,100 (polystyrene conversion) and the dispersion degree was 1.2.

SYNTHETIC EXAMPLE 3 [SYNTHESIS OF RESIN A'-(7)]

In 100 ml of THF was dissolved 12.1 g (0.10 mol) of poly(4-hydroxystyrene) (trade name, VP-8000, manufactured by Nippon Soda Co., Ltd.), and 4.7 g (0.023 mol) of 4-styrenesulfonyl chloride was added thereto. Furthermore, 20 ml of a THF solution of 0.37 g (0.003 mol) of N,N-dimethylaminopyridine/2.1 g (0.020 mol) of triethylamine was added dropwise to the solution with stirring under ice-cooling. Furthermore, the mixture was stirred for 5 hours at room temperature. The reaction liquid was filtered and by adding the filtrate to 1 liter of ion-exchange water with stirring vigorously, a white resin was precipitated. After washing with ion-exchanged water, the resin obtained was dried under a reduced pressure to obtained 15.0 g of the resin a'-(7) of the invention. When the content of the unsaturated group was measured by NMR, the introduced amount of a styryl group into the OH groups of the polyhydroxystyrene was 18 mol %. Also, when the molecular weight was measured by GPC, the weight average molecular weight was 9,200 (polystyrene conversion) and the dispersion degree was 1.2.

SYNTHETIC EXAMPLE 4 [SYNTHESIS OF COMPOUND A'-(8)]

In 100 ml of N,N-dimethylacetamide was dissolved 12.1 g (0.10 mol) of poly(4-hydroxystyrene) (trade name, VP-8000, manufactured by Nippon Soda Co., Ltd.), and 3.4 g (0.022 mol) of chloromethylstyrene was added to the solution. Furthermore, 20 ml of an N,N-dimethylacetamide solution of 2.3 g (0.022 mol) of triethylamine was added dropwise to the solution with stirring at room temperature. Thereafter, the reaction liquid was stirred for 5 hours at 60° C. After allowing to cool the reaction liquid, by adding the reaction liquid into ion-exchanged water with stirring vigorously, a white resin was precipitated. After washing with ion-exchanged water, the resin obtained was dried under a reduced pressure to obtained 13.9 g of the resin a'-(8) of the invention. When the content of the unsaturated group was measured by NMR, the introduced amount of a styryl group into the OH groups of the polyhydroxystyrene was 17 mol %. Also, when the molecular weight was measured by GPC, the weight average molecular weight was 9,300 (polystyrene conversion) and the dispersion degree was 1.2.

Then, the resins (B') of the invention were synthesized by following the similar manners.

(3) Acid generator:

1) Synthesis of pentafluorobenzenesulfonic acid tetramethylammonium salt:

In 100 ml of methanol was dissolved 25 g of pentafluorobenzenesulfonyl chloride under ice-cooling and 10 g of an aqueous solution of 25% tetramethylammonium hydroxide was slowly added to the solution. When the mixture was stirred for 3 hours at room temperature, a solution of a pentafluorobenzenesulfonic acid tetramethylammonium salt was obtained. The solution was used for the salt-exchange of a sulfonium salt and an iodonium salt.

2) Synthesis of triphenylsulfoniumpentafluorobenzene sulfonate:

In 800 ml of benzene was dissolved 50 g of diphenyl sulfoxide and after adding thereto 200 g of aluminum chloride, the mixture was refluxed for 24 hours. The reaction liquid was slowly poured to 2 liters of ice and after adding thereto 400 ml of concentrated sulfuric acid, the mixture was heated to 70° C. for 10 minutes. The aqueous solution was washed with 500 ml of ethyl acetate and after filtration, a solution of 200 g of ammonium iodide dissolved in 400 ml of water was added. Powders precipitated were collected by filtration, washed with water and then with ethyl acetate, and dried to obtain 70 g of triphenylsulfonium iodide.

In 1000 ml of methanol was dissolved 30.5 g of triphenylsulfonium iodide and after adding 19.1 g of silver oxide to the solution, and the mixture was stirred for 4 hours at room temperature. The solution was filtered and a n excessive amount of a solution of a pentafluorobenzenesulfonic acid tetramethylammonium salt was added. The reaction liquid was concentrated, the residue was dissolved in 500 ml of dichloromethane, and the solution was washed with an aqueous solution of 5% tetramethylammonium hydroxide and water. After drying the organic phase formed with anhydrous sodium sulfate, the organic phase was concentrated to obtained triphenylsulfoniumpentafluorobenzene sulfonate (I-1).

3) Synthesis of di(4-tert-amylphenyl)iodonium-pentafluorobenzene sulfonate

To a mixture of 60 g of tert-amylbenzene, 39.5 g of potassium iodate, 81 g of acetic anhydride, and 170 ml of dichloromethane was slowly added dropwise 66.8 g of concentrated sulfuric acid under ice-cooling. After stirring the mixture for 2 hours under ice-cooling, the mixture was stirred for 10 hours at room temperature. To the reaction liquid was added 500 ml of water under ice-cooling, the liquid was extracted with dichloromethane, and after washing the organic phase with sodium hydrogencarbonate and water, the liquid was concentrated to obtain di(4-tert-amylphenyl)iodonium sulfate. The sulfate was added to an excessive amount of a solution of a pentafluorobenzene-sulfonic acid tetramethylammonium salt. To the solution was added 500 ml of water, the solution was extracted with dichloromethane, and after washing the organic phase with an aqueous solution of 5% tetramethylammonium hydroxide and water, the liquid was concentrated to obtain di(4-tert-amylphenyl)iodoniumpentafluorobenzene sulfonate (III-1).

Other compounds can be synthesized by using the similar methods.

(4) Crosslinking agent:

Synthesis of crosslinking agent [HM-1]

In an aqueous 10% potassium hydroxide solution was dissolved 20 g of 1-[α-methyl-α-(4-hydroxyphenyl)ethyl]-4-[α,α-bis(4-hydroxy phenyl)ethyl]benzene (Trisp-PA, trade name, manufactured by Honshu Chemical Industry Co., Ltd.) with stirring. While stirring the solution, 60 ml of an aqueous 37% formalin solution as gradually added to the solution at room temperature over a period of one hour. After further stirring the mixture for 6 hours at room temperature, the solution was added to a diluted aqueous sulfuric acid solution. Precipitates formed were collected by filtration and after sufficiently washing with water, the precipitates were recrystallized from 30 ml of methanol to obtain 20 g of the white powder of the phenol derivative [HM-1] having a hydroxymethyl group of the following structure. The purity was 92% (liquid chromatography).

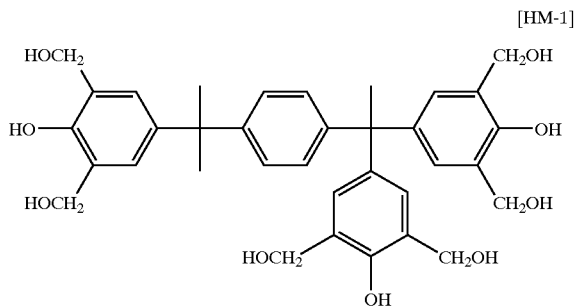
[HM-1]

Synthesis of crosslinking agent [MM-1]

In one liter of methanol was dissolved 20 g of the phenol derivative [HM-1] having a hydroxymethyl group obtained in the above-described synthesis Example with stirring by heating. Then, to the solution was added 1 ml of concentrated sulfuric acid and the mixture was refluxed for 12 hours. After the reaction was over, the reaction liquid was cooled and 2 g of potassium carbonate was added thereto. After sufficiently concentrating the mixture, 300 ml of ethyl acetate was added. After washing the solution with water, the solution of concentrated to dryness to obtained 22 g of the white solids of the phenol derivative [MM-1] having a methoxymethyl group of the following structure. The purity was 90% (liquid chromatography).

[MM-1]

Furthermore, the phenol derivatives shown below were synthesized by the similar manners to above.

(HM-2)
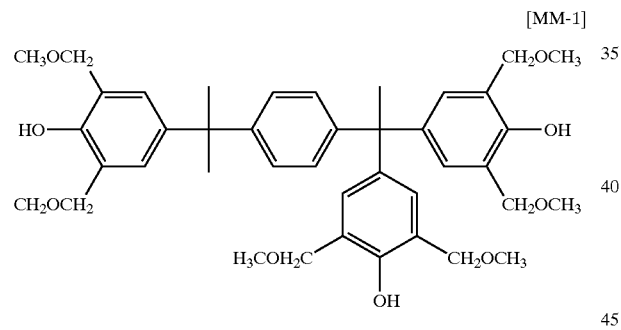

(MM-2)
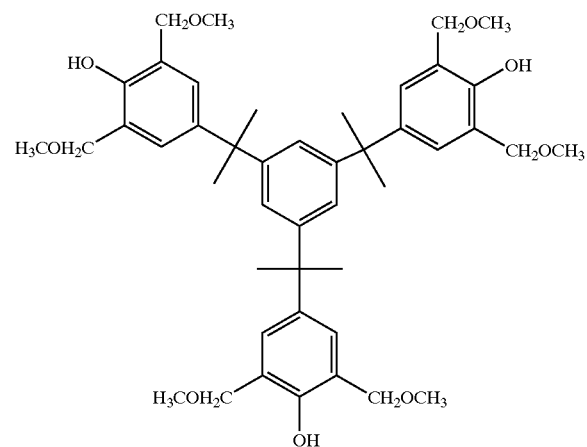

(HM-3)
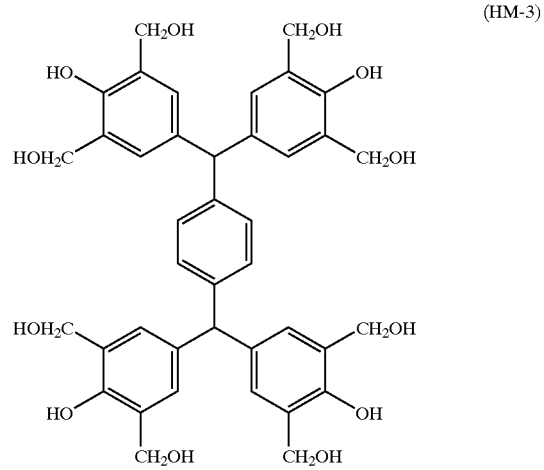

(MM-3)
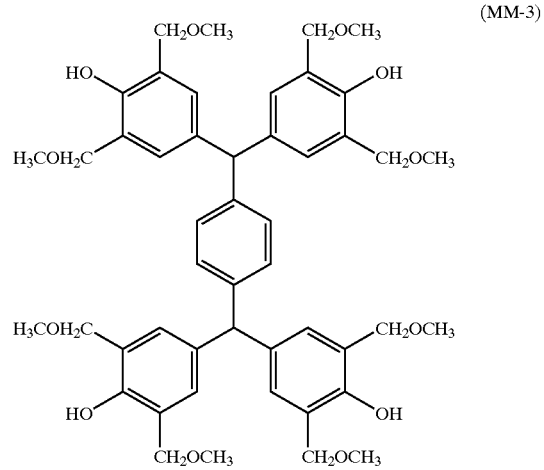

(HM-4)
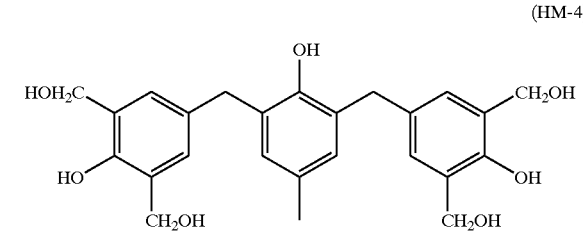

-continued

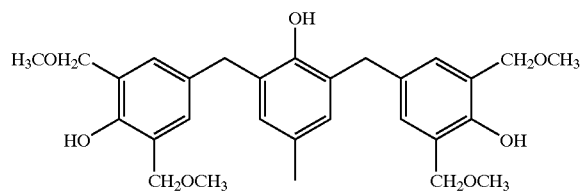
(MM-4)

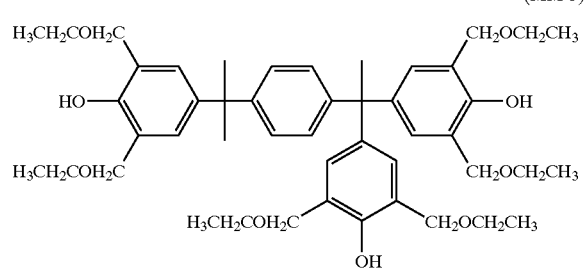
(MM-5)

2. EXAMPLES

[Examples 1 to 16, Comparative Examples 1 to 3]

(1) Coating of resist:

Using the compounds constituting the resist compositions of the invention selected from the synthesis examples described above and comparative compounds, the solutions of the photoresist compositions having the compositions shown in Table 1 below were prepared.

After filtering each sample solution with a filter of 0.1 μm, the solution was coated on a silicon wafer using a spin coater and dried by a vacuum-adsorption type hot plate for 90 seconds at 110° C. to form a resist film having a film thickness of 0.3 μm.

TABLE 1

|  | Resin (g) | Acid generator (g) | Crosslinking agent (g) | Solvent (g) | Polymerizable monomer (g) |
| --- | --- | --- | --- | --- | --- |
| Example 1 | a-(28) (1.05) | I-1 (0.07) | MM-1 (0.18) | PGMMEA* (8.5) | RM-1 (0.12) |
| Example 2 | a-(29) (1.05) | I-8 (0.07) | MM-3 (0.18) | PGMMEA* (8.5) | RM-2 (0.12) |
| Example 3 | a-(32) (1.05) | I-9 (0.07) | MM-4 (0.18) | PGMMEA* (8.5) | RM-3 (0.12) |
| Example 4 | a-(34) (1.05) | II-1 (0.07) | MM-2 (0.18) | PGMMEA* (8.5) | RM-1 (0.12) |
| Example 5 | a-(39) (1.05) | II-4 (0.07) | CL-1 (0.18) | PGMMEA* (8.5) | RM-1 (0.12) |
| Example 6 | a-(50) (1.05) | III-1 (0.07) | MM-1 (0.18) | PGMMEA* (8.5) | RM-2 (0.12) |
| Example 7 | a-(67) (1.05) | III-2 (0.07) | MM-2 (0.18) | PGMMEA* (8.5) | RM-3 (0.12) |
| Example 8 | a-(72) (1.05) | I-1 (0.07) | MM-3 (0.18) | PGMMEA* (8.5) | RM-1 (0.12) |
| Example 9 | a-(81) (1.05) | II-1 (0.07) | CL-2 (0.18) | PGMMEA* (8.5) | RM-3 (0.12) |
| Example 10 | a-(83) (1.05) | III-2 (0.07) | MM-1 (0.18) | PGMMEA* (8.5) | RM-2 (0.12) |
| Example 11 | a-(87) (1.05) | I-9 (0.07) | CL-1 (0.18) | PGMMEA* (8.5) | RM-2 (0.12) |
| Example 12 | a-(91) (1.05) | PAG-1 (0.07) | MM-1 (0.18) | PGMMEA* (8.5) | RM-3 (0.12) |
| Comparative Example 1 | a-(1) (1.05) | PAG-1 (0.07) | CL-1 (0.28) | PGMMEA* (8.5) | none |
| Comparative Example 2 | a-(28) (1.05) | I-1 (0.07) | MM-1 (0.30) | PGMMEA* (8.5) | none |

*PGMMEA: Propylene glycol monomethylether acetate

In table 1, in the composition of resin a-(67), x/y/z=85/8,7, in the composition resin a-(81), x/y/z=70/10/20, in the composition resin a-(91), x/y/z=50/30/20, in other resins, x/y=85/15, and the weight average molecular weights were in the range from 8,000 t0 16,000 (dispersion degrees 1.2 to 2.4).

In Table 1;

(Photo-acid-generator)

PAG-1; $Ph_3S^+ CF_3SO_3-$ (Crosslinking agent)

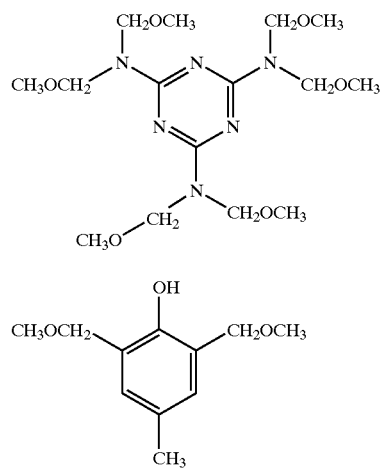

As the polymerizable monomers:

RM-1: Tetraethylene glycol diacrylate (manufactured by NIPPON KAYAKU CO., LTD.)

RM-2: Trimethylolpropane triacrylate (manufactured by NIPPON KAYAKU CO., LTD.)

RM-3: dipentaerythritol hexaacrylate (manufactured by NIPPON KAYAKU CO., LTD.)

(2) Preparation of resist pattern:

The resist film was irradiated using an electron beam imaging apparatus (acceleration voltage 50 Kev). After the irradiation, each rest film was heated by a vacuum adsorption type hot plate of 110° C. for 60 seconds, the support having the resist film was dipped in an aqueous 2.38% tetramethylammonium hydroxide (TMAH) for 60 seconds, rinsed with water for 30 seconds, and dried. The cross-sectional form of the pattern obtained was observed by a scanning type electron microscope.

Also, the sensitivity is defined to be the minimum irradiation energy at resolving a line (line:space=1:1) of 0.20 µm and the limiting resolving power (line and space being separately resolved) at the irradiation amount is defined as the resolving power. About a sample the line (line:space=1:1) of 0.20 µm, the limiting resolving power was defined as the resolving power and the irradiation energy at that time was defined as the sensitivity. The irradiated performance evaluation results at the time are shown in Table 2 below.

TABLE 2

|  | Sensitivity ($\mu C/cm^2$) | Resolving power ($\mu m$) | Profile |
| --- | --- | --- | --- |
| Example 1 | 7 | 0.10 | rectangle |
| Example 2 | 9 | 0.09 | rectangle |

TABLE 2-continued

|  | Sensitivity ($\mu C/cm^2$) | Resolving power ($\mu m$) | Profile |
| --- | --- | --- | --- |
| Example 3 | 7 | 0.08 | rectangle |
| Example 4 | 5 | 0.09 | rectangle |
| Example 5 | 10 | 0.08 | rectangle |
| Example 6 | 8 | 0.10 | rectangle |
| Example 7 | 5 | 0.10 | rectangle |
| Example 8 | 11 | 0.08 | rectangle |
| Example 9 | 10 | 0.10 | rectangle |
| Example 10 | 12 | 0.12 | slightly taper |
| Example 11 | 15 | 0.11 | slightly taper |
| Example 12 | 10 | 0.12 | slightly taper |
| Comparative Example 1 | 24 | 0.25 | taper |
| Comparative Example 2 | 35 | 0.22 | taper |

From the results of Table 2, it can be seen that in the negative-working resist compositions of the invention made of the combination of the polymerizable monomers, the sensitivity and the resolution are large improved as compared with the comparative examples containing the components.

Using the compositions of examples 1, 4, 7, and 12 and Comparative Example 1 described above, each resist film was formed by the same manner as described above and was irradiated using the electron beam imaging apparatus in the condition of an accelerated voltage of 75 KeV (Examples 13 to 16, Comparative Example 3). After the irradiation, each film was heated, developed, and rinsed as in the above-described examples, and the pattern obtained was observed by a scanning type electron microscope. The evaluation results are shown in Table 3.

TABLE 3

|  | Sensitivity ($\mu C/cm^2$) | Resolving power ($\mu m$) | Profile |
| --- | --- | --- | --- |
| Example 13 | 12 | 0.09 | rectangle |
| Example 14 | 8 | 0.08 | rectangle |
| Example 15 | 9 | 0.09 | rectangle |
| Example 16 | 16 | 0.11 | slightly taper |
| Comparative Example 3 | 42 | 0.23 | slightly taper |

From the results, it can be seen that the negative-working resist compositions of the invention show good sensitivity and resolution even by the electron beam irradiation of the accelerated voltage as compared with the composition of the comparative example.

3. Examples [Examples 17 to 32, Comparative Examples 4 to 6]

(1) Coating of resist:

Using the compounds constituting the resist compositions of the invention selected from the synthesis examples described above and comparative compounds, the solutions of the photoresist compositions having the compositions shown in Table 4 below were prepared.

After filtering each sample solution with a filter of 0.1 µm, the solution was coated on a silicon wafer using a spin coater and dried by a vacuum-adsorption type hot plate for 90 seconds at 110° C. to form a resist film having a film thickness of 0.3 µm.

TABLE 4

| | Resin (g) | Acid generator (g) | Crosslinking agent (g) | Solvent (g) | Polymerizable monomer (g) |
|---|---|---|---|---|---|
| Example 17 | a'-(2) (1.05) | I-1 (0.07) | MM-1 (0.18) | PGMMEA* (8.5) | none |
| Example 18 | a'-(4) (1.05) | I-8 (0.07) | MM-3 (0.18) | PGMMEA* (8.5) | none |
| Example 19 | a'-(7) (1.05) | I-9 (0.07) | MM-4 (0.18) | PGMMEA* (8.5) | none |
| Example 20 | a'-(8) (1.05) | II-1 (0.07) | MM-2 (0.18) | PGMMEA* (8.5) | none |
| Example 21 | a'-(15) (1.05) | II-4 (0.07) | CL-1 (0.18) | PGMMEA* (8.5) | none |
| Example 22 | a'-(20) (1.05) | III-1 (0.07) | MM-1 (0.18) | PGMMEA* (8.5) | none |
| Example 23 | a'-(26) (1.05) | III-2 (0.07) | MM-2 (0.18) | PGMMEA* (8.5) | RM-1 (0.12) |
| Example 24 | a'-(28) (1.05) | I-1 (0.07) | MM-3 (0.18) | PGMMEA* (8.5) | RM-2 (0.12) |
| Example 25 | a'-(40) (1.05) | II-1 (0.07) | CL-2 (0.18) | PGMMEA* (8.5) | RM-3 (0.12) |
| Example 26 | a'-(47) (1.05) | III-2 (0.07) | MM-1 (0.18) | PGMMEA* (8.5) | none |
| Example 27 | a'-(58) (1.05) | I-9 (0.07) | CL-1 (0.18) | PGMMEA* (8.5) | RM-1 (0.12) |
| Example 28 | a'-(59) (1.05) | PAG-1 (0.07) | MM-1 (0.18) | PGMMEA* (8.5) | RM-3 (0.12) |
| Comparative Example 4 | Polymer 1 (1.05) | PAG-1 (0.07) | CL-1 (0.28) | PGMMEA* (8.5) | none |
| Comparative Example 5 | Polymer 2 (1.05) | I-1 (0.07) | MM-1 (0.30) | PGMMEA* (8.5) | none |

*PGMMEA: Propylene glycol monomethyl ether acetate

In Table 4, in the composition of resin a'-(40), x/y/z=82/13/5, in the composition of resin a'-(47), x/y/z=78/15/7, in the composition resin a'-(58) and a'-(59), x/y/z=65/20/15, in other resins, x/y=80/20 to 85/15, and the weight average molecular weights were in the range from 8,000 t0 16,000 (dispersion degrees 1.2 to 2.4).

<Resin>

Polymer 1: Poly(4-hydroxystyrene) (manufactured by Nippon Soda Co., Ltd., VF-8000)

Polymer 2: Poly(3-hydroxystyrene) (manufactured by Maruzen Petrochemical Company Limited, Mw=9700, Mw/Mn=2.2)

(2) Preparation of resist pattern

The resist film was irradiated using an electron beam imaging apparatus (acceleration voltage 50 Kev). After the irradiation, each rest film was heated by a vacuum adsorption type hot plate of 110° C. for 60 seconds, the support having the resist film was dipped in an aqueous 2.38% tetramethylammonium hydroxide (TMAB) for 60 seconds, rinsed with water for 30 seconds, and dried. The cross-sectional form of the pattern obtained was observed by a scanning type electron microscope.

Also, the sensitivity is defined to be the minimum irradiation energy at resolving a line (line:space=1:1) of 0.20 µm and the limiting resolving power (line and space being separately resolved) at the irradiation amount is defined as the resolving power. About a sample the line (line:space=1:1) of 0.20 µm, the limiting resolving power was defined as the resolving power and the irradiation energy at that time was defined as the sensitivity.

The performance evaluation results are shown in Table 5.

TABLE 5

| | Sensitivity ($\mu C/cm^2$) | Resolving power ($\mu m$) | Profile |
|---|---|---|---|
| Example 17 | 6 | 0.09 | rectangle |
| Example 18 | 7 | 0.09 | rectangle |
| Example 19 | 9 | 0.08 | rectangle |
| Example 20 | 5 | 0.09 | rectangle |
| Example 21 | 6 | 0.08 | rectangle |
| Example 22 | 7 | 0.09 | rectangle |
| Example 23 | 5 | 0.10 | rectangle |
| Example 24 | 10 | 0.08 | rectangle |
| Example 25 | 7 | 0.10 | rectangle |
| Example 26 | 5 | 0.09 | rectangle |
| Example 27 | 11 | 0.10 | rectangle |
| Example 28 | 10 | 0.11 | rectangle |
| Comparative Example 4 | 26 | 0.22 | slightly taper |
| Comparative Example 5 | 20 | 0.20 | slightly taper |

From the results of Table 5, it can be seen that the negative-working resist compositions of the invention show good sensitivity and resolution even by the electron beam irradiation of the accelerated voltage as compared with the composition of the comparative example.

Using the compositions of examples 17, 20, 23 and 28 and Comparative Example 4 described above, each resist film was formed by the same manner as described above and was irradiated using the electron beam imaging apparatus in the condition of an accelerated voltage of 75 KeV (Examples 29 to 32, Comparative Example 6). After the irradiation, each film was heated, developed, and rinsed as in the above-described examples, and the pattern obtained was observed by a scanning type electron microscope. The evaluation results are shown in Table 6.

TABLE 6

|  | Sensitivity ($\mu C/cm^2$) | Resolving power ($\mu m$) | Profile |
| --- | --- | --- | --- |
| Example 29 | 10 | 0.08 | rectangle |
| Example 30 | 7 | 0.08 | rectangle |
| Example 31 | 8 | 0.08 | rectangle |
| Example 32 | 17 | 0.10 | rectangle |
| Comparative Example 6 | 45 | 0.20 | slightly taper |

From the results, it can be seen that the negative-working resist compositions of the invention show good sensitivity and resolution even by the electron irradiation of the accelerated voltage as compared with the composition of the comparative example.

As described above in detail, according to the present invention, a negative-working resist composition for electron beams and x-rays excellent in the sensitivity and the resolution and having a rectangular profile even under the high-accelerated voltage condition can be provided.

While the invention has been described in detail and with reference to specific embodiments thereof, it will be apparent to one skilled in the art that various changes and modifications can be made therein without departing from the spirit and scope thereof.

This application is based on Japanese patent applications No. 2000-4766 filed on Jan. 13, 2000 and No. 2000-84469 filed on Mar. 24, 2000, the entire contents of which incorporated herein by reference.

What is claimed is:

1. A negative-working resist composition for electron beams or X-rays comprising (A) a compound generating an acid and/or radical species by the irradiation of electron beams or X-rays selected from the groups consisting of a sulfonate compound of sulfonium, a sulfonate compound of iodonium, a sulfonic acid ester compound of N-hydroxyimide and a disulfonyldiazomethane compound, (B) a resin which is insoluble in water and soluble in an alkali aqueous solution and having a repeating unit shown by the following formula (a), (C) a crosslinking agent causing crosslinking with the resin of component (B) by the action of an acid, (D) a compound having at least one unsaturated bond capable of being polymerized by an acid and/or a radical and (E) an organic basic compound,

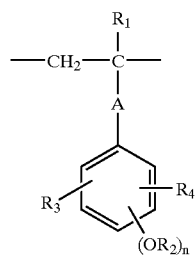
(a)

wherein $R_1$ represents a hydrogen atom, a halogen atom, a cyano group, or an alkyl or haloalkyl group which may have a substituent;

$R_2$ represents a hydrogen atom, or an alkyl, cycloalkyl, aryl, aralkyl, or acyl group which may have a substituent;

$R_3$ and $R_4$, which may be the same or different, each represents a hydrogen atom, a halogen atom, a cyano group, or an alkyl, cycloalkyl, alkenyl, aralkyl, or aryl group which may have a substituent;

A represents a single bond, or a divalent alkylene, alkenylene, cycloalkylene, or arylene group which may have a substituent, or —O—, —SO$_2$—, —O—CO$_{R5}$—, —CO—O—R$_6$—, or —CO—N(R$_7$)—R$_8$—; R$_5$, R$_6$, and R$_8$, which may be the same or different, each represents a single bond, or an alkylene, alkylene, cycloalkylene, or arylene group, which may have a substituent, singly or a divalent group formed by combining the above-described group and at least one kind selected from an ether structure, an ester structure, an amide structure, a urethane structure, and a ureido structure;

$R_7$ represents a hydrogen atom, or an alkyl, cycloalkyl, aralkyl, or aryl group which may have a substituent;

and n represents an integer of from 1 to 3;

provided that plural $R_{2s}$, or $R_2$ and $R_3$ or $R_4$ may combine with each other to form a ring.

2. The negative-working resist composition for electron beams or X-rays according to claim 1, wherein the crosslinking agent of component (C) is a hydroxymethylated, alkoxymethylated, or acyloxymethylated phenol compound.

3. The negative-working resist composition for electron beams or X-rays according to claim 1, wherein the crosslinking agent of component (C) is an alkoxymethylated or acyloxymethylated melamine compound or resin, or an alkoxymethylated or acyloxymethylated urea compound or resin.

4. The negative-working resist composition for electron beams or X-rays according to claim 1, suitable for electron beam irradiation under the accelerated voltage condition of at least 75 KeV.

5. A negative-working resist composition for electron beams or X-rays comprising (A) a compound generating an acid and/or radical species by the irradiation of electron beams or X-rays, (B') a resin having at least one unsaturated bond polymerizable by an acid and/or an alkali, which is insoluble in water but soluble in an alkali aqueous solution, and containing a repeating unit shown by the following formula (a'), and (C) a crosslinking agent causing crosslinking with the resin (B') by the action of an acid;

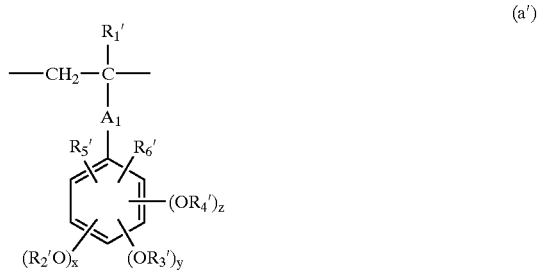
(a')

wherein $R_1'$ represents a hydrogen atom, a cyano group, or an alkyl or haloalkyl group which may have a substituent;

$R_2'$ to $R_4'$ each represents a hydrogen atom, a group shown by the formula (b), (c), or (d) described below, or an alkyl, cycloalkyl, aryl, aralkyl, or acyl group which may have a substituent; and $R_5'$ and $R_6'$, which may be the same or different, each represents a hydrogen atom, a hydroxyl group, a halogen atom, a cyano group, or an alkyl, cycloalkyl, alkenyl, aralkyl, or aryl group which may have a substituent;

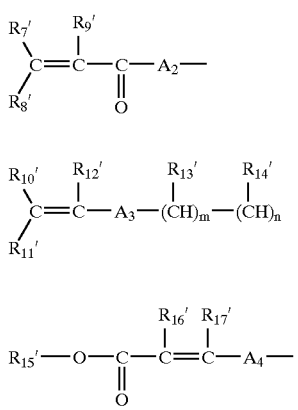

wherein $R_7'$ to $R_{12}'$, $R_{16}'$, and $R_{17}'$ each represents a hydrogen atom, a halogen atom, a cyano group, or an alkyl or haloalkyl group which may have a substituent;

$R_{13}'$ and $R_{14}'$ each represents a hydrogen atom, a halogen atom, a hydroxy group, or an alkyl, alkoxy, or acyloxy group which may have a substituent;

$R_{15}'$ represents a hydrogen atom or an alkyl, cycloalkyl, aralkyl, or aryl group which may have a substituent;

$A_1$ represents a single bond, or a divalent alkylene, alkylene, cycloalkylene, or arylene group which may have a substituent, or —O—, —SO$_2$—, —O—CO—$R_{20}'$—, —CO—O—$R_{21}'$—, or —CO—N($R_{22}'$)—$R_{23}'$—;

$R_{20}'$, $R_{21}'$, and $R_{23}'$, which may be the same or different, each represents a single bond, or a divalent alkylene, alkylene, cycloalkylene, or arylene group which may have an ether structure, an ester structure, an amide structure, a urethane structure, or a ureido structure or may have a substituent;

$R_{22}'$ represents a hydrogen atom, or an alkyl, cycloalkyl, aralkyl, or aryl group which may have a substituent;

$A_2$ represents a single bond, —O—$R_{21}'$—, or —N($R_{22}'$)—$R_{23}'$—;

$A_3$ represents a single bond, —SO$_2$—, or an arylene group which may have an alkylene structure or may have a substituent;

$A_4$ represents a single bond, a divalent alkylene, cycloalkylene, or arylene group which may have a substituent, or —O—, —SO$_2$—, —CO—, or —CO—O—$R_{21}'$;

x, y, and z in the formula (a') each represents 0 or 1 and m and n in the formula (c) each represents 0 or an integer of at least 1, provided that in the formula (a'), at least one repeating unit has the group of the formula (b), (c), or (d); and two of $R_2'$ to $R_4'$, or one of $R_2'$ to $R_4'$ and $R_5'$ or $R_6'$ may combine with each other to form a ring.

6. The negative-working resist composition for electron beams or X-rays according to claim 5, wherein the resist composition further contains (D) a compound having at least one unsaturated bond polymerizable by an acid and/or a radical.

7. The negative-working resist composition for electron beams or X-rays according to claim 5, wherein resist the composition further contains (E) an organic basic compound.

8. The negative-working resist composition for electron beams or X-rays according to claim 5, wherein the compound of component (A) is selected from the sulfonate compound of sulfonium or iodonium.

9. The negative-working resist composition for electron beams or X-rays according to claim 5, wherein the compound of component (A) is the sulfonic acid ester compound of N-hydroxyimide or a disulfonyldiazomethane compound.

10. The negative-working resist composition for electron beams or X-rays according to claim 5, wherein the crosslinking agent of component (C) is a hydroxymethylated, alkoxymethylated, or acyloxymethylated phenol compound.

11. The negative-working resist composition for electron beams or X-rays according to claim 5, wherein the crosslinking agent of component (C) is an alkoxymethylated or acyloxymethylated melamine compound or resin or an alkoxymethylated or acyloxymethylated urea compound or resin.

12. The negative-working resist composition for electron beams or X-rays according to claim 5, suitable for electron beam irradiation under the accelerated voltage condition of at least 75 KeV.

* * * * *